(12) United States Patent
Kachi

(10) Patent No.: US 7,977,739 B2
(45) Date of Patent: Jul. 12, 2011

(54) SEMICONDUCTOR DEVICE AND MANUFACTURING METHOD FOR SEMICONDUCTOR DEVICE

(75) Inventor: Tsuyoshi Kachi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/491,997

(22) Filed: Jun. 25, 2009

(65) Prior Publication Data

US 2010/0019314 A1 Jan. 28, 2010

(30) Foreign Application Priority Data

Jul. 24, 2008 (JP) ................................. 2008-190971

(51) Int. Cl.
*H01L 29/72* (2006.01)
(52) U.S. Cl. ........ 257/330; 257/331; 257/333; 257/334; 257/341; 257/362
(58) Field of Classification Search .................. 257/330, 257/331, 333, 334, 341, 368
See application file for complete search history.

(56) References Cited

U.S. PATENT DOCUMENTS 6,706,604 B2 * 3/2004 Inagawa et al. ............... 438/270

| | | | |
|---|---|---|---|
| 2006/0157779 A1 | 7/2006 | Kachi et al. | |
| 2008/0035990 A1 | 2/2008 | Matsuura et al. | |

FOREIGN PATENT DOCUMENTS

| JP | 2000-223705 A | 8/2000 |
|---|---|---|
| JP | 2000-277531 A | 10/2000 |
| JP | 2004-055659 A | 2/2004 |
| JP | 2006-202931 A | 8/2006 |
| JP | 2008-042056 A | 2/2008 |

* cited by examiner

*Primary Examiner* — Edward Wojciechowicz
(74) *Attorney, Agent, or Firm* — Miles & Stockbridge P.C.

(57) ABSTRACT

Generally, a power MOSFET mainly includes an active region occupying most of an internal region (a region where a gate electrode made of polysilicon or the like is integrated), and a surrounding gate contact region (where the gate electrode made of polysilicon or the like is derived outside a source metal covered region to make contact with a gate metal) (see FIG. 65 in a comparative example). Since the gate electrode made of polysilicon or the like has a stepped portion existing between both regions, a focus margin may be reduced in a lithography step, including exposure or the like, for formation of a contact hole for a source or for a gate. The invention of the present application provides a semiconductor device having a trench gate type power MISFET with a gate electrode protruding from an upper surface of a semiconductor substrate, in which respective main upper surfaces of the gate electrode in an active region and a gate contact region are substantially at the same height.

11 Claims, 68 Drawing Sheets

SEMICONDUCTOR DEVICE AND MANUFACTURING METHOD FOR SEMICONDUCTOR DEVICE

CROSS-REFERENCE TO RELATED APPLICATIONS

The disclosure of Japanese Patent Application No. 2008-190971 filed on Jul. 24, 2008 including the specification, drawings and abstract is incorporated herein by reference in its entirety.

BACKGROUND OF THE INVENTION

The present invention relates to techniques effectively applied to a power metal oxide semiconductor (MOS) type or metal insulator semiconductor (MIS) type semiconductor device (or semiconductor integrated circuit device), and to a manufacturing method for the semiconductor device (or the semiconductor integrated circuit device).

Japanese Unexamined Patent Publication No. 2000-223705 (Patent Document 1) discloses a technique about a trench gate type power MOS field effect transistor (FET) with an embedded contact structure for miniaturization of a gate lead-out portion, that is, with a structure substantially not having the gate lead-out portion, in which an upper surface of a gate electrode made of polysilicon or the like coincides with an upper surface of a semiconductor substrate.

Japanese Unexamined Patent Publication No. 2004-055659 (Patent Document 2) discloses a technique for providing a stepped portion between gate electrode portions of an active region and a gate contact region in a trench-gate type power MOSFET, and for additionally forming an insulating film in the stepped portion for preventing dielectric breakdown at the corner on the upper side of a trench.

Japanese Unexamined Patent Publication No. 2006-202931 (Patent Document 3) or U.S. Patent Application Publication No. 2006-157779 (Patent Document 4) discloses a technique for forming a relatively shallow trench in a surface of a semiconductor substrate for separating adjacent source regions from each other in the power MISFET with the trench gate structure.

Japanese Unexamined Patent Publication No. 2008-42056 (Patent Document 5) or U.S. Patent Application Publication No. 2008-35990 (Patent Document 6) discloses a technique of the power MISFET with the trench gate structure for forming a sidewall spacer around a trench gate electrode whose part protrudes from a surface of a semiconductor substrate, and also a technique for covering the semiconductor substrate surface including upper surfaces of the trench gate electrode and of the sidewall spacer and the like with a silicon nitride film to use the silicon nitride film formed as an etching stopper.

Japanese Unexamined Patent Publication No. 2000-277531 (Patent Document 7) or U.S. Pat. No. 6,706,604 (Patent Document 8) discloses a power MISFET structure including a protruding trench gate structure, and a manufacturing method thereof.

[Patent Document 1] Japanese Unexamined Patent Publication No. 2000-223705
[Patent Document 2] Japanese Unexamined Patent Publication No. 2004-055659
[Patent Document 3] Japanese Unexamined Patent Publication NO. 2006-202931
[Patent Document 4] U.S. Patent Application Publication NO. 2006-157779
[Patent Document 5] Japanese Unexamined Patent Publication No. 2008-42056
[Patent Document 6] U.S. Patent Application Publication No. 2008-35990
[Patent Document 7] Japanese Unexamined Patent Publication No. 2000-277531
[Patent Document 8] U.S. Pat. No. 6,706,604

SUMMARY OF THE INVENTION

In general, a power MOSFET mainly includes an active region occupying a majority of an internal region (a region where a gate electrode made of polysilicon or the like is integrated), and a surrounding gate contact region (where the gate electrode made of polysilicon or the like is derived outside a source metal covered region to make contact with a gate metal) (see FIG. 67 in a comparative example). Since the gate electrode made of polysilicon or the like has a stepped portion between both regions, a focus margin may be decreased in a lithography step, including exposure or the like, for formation of a contact hole for a source or gate.

The invention of the present application has been made so as to solve the foregoing problems.

It is an object of the present invention to provide a semiconductor device suitable for mass production.

The above, other objects and novel features of the invention will become apparent from the description of the present specification and the accompanying drawings.

The outline of representative aspects of the invention disclosed in the present application will be briefly described below.

That is, according to the invention of the present application, in a trench gate type power MISFET having a gate electrode protruding from an upper surface of a semiconductor substrate, respective main upper surfaces of the gate electrode in an active region and a gate contact region are substantially at the same height.

The effects obtained by the representative aspects of the invention disclosed in the present application will be briefly described below.

That is, in the trench gate type power MISFET with the gate electrode protruding from the upper surface of the semiconductor substrate, the respective main upper surfaces of the gate electrode in the active region and the gate contact region are substantially at the same height. Thus, the semiconductor device with such a MISFET is easily manufactured.

DETAILED DESCRIPTION OF THE PREFERRED EMBODIMENTS

Outline of Preferred Embodiments

Figure 1:
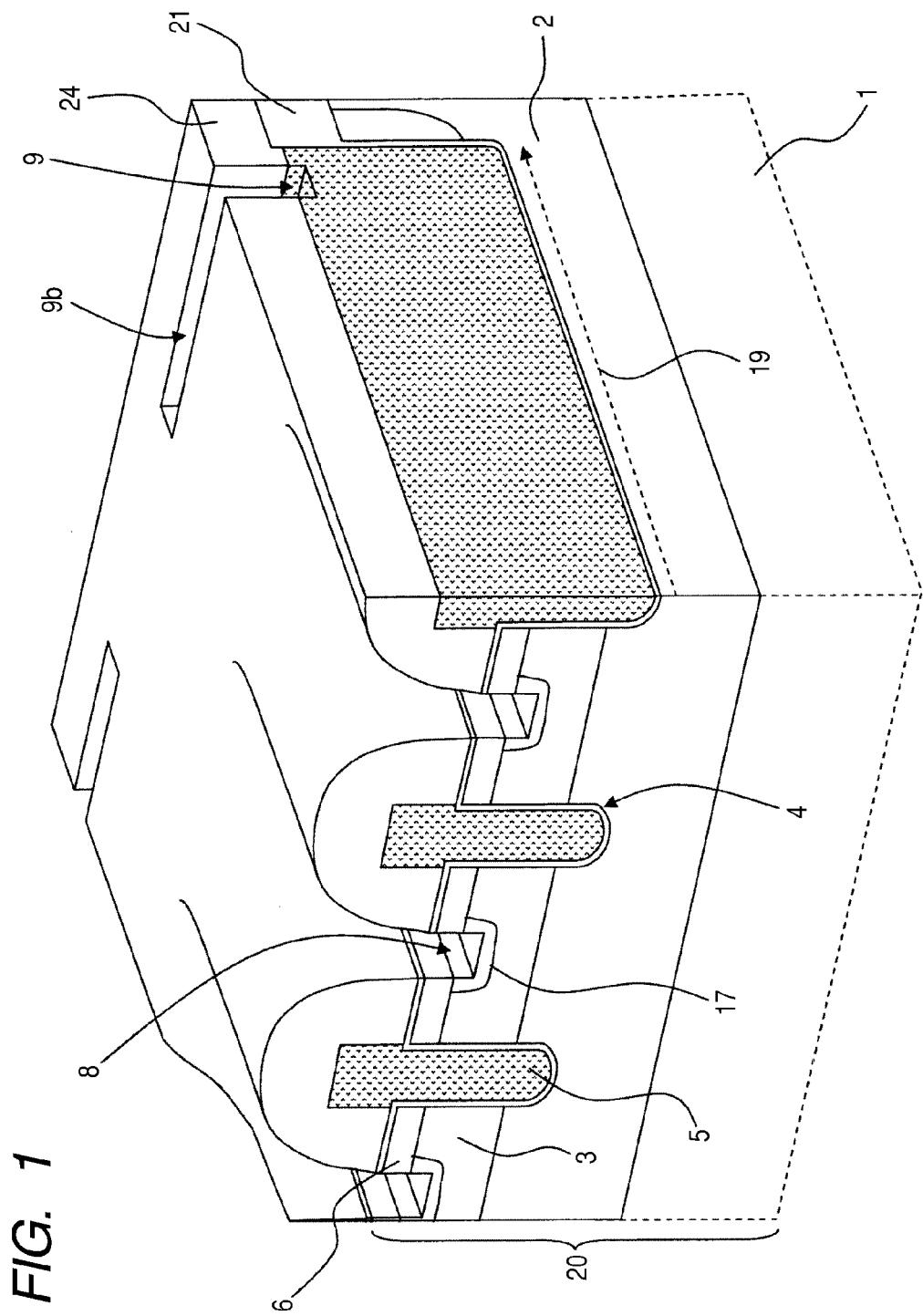
FIG. 1 is a perspective view showing a section of a main portion of a semiconductor device having a power MISFET according to a first embodiment (of a basic type) of the invention of the present application (in which an aluminum-based metal layer provided as an upper layer is removed for easy understanding, and in which the right section corresponds to a section taken along the line A-A' of FIG. 3, and the left section corresponds to a section taken along the line B-B' of FIG. 3)

First, representative embodiments of the invention disclosed in the present application will be briefly described below.

1. A semiconductor device having a power MISFET includes: (a) a semiconductor substrate with a device main surface; (b) an active region of the power MISFET over the device main surface; (c) a gate contact region of the power MISFET over the device main surface; (d) a trench provided across the active region and the gate contact region of the device main surface of the semiconductor substrate; (e) a gate insulating film formed at the inner surface of the trench; and (f) a gate electrode embedded in the trench via the gate insulating film, the gate electrode having an upper surface protruding upward from the device main surface. Respective uppermost surfaces of the gate electrode in the active region and the gate contact region are substantially at the same height to each other.

2. The semiconductor device according to Item 1 further includes (g) a field insulating film provided over the device main surface of the semiconductor substrate in a part of the gate contact region.

3. The semiconductor device according to Item 1 further includes (h) a side wall spacer provided around the gate electrode.

4. The semiconductor device according to Item 2 further includes (i) an etching stopper film covering the field insulating film, and including silicon nitride as a principal component.

5. In the semiconductor device according to any one of Items 1 to 4, the gate electrode includes a plane structure which comprises: (f1) a plurality of linear gate electrode main portions arranged substantially in parallel to each other; and (f2) a gate electrode coupling portion for coupling each pair of the adjacent linear gate electrode main portions to each other in one or more positions.

6. In the semiconductor device according to any one of Items 1 to 5, the gate electrode includes a plane structure which comprises: (f1) a plurality of linear gate electrode main portions arranged substantially in parallel to each other; and (f3) a source contact trench provided in the device main surface of the semiconductor substrate so as to separate source regions on both sides between each pair of the adjacent linear gate electrode main portions.

7. A semiconductor device having a power MISFET includes: (a) a semiconductor substrate with a device main surface; (b) an active region of the power MISFET over the device main surface; (c) a gate contact region of the power MISFET over the device main surface; (d) a trench provided across the active region and the gate contact region of the device main surface of the semiconductor substrate; (e) a gate insulating film formed at the inner surface of the trench; (f) a gate electrode embedded in the trench via the gate insulating film, the gate electrode having an upper surface protruding upward from the device main surface; and (g) a field insulating film provided over the device main surface of the semiconductor substrate in a part of the gate contact region. An uppermost surface of the gate electrode is not substantially high as compared to an uppermost surface of the field insulating film.

8. The semiconductor device according to Item 7 further includes (i) an etching stopper film covering the field insulating film, and including silicon nitride as a principal component.

9. In the semiconductor device according to Item 7 or 8, the gate electrode includes a plane structure which comprises: (f1) a plurality of linear gate electrode main portions arranged substantially in parallel to each other; and (f2) a gate electrode coupling portion for coupling each pair of the adjacent linear gate electrode main portions to each other in one or more positions.

10. In the semiconductor device according to any one of Items 7 to 9, the gate electrode includes a plane structure which comprises: (f1) a plurality of linear gate electrode main portions arranged substantially in parallel to each other; and (f3) a source contact trench provided in the device main surface of the semiconductor substrate so as to separate source regions on both sides between each pair of the adjacent linear gate electrode main portions.

11. In a manufacturing method of a semiconductor device, the semiconductor device includes (a) a semiconductor substrate with a device main surface; (b) an active region of a power MISFET over the device main surface; (c) a gate contact region of the power MISFET over the device main surface; (d) a trench provided across the active region and the gate contact region of the device main surface of the semiconductor substrate; (e) a gate insulating film formed at the inner surface of the trench; and (f) a gate electrode embedded in the trench via the gate insulating film, the gate electrode having an upper surface protruding upward from the device main surface. Respective uppermost surfaces of the gate electrode in the active region and the gate contact region are substantially at the same height to each other. The manufacturing method includes the steps of: (I) forming a side wall spacer of a first insulating film around the gate electrode over the device main surface; (II) after the step (I), forming a second insulating film substantially over the entire device main surface; and (III) after the step (II), forming a first through hole reaching an upper surface of the gate electrode in the gate contact region, in the second insulating film.

12. The manufacturing method of a semiconductor device according to Item 11 further includes the step of: (IV) after the step (I) and before the step (II), forming an etching stopper film including silicon nitride as a principal component over the device main surface including upper surfaces of the gate electrode and of the side wall spacer.

13. The manufacturing method of a semiconductor device according to Item 11 or 12 further includes the step of: (V) forming a second through hole reaching the device main surface in the active region, in the second insulating film substantially at the same time as the step (III).

14. The manufacturing method of a semiconductor device according to Item 13 further includes the step of: (VI) after the step (III), extending the first through hole in the gate electrode.

15. The manufacturing method of a semiconductor device according to Item 14 further includes the step of: (VII) extending the second through hole across the device main surface substantially at the same time as the step (VI).

16. In a manufacturing method of a semiconductor device, the semiconductor device includes (a) a semiconductor substrate with a device main surface; (b) an active region of a power MISFET over the device main surface; (c) a gate contact region of the power MISFET over the device main surface; (d) a trench provided across the active region and the gate contact region of the device main surface of the semiconductor substrate; (e) a gate insulating film formed at the inner surface of the trench; (f) a gate electrode embedded in the trench via the gate insulating film, the gate electrode having an upper surface protruding upward from the device main surface; and (g) a field insulating film provided over the device main surface of the semiconductor substrate in a part of the gate contact region. An uppermost surface of the gate electrode is not substantially high as compared to an uppermost surface of the field insulating film. The manufacturing method includes the steps of: (I) forming a first insulating film substantially over the entire device main surface; and (II) after the step (I), forming a first through hole reaching the upper surface of the gate electrode in the gate contact region, in the first insulating film.

17. The manufacturing method of a semiconductor device according to Item 11 further includes the step of: (III) before the step (I), forming an etching stopper film including silicon nitride as a principal component over the device main surface including upper surfaces of the gate electrode and of the field insulating film.

18. The manufacturing method of a semiconductor device according to Item 16 or 17 further includes the step of: (IV) forming a second through hole reaching the device main surface in the active region, in the first insulating film substantially at the same time as the step (II).

19. The manufacturing method of a semiconductor device according to Item 18 further includes the step of: (V) after the step (II), extending the first through hole into an inside of the gate electrode.

20. The manufacturing method of a semiconductor device according to Item 19 further includes the step of: (VI) extending the second through hole across the device main surface substantially at the same time as the step (V).

21. A semiconductor device having a power MISFET includes: (a) a semiconductor substrate with a device main surface; (b) an active region of the power MISFET formed at the device main surface of the semiconductor substrate; (c) a gate contact region of the power MISFET formed at the device main surface of the semiconductor substrate; (d) a trench provided across the active region and the gate contact region of the device main surface of the semiconductor substrate; (e) a gate insulating film formed at the inner surface of the trench; (f) a gate electrode embedded in the trench via the gate insulating film, the gate electrode having an upper surface protruding upward from the device main surface; (g) an interlayer insulating film formed above the device surface including the upper surface of the gate electrode; (h) a first contact hole opened in the interlayer insulating film, and reaching an upper surface of a part of the gate electrode embedded in the trench in the gate contact region; and (i) a metal wiring formed over the interlayer insulating film, and coupled to the gate electrode via the first contact hole.

22. The semiconductor device according to Item 21 further includes (j) a field insulating film provided over the device main surface of the semiconductor substrate in a part of the gate contact region.

23. The semiconductor device according to Item 21 further includes (k) a side wall spacer provided around the gate electrode.

24. The semiconductor device according to Item 22 further includes (m) an etching stopper film covering the field insulating film, and including silicon nitride as a principal component.

25. In the semiconductor device according to any one of Items 21 to 24, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in one or more positions.

26. In the semiconductor device according to any one of Items 21 to 25, the gate electrode includes a plane structure which comprises: (p1) a plurality of linear gate electrode main portions arranged substantially in parallel to each other; and (p3) a source contact trench provided in the device main surface of the semiconductor substrate so as to separate source regions on both sides between each pair of the adjacent linear gate electrode main portions.

27. In the semiconductor device according to any one of Items 21 to 24 and Item 26, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in two or more positions.

28. In the semiconductor device according to any one of Items 21 to 24 and Item 26, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in two or more positions including both ends of the pair of the gate electrode main portions.

29. The semiconductor device according to Item 23 further includes: (q) a silicide layer formed over the upper surface of the gate electrode and an inner surface of the source contact trench.

30. The semiconductor device according to any one of Items 21, 23 and 25 to 29 further includes: (r) an etching stopper film formed directly under the interlayer insulating film and containing silicon nitride as a principal component.

31. A semiconductor device having a power MISFET includes: (a) a semiconductor substrate with a device main surface; (b) a trench gate region of the power MISFET formed over the device main surface of the semiconductor substrate; (c) a trench provided at the device main surface of the semiconductor substrate in the trench gate region; (d) a gate insulating film formed at the inner surface of the trench; (e) a gate electrode embedded in the trench via the gate insulating film, the gate having an upper surface protruding upward from the device main surface; (f) an interlayer insulating film formed above the device surface including the upper surface of the gate electrode; (g) a first contact hole opened in the interlayer insulating film, and reaching an upper surface of a part of the gate electrode embedded in the trench in the gate contact region; and (h) a metal wiring formed over the interlayer insulating film, and coupled to the gate electrode via the first contact hole.

32. The semiconductor device according to Item 31 further includes (j) a field insulating film provided over the device main surface of the semiconductor substrate in a part of the gate contact region.

33. The semiconductor device according to Item 31 further includes (k) a side wall spacer provided around the gate electrode.

34. The semiconductor device according to Item 32 further includes: (m) an etching stopper film covering the field insulating film, and including silicon nitride as a principal component.

35. In the semiconductor device according to any one of Items 31 to 34, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in one or more positions.

36. In the semiconductor device according to any one of Items 31 to 35, the gate electrode includes a plane structure which comprises: (p1) a plurality of linear gate electrode main portions arranged substantially in parallel to each other; and (p3) a source contact trench provided in the device main surface of the semiconductor substrate so as to separate source regions on both sides between each pair of the adjacent linear gate electrode main portions.

37. In the semiconductor device according to any one of Items 31 to 34 and Item 36, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in two or more positions.

38. In the semiconductor device according to any one of Items 31 to 34 and Item 36, the gate electrode includes a plane structure which comprises: (p1) a plurality of linear gate electrode main portions arranged substantially in parallel to each other; and (p2) a gate electrode coupling portion for coupling each pair of the adjacent linear gate electrode main portions to each other in two or more positions including both ends of the pair of the gate electrode main portions.

39. The semiconductor device according to Item 33 further includes: (q) a silicide layer formed over the upper surface of the gate electrode and an inner surface of the source contact trench.

40. The semiconductor device according to any one of Items 31, 33, and 35 to 39 further includes: (r) an etching stopper film formed directly under the interlayer insulating film, and including silicon nitride as a principal component.

Explanation of Description Format, Basic Terms, and Usage in Present Application 1. In the present application, the description of preferred embodiments may be divided into sections for convenience, if necessary, but these embodiments are not individually separated from each other except when specified otherwise. Each embodiment indicates each component of a single example, a detailed part of another embodiment, or a modified example of a part or all of other embodiments or the like. In principle, the repeated description of the same part will be omitted below. Each component of the embodiment is not essential except when specified otherwise, except when the number of components is limited, and except when indicated otherwise from the context in theory.

2. Likewise, in the description of the embodiments or the like, the phrase "X comprised of A" or the like about material, component, or the like does not exclude a member containing an element other than A as one of principal components, except when specified otherwise, and except when indicated from the context. For example, as to a component, the above phrase as to the component means "X containing A as a principal component" or the like.

Specifically, it is apparent that for example, the term "a silicon member" or the like is not limited to pure silicon, and may include a member containing multicomponent alloy containing SiGe alloy or other silicon materials as a principal component, and other additives (doped impurities) or the like.

The term "gold, silver, aluminum, or the like" is not limited to pure one, and may include metal or alloy containing gold or aluminum as a principal component.

Likewise, it is also apparent that the term "silicon oxide film" includes not only a relatively pure undoped silicon dioxide film, but also a thermally-oxidized film made of fluorosilicate glass (FSG), TEOS-based silicon oxide, silicon oxicarbide (SiOC), or carbon-doped silicon oxide, or orgonosilicate glass (OSG), phosphorus silicate glass (PSG), borophosphosilicate glass (BPSG), or the like, a CVD oxide film, a coating type silicon oxide film made of spin on glass (SOG), nano-clustering silica (NSC), or the like, a silica-based Low-k insulating film (porous insulating film) made of the same member as described above with holes introduced therein, and a composite film or the like containing the above-mentioned material as a principal component with another silicon-based insulating film.

3. Likewise, preferred examples of diagrams, positions, properties, and the like are described in the embodiments, but the invention is not strictly limited thereto except when specified otherwise, and except when indicated otherwise from the context.

4. Further, also in referring to a specific value or quantity, the invention may have a value exceeding the specific value, or may have a value less than the specific value except when specified otherwise, and except when indicated otherwise from the context.

5. The term "wafer", "semiconductor chip", "chip", "semiconductor substrate", or "substrate" as used herein generally indicates a single crystal silicon wafer (or chip, note that the same goes for the description below) over which a semiconductor device (a semiconductor integrated circuit device, or an electronic device, note that the same goes for the description below) is formed, but may include a composite wafer or the like of an insulating substrate, such as an epitaxial wafer, an SOI substrate, or a LCD glass substrate, and a semiconductor layer or the like.

The term "upper side" of a chip or the like (including a wafer) as used herein means a device surface (a surface forming a main portion of a device, that is, a surface opposite to a back surface), and the term "lower side" means a back surface side. Such terms do not relate to the direction of gravity unless otherwise specified.

6. The term "aluminum wiring", "aluminum-based metal wiring", "aluminum electrode", or "aluminum-based metal electrode" as used herein generally includes a source pad, or a gate pad, or the like, and is a metal wiring or electrode for coupling to a source contact portion or a gate contact portion. The term "aluminum" generally contains silicon and other additives (at several percentages in total), and more precisely, is metal which contains aluminum as a principal component. Normally, a lower layer is accompanied by an underlying metal layer (barrier layer) made of TiW, TiN, or the like, which is integrated with an aluminum-based main metal layer serving as an upper layer. The existing form of these layers changes due to a thermal treatment. Thus, the underlaying metal layer is not referred to unless otherwise specified.

7. The term "trench-gate type power MISFET" as used herein means one device formed by digging a trench more deeply from the surface side of the semiconductor substrate (note that the trench has the depth that is greater than the width), and embedding a gate electrode (which is a so-called trench gate) comprised of polysilicon or the like via a gate insulating film or the like.

8. The term "trench gate region" of the power MISFET means a region of the trench in which the gate electrode is embedded as viewed in the plane direction, that is, a convex region on the device surface having a trench gate and containing an area between the trench gate and an adjacent trench gate (this region corresponding to a plane figure, for example, a rectangular region, in which an arbitrary point on a straight line coupling any two points therein exists).

9. The term "active region" of the power MISFET means a convex region (for example, a rectangular region) of the trench gate region near which an n+ source region exists (a region corresponding to an opening of a resist film for introducing impurities into the n+ source region) (see FIG. 3 or 60).

10. The term "gate contact region" of the power MISFET means a region covering a gate contact portion and a surrounding region thereof containing an area between the adjacent gate contact portions. The gate contact region is the region other than the active region within the trench gate region.

11. The term "protruding trench gate" of the power MISFET means a trench gate structure having a gate electrode protruding from the upper surface of a semiconductor substrate (n+ source region), or the gate electrode (trench gate).

12. The term "gold or silver electrode" or the like regarding a back side electrode is not limited to a metal film containing gold or silver as a principal component, and does not exclude a metal film having an intermediate film, such as a barrier film or the like, intervening in between the metal film and a single crystal substrate. The electrode normally includes the metal film having the intermediate film made of, for example, titanium, nickel, or aluminum, or a silicide film made of the above metal material.

Further Detailed Description of Preferred Embodiments

Now, preferred embodiments of the invention will be further described in detail below. In each drawing, the same or similar part is designated by the same or similar reference character or numeral, and a description thereof will not be repeated in principle.

1. Explanation of Semiconductor Device Having Power MISFET in Each of First to Sixth Embodiments of the Invention of Present Application, and of Semiconductor Device Having Power MISFET in Comparative Example (Mainly See FIG. 67)

Figure 3:
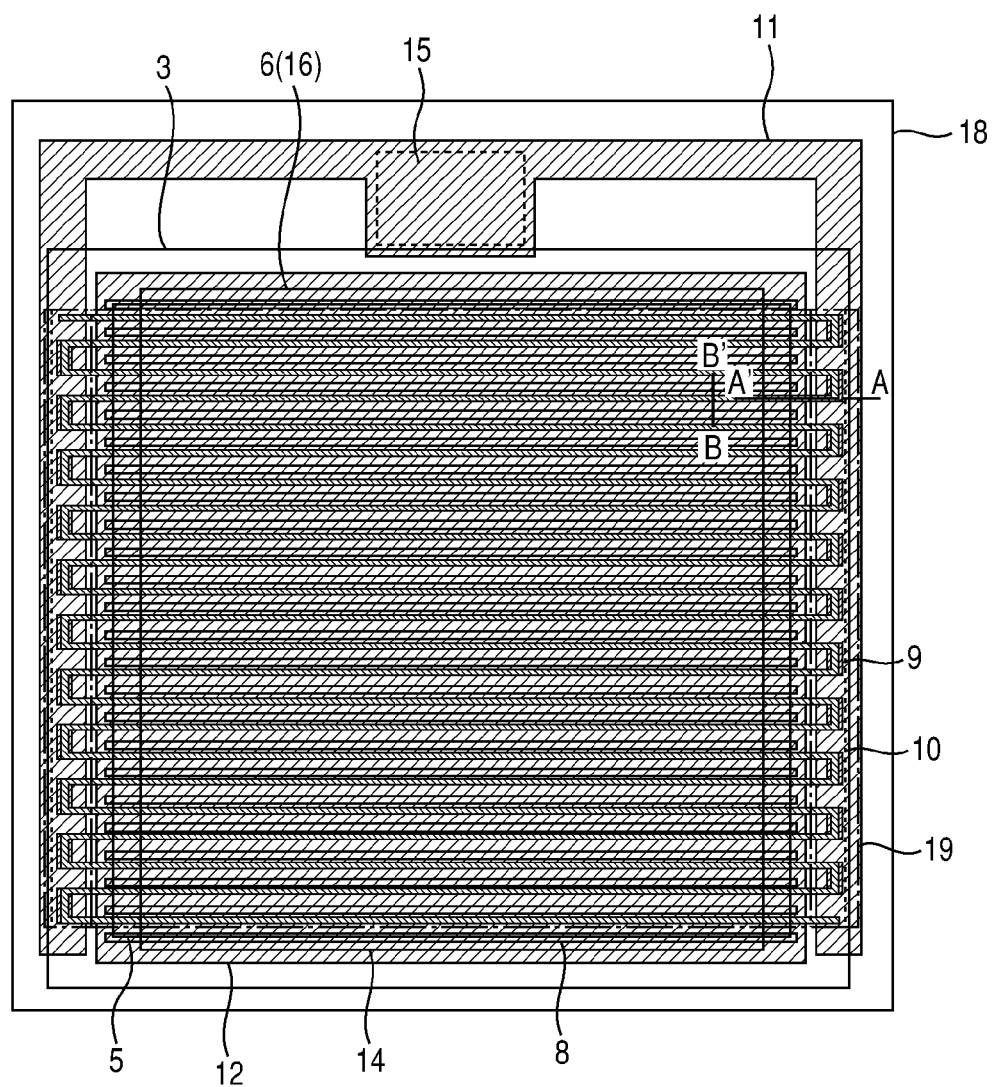
FIG. 3 is a diagram showing the layout of an upper surface of a first chip of the semiconductor device having the power MISFET according to the first embodiment of the invention of the present application (in which details of a surrounding area thereof are partly omitted for convenience of drawing, and the layout of this embodiment is common to other embodiments)
Figure 67:
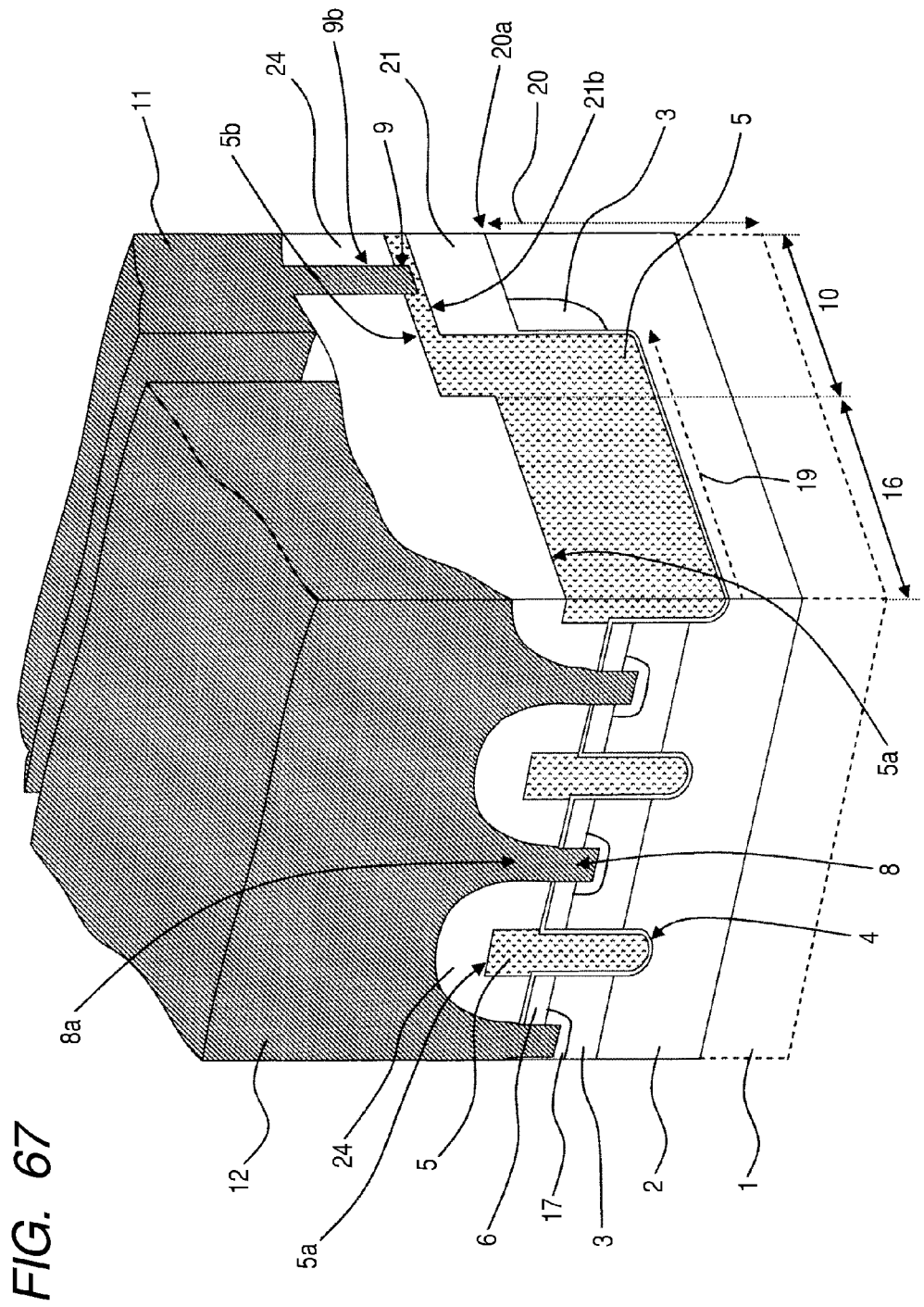
FIG. 67 is a perspective view showing a section of a main portion of a semiconductor device (in a comparative example) having a power MISFET for comparison with the semiconductor device having the power MISFET in each of the first to sixth embodiments of the invention of the present application (in which the right section and the left section substantially correspond to the section taken along the line A-A' of FIG. 3, and the section taken along the line B-B' of FIG. 3, respectively)

FIG. 67 is a perspective view containing a section of a main portion of a semiconductor device (in a comparative example) having a power MISFET for comparison with a semiconductor device having the power MISFET in each of first to sixth embodiments of the invention of the present application (in which the right section and the left section substantially correspond to a section taken along the line A-A' of FIG. 3, and a section taken along the line B-B' of FIG. 3, respectively). Based on the figure, the semiconductor device having the power MISFET according to each of the first to sixth embodiments of the invention of the present application will be described below with reference to the semiconductor device having the power MISFET in the comparative example.

First, an example of a protruding gate in a trench gate structure, which is a mainstream of the present power MOSFET, will be described below (note that each embodiment of the invention of the present application basically follows the main portions of this structure). It is noted that in embodiments described later, every semiconductor device is an n-type MOSFET, but the invention is not limited thereto. The semiconductor device may be a p-type MOSFET by reversing a conductivity type of a semiconductor portion (containing a polysilicon portion). As shown in FIG. 67, an n-type epitaxial silicon layer 2 acting as a drift region is laminated on an n+ type silicon single crystal substrate 1 (which is a wafer on an initial stage in a manufacturing process, or a chip after dicing in the process) serving as a drain of the power MOSFET. A main portion of an element is formed in the n-type epitaxial silicon layer 2 (note that a metal electrode made of gold or the like is formed as a drain electrode over the back surface or lower surface of the substrate 1). That is, p-type impurities are doped into an upper portion of the n-type epitaxial silicon layer 2 to form a p-type channel region 3. Over the region 3, n-type impurities are doped to form an n+ type source region 6. A plurality of linear trenches (trench gate regions 19) are provided in parallel to each other across both an active region 16 occupying most of the internal region of a chip and a gate contact region 10 surrounding the active region. In each trench, a gate electrode 5 made of polysilicon or the like is embedded via the gate insulating film 4. A source contact trench 8 is formed in parallel to the gate electrode 5 in a surface 20a of a semiconductor substrate 20 located in an intermediate position between a pair of adjacent gate electrodes 5 so as to separate the n+ type source regions 6. P+ type body contact regions (impurity doped regions) 17 are provided around the source contact trench 8. A field insulating film 21 is provided over the surface 20a of the semiconductor substrate 20 in a part of the gate contact area 10, and the gate electrode 5 extends over the field insulating film 21. Also, in the active region 16, the upper surface 5a of the gate electrode 5 has a protruding gate structure (hereinafter referred to as a "protruding gate") protruding upward from the surface 20a of the semiconductor substrate 20. If the upper surface 5a of the gate electrode 5 is at the same level as the upper surface 20a of the silicon substrate 20 or lower than the upper surface 20a (hereinafter referred to a "non-protruding gate"), the source diffusion layer 6 or the like cannot be thinned taking into consideration processing accuracy of the gate electrode 5, which is a demerit. The protruding gate structure is to avoid the demerit. The increase in thickness of the source diffusion layer increases a distance from a source contact layer to a channel region of the MOSFET, resulting in an increase in on resistance.

An interlayer insulting film 24 is formed above the surface 20a of the semiconductor substrate 20 including the upper surface 5a of the gate electrode 5. In the interlayer insulating film 24, an opening 8a of the insulating film for a source contact trench coupled to the source contact trench 8 and an opening 9b of the insulating film for a gate contact trench coupled to the gate contact trench 9 are provided in the interlayer insulating film. Above the active region 16 of the interlayer insulating film 24, an aluminum-based metal source wiring or a metal source electrode is provided to make contact with a p+ type body contact region and the n+ type source region 6 via the opening 8a of the insulating film for the source contact trench. On the other hand, a gate metal wiring 11 is provided above the gate contact region of the interlayer insulating film 24 to be coupled to the gate contact trench 9 via the opening 9b of the insulating film for the gate contact trench.

Thus, the general trench gate structure employs a "gate lead-out structure" in which the gate electrode 5 is extended upward at the end of the trench gate region 19 to be derived over the field insulating film 21 so as to form contact between the gate electrode 5 and the gate metal wiring 11 above the field insulating film 21. This is because the formation of gate contact directly above the trench gate region 19 increases the width of the trench gate 5, thus leading to an increase in on resistance of the MOSFET.

Such a gate lead-out structure (gate contact region 10) has the merit that can advantageously enlarge a pattern of the gate contact portion 9. On the other hand, there is a large difference in height or a large stepped portion between the active region 16 and the gate contact region 10, which disadvantageously imposes restrictions on simultaneous formation of the source contact hole 8a and the gate contact hole 9b (which are collectively referred to as a "contact hole").

Accordingly, in the MISFET of each embodiment of the present application, the upper surfaces 5a and 5b of the gate electrode 5 are formed substantially at the same height at a starting time of formation of the contact hole as a reference time by taking into consideration the merit of the protruding gate structure without using the gate lead-out structure thereby to form gate contact near the end of the trench gate region. That is, in the non-protruding gate structure, the formation of contact directly above the trench gate may directly lead to fatal failures, including short-circuiting between the gate electrode and the substrate due to a fine displacement caused by making contact on a fine pattern. However, since the height of the substrate surface differs from that of the contact surface in the protruding gate, even with the fine displacement, the gate has a margin by a height of a protruding portion to cause the contact to reach the substrate. The following embodiments are particularly suitable for use especially in the MISFET having the trench gate whose maximum dimension is 0.4 μm or less. However, it is apparent that the embodiments are effectively applied to any trench gate having a dimension larger than the above value. Further, the following embodiments are suitable for use especially in the trench gate type power MISFET (MOSFET) having a relatively low withstanding pressure (for example, a drain withstanding pressure of less than 50 volts). It is apparent that the embodiments are also effectively applied to any trench gate type power MISFET having a withstanding pressure larger than the above value. The embodiments below are further suitable for use in a high-speed switching application.

Now, the preferred embodiments will be specifically described below.

2. Explanation of Semiconductor Device Having Power MISFET in First Embodiment (of Basic Type) of the Invention of Present Application (See Mainly FIGS. 1 to 18, FIGS. 65 and 66)

Figure 2:
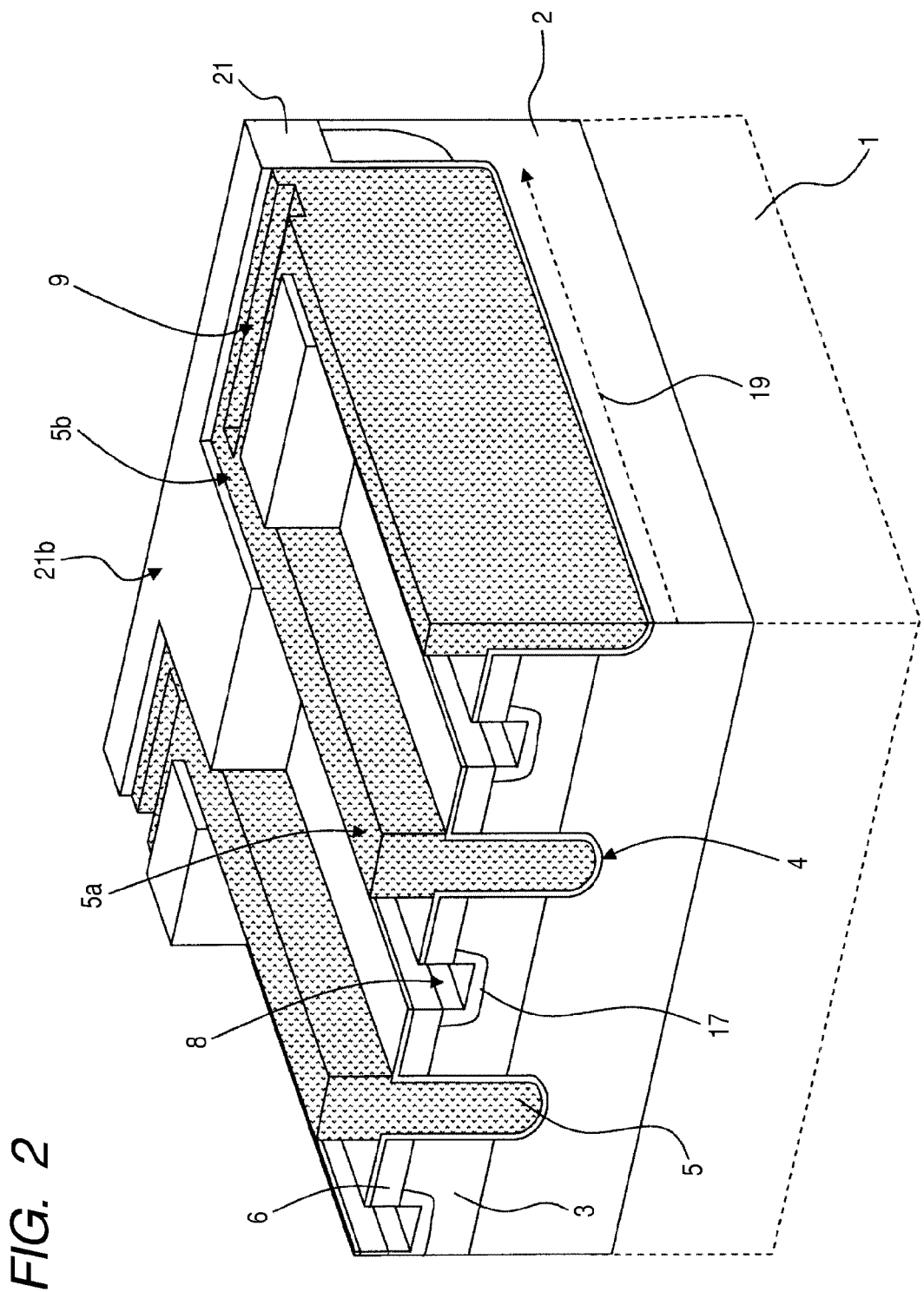
FIG. 2 is a perspective view showing a section of a main portion of the semiconductor device having the power MISFET according to the first embodiment of the invention of the present application (in which the aluminum-based metal layer as the upper layer and a PSG layer as a lower layer are removed for easy understanding, and in which the right section corresponds to a section taken along the line A-A' of FIG. 3, and the left section corresponds to a section taken along the line B-B' of FIG. 3)
Figure 65:
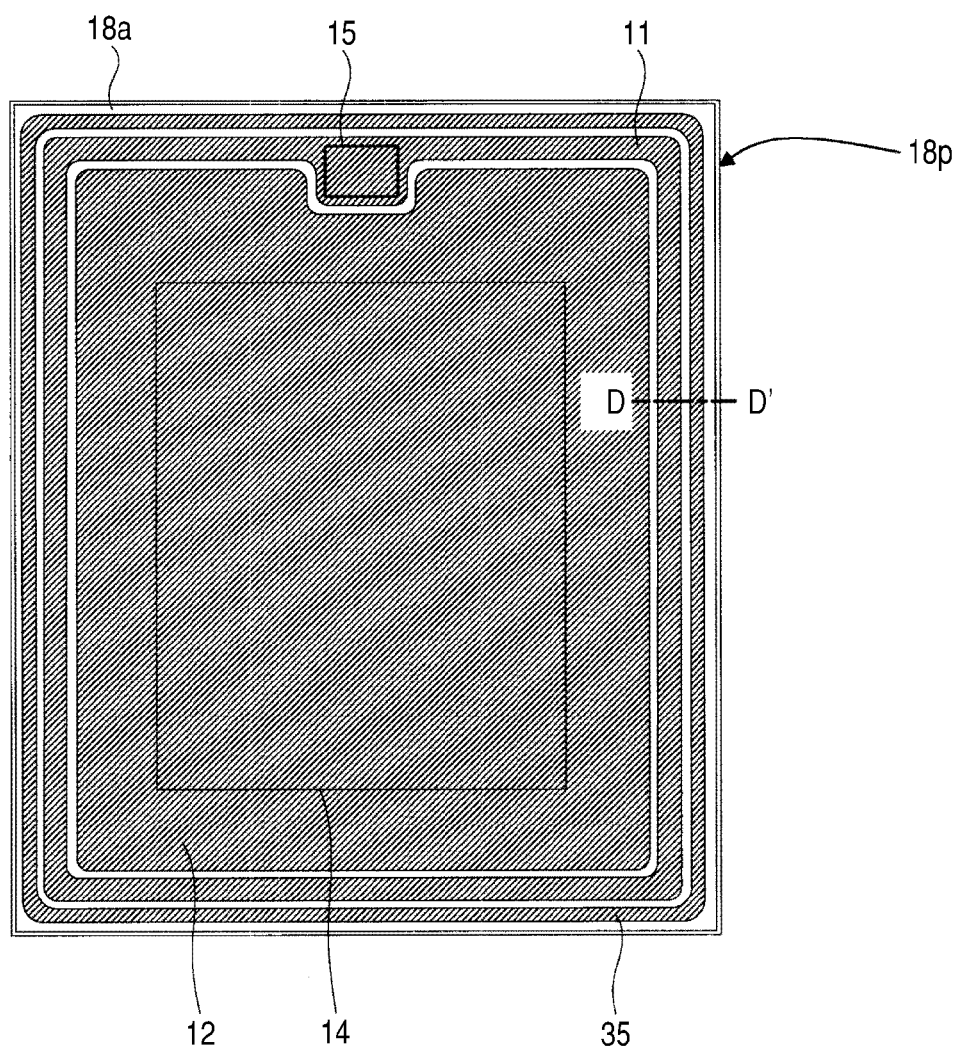
FIG. 65 is a top view of the entire chip including a guard ring portion and a chip end of the semiconductor device having the power MISFET according to each of the first to sixth embodiments of the invention of the present application (specifically according to the first embodiment, almost specifically according to the second to sixth embodiments except for the presence or absence of a stopper film, and substantially according to the seventh embodiment in a peripheral structure of the chip, such as the guard ring)
Figure 66:
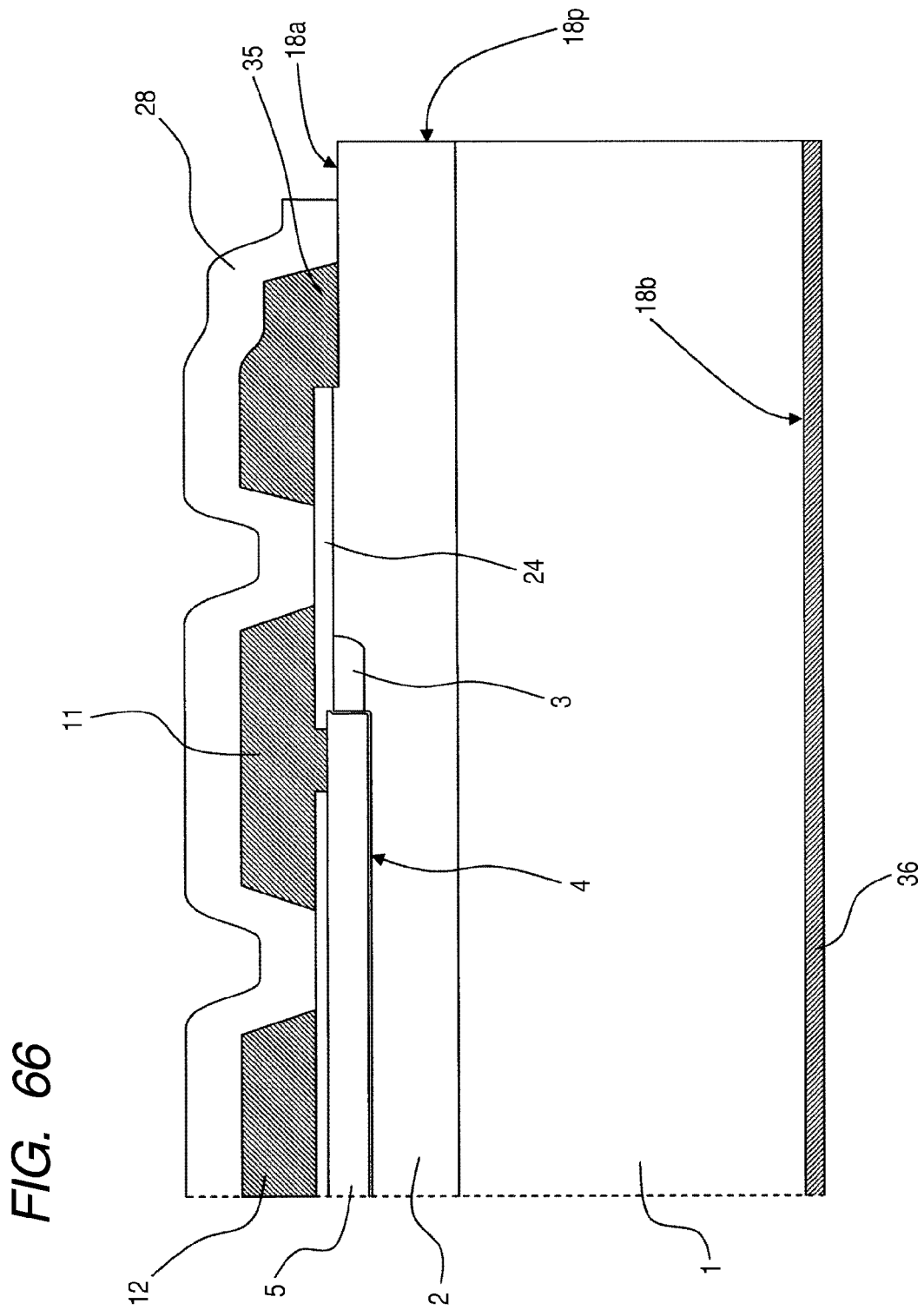
FIG. 66 is a schematic sectional view of a chip end containing a back side electrode which corresponds to a section taken along the line D-D' of FIG. 65.

FIG. 1 is a perspective view including a section of a main portion of a semiconductor device having a power MISFET according to the first embodiment (of a basic type) of the invention of the present application (in which an aluminum-based metal layer as an upper layer is removed for easy understanding, and in which the right section corresponds to a section taken along the line A-A' of FIG. 3, and the left section corresponds to a section taken along the line B-B' of FIG. 3). FIG. 2 is a perspective view including a section of a main portion of the semiconductor device having the power MISFET according to the first embodiment (of the basic type) of the invention of the present application (in which the aluminum-based metal layer as an upper layer and a PSG layer as a lower layer are removed for easy understanding, and in which the right section corresponds to the section taken along the line A-A' of FIG. 3, and the left section corresponds to the section taken along the line B-B' of FIG. 3). FIG. 3 is a layout diagram of an upper surface of a first chip of the semiconductor device having the power MISFET according to the first embodiment of the invention of the present application (in which details of a surrounding area thereof are partly omitted for convenience of drawing, and the layout of this embodiment is common to other embodiments). FIGS. 4A and 4B are flow diagrams showing a section of the device in a manufacturing process (in step S1: surface oxidation step) corresponding to a manufacturing method for the semiconductor device having the power MISFET in the first embodiment of the invention of the present application (in which FIG. 4B substantially corresponds to the section taken along the line A-A' of FIG. 3, and FIG. 4A substantially corresponds to the section taken along the line B-B' of FIG. 3, note that the same goes for the description below). FIGS. 5A and 5B are flow diagrams showing a section of the device in a manufacturing process (in step S2: surface oxide film etching step) corresponding to the manufacturing method for the semiconductor device having the power MISFET in the first embodiment of the invention of the present application. FIGS. 6A and 6B are flow diagrams showing a section of the device in a manufacturing process (in step S3: trench etching step) corresponding to the manufacturing method for the semiconductor device having the power MISFET in the first embodiment of the invention of the present application. FIGS. 7A and 7B are flow diagrams showing a section of the device in a manufacturing process (in step S4: gate oxidation step) corresponding to the manufacturing method for the semiconductor device having the power MISFET in the first embodiment of the invention of the present application. FIGS. 8A and 8B are flow diagrams showing a section of the device in a manufacturing process (in step S5: polysilicon CVD step) corresponding to the manufacturing method for the semiconductor device having the power MISFET in the first embodiment of the invention of the present application. FIGS. 9A and 9B are flow diagrams showing a section of the device in a manufacturing process (in step S6: polysilicon etching step) corresponding to the manufacturing method for the semiconductor device having the power MISFET in the first embodiment of the invention of the present application. FIGS. 10A and 10B are flow diagrams showing a section of the device in a manufacturing process (in step S7: channel region impurity ion implantation step) corresponding to the manufacturing method for the semiconductor device having the power MISFET in the first embodiment of the invention of the present application. FIGS. 11A and 11B are flow diagrams showing a section of the device in a manufacturing process (in step S8: source region impurity introduction step) corresponding to the manufacturing method for the semiconductor device having the power MISFET in the first embodiment of the invention of the present application. FIGS. 12A and 12B are flow diagrams showing a section of the device in a manufacturing process (in step S9: PSG-CVD step) corresponding to the manufacturing method for the semiconductor device having the power MISFET in the first embodiment of the invention of the present application. FIGS. 13A and 13B are flow diagrams showing a section of the device in a manufacturing process (in step S10: an opening formation step for a source contact trench) corresponding to the manufacturing method for the semiconductor device having the power MISFET in the first embodiment of the invention of the present application. FIGS. 14A and 14B are flow diagrams showing a section of the device in a manufacturing process (in step S11: source contact trench formation step) corresponding to the manufacturing method for the semiconductor device having the power MISFET in the first embodiment of the invention of the present application. FIGS. 15A and 15B are flow diagrams showing a section of the device in a manufacturing process (in step S12: p+ type body contact region ion implantation step) corresponding to the manufacturing method for the semiconductor device having the power MISFET in the first embodiment of the invention of the present application. FIGS. 16A and 16B are flow diagrams showing a section of the device in a manufacturing process (in step S13: aluminum-based metal layer formation step) corresponding to the manufacturing method for the semiconductor device having the power MISFET in the first embodiment of the invention of the present application. FIGS. 17A and 17B are flow diagrams showing a section of the device in a manufacturing process (in step S14: aluminum-based metal layer etching step) corresponding to the manufacturing method for the semiconductor device having the power MISFET in the first embodiment of the invention of the present application. FIGS. 18A and 18B are flow diagrams showing a section of the device in a manufacturing process (in step S15: protective film formation and pad patterning step) corresponding to the manufacturing method for the semiconductor device having the power MISFET in the first embodiment of the invention of the present application. FIG. 65 is a top view of the entire chip including a guard ring portion and a chip end of the semiconductor device having the power MISFET according to each of the first to sixth embodiments of the invention of the present application (specifically according to the first embodiment, almost specifically according to the second to sixth embodiments except for the presence or absence of a stopper film, and substantially according to the seventh embodiment in a chip peripheral structure, such as the guard ring). FIG. 66 is a schematic sectional view of a chip end containing a back side electrode corresponding to a section taken along the line D-D' of FIG. 65. Referring to theses figures, the semiconductor device having the power MISFET according to the first embodiment (of the basic type) of the invention of the present application will be described below.

First, referring to FIGS. 1, 2, 3, 65 and 66, the outline of the semiconductor device structure having the power MISFET according to the first embodiment (of the basic type) of the invention of the present application will be described below. As shown in FIG. 65, a substantially rectangular source metal electrode 12 including a source pad 14 at its center and a rectangular ring-like gate metal wiring 11 surrounding the electrode and including a gate pad 15 are provided in an internal region of the upper surface 18a (device surface) of a chip 18. Further, a rectangular ring-like guard ring 35 is provided between the metal wiring and an external chip end surface 18p.

Next, the structure of a section of a surrounding portion of the chip taken along the line D-D' of FIG. 65 will be described below. As shown in FIG. 66, a back side electrode 36 (drain electrode) made of gold or the like is formed over a back surface 18b of an n+ type silicon single crystal substrate 1 (for example, a low-resistance substrate doped with arsenic, phosphorus, and the like at high concentration). The back side electrode 36 includes, for example, a titanium barrier film of about 100 nm in thickness, a nickel intermediate film of about 200 nm in thickness, and a gold topcoat film of about 100 nm in thickness which are laminated in that order from the substrate 1 side. An n-type epitaxial silicon layer 2 whose concentration is lower than that of the substrate 1 is provided on the upper surface of the substrate 1. A trench gate 5 (for example, an n-type doped polysilicon layer doped with phosphorus or the like) is provided on the upper surface 18a side of an entire semiconductor substrate (semiconductor chip) 18 including the epitaxial silicon layer 2 via a gate insulating film 4, and a p-type channel region 3 is provided along the gate. A phospho-silicate glass (PSG) film of, for example, about 700 nm in thickness is formed as an interlayer insulating film 24 over the upper surface 18a of the semiconductor chip 18. A source metal electrode 12, a gate metal wiring 11, a guard ring 35, and the like are formed at the interlayer insulating film 24. These elements are formed by patterning an aluminum-based metal layer of about 3000 to 6000 nm in thickness. A polyimide film (for example, of about 2 μm in thickness) is formed as a final passivation film 28 over the aluminum-based metal layer (the metal layer including, for example, an aluminum film to which about 1% by weight of silicon is added, as an upper main portion, and a barrier metal film generally made of TiW, TiN, or the like, as a lower end). As shown in FIG. 65, the final passivation film 28 is provided with openings, which serve as the gate pad 15 and the source pad 14. The final passivation film 28 may be an organic resin film, such as a polyimide film, a single layer film of an inorganic insulating film, such as a silicon oxide film or a silicon nitride film, a composite membrane of an silicon oxide film and a silicon nitride film, or a composite membrane of an inorganic insulating film (lower layer) and an organic resin film (upper layer).

Now, the layout of an upper surface of the internal region (a region inside a surrounding portion) shown in FIG. 65 will be described below. As shown in FIG. 3, most of the internal region is filled with the meandering trench gate 5. A linear source contact trench 8 is opened between adjacent linear sections of the trench gate 5. The p-type channel region 3m (an opening of a resist film for introduction of impurities into a channel diffusion region) is formed so as to cover a region where the trench gate 5 is formed, that is, the trench gate region 19. In the p-type channel region 3m, an n+ source region 6m (an opening of the resist film for introduction of impurities into the n+ source region) is formed, and corresponds to the active region 16. The gate contact region 10 is formed in the trench gate region 19 outside the active region 16. A gate contact is formed in the gate contact trench 9 portion within the gate contact region 10.

Next, the sections taken along the line A'-A and the line B'-B of FIG. 3 will be described below with reference to FIGS. 1 and 2. As shown in FIGS. 1 and 2, the upper surface 5b of the trench gate 5 at the end of the trench gate region 19, that is, the gate contact portion 9 provided in the upper surface 5b of the polysilicon gate electrode 5 is coupled to the gate metal wiring 11 as the upper layer via a gate contact hole 9b formed in the interlayer insulating film 24. As can be seen from the above description, the polysilicon gate electrode 5 is entirely embedded in and over the trench, so that the entire upper surfaces 5a and 5b (except for the contact trench 9) are substantially at the same height.

Subsequently, a manufacturing procedure for the semiconductor device having the power MISFET according to the first embodiment (of the basic type) of the invention of the present application will be described below based on FIGS. 4 to 18.

Figure 4:
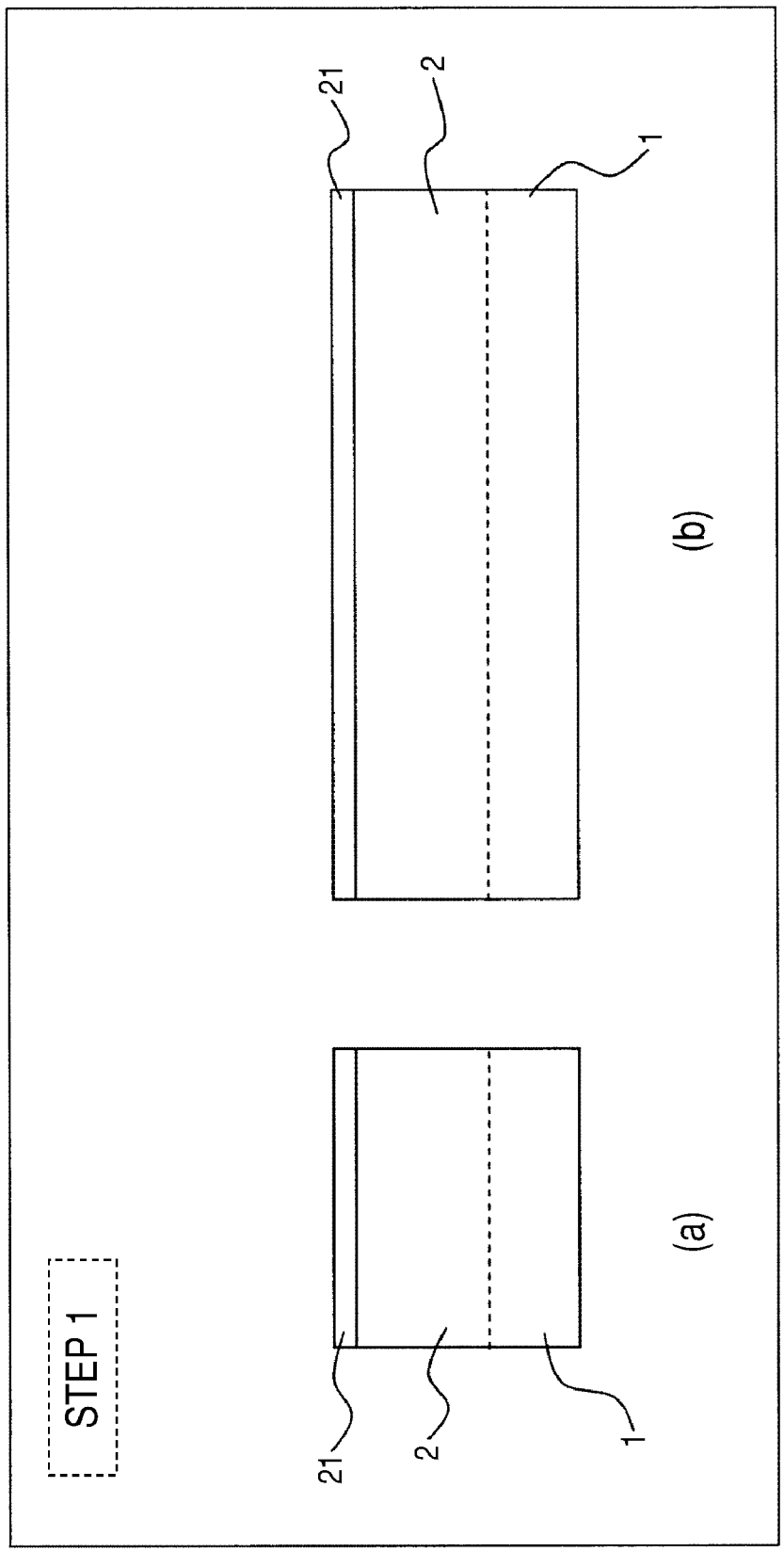
FIGS. 4A and 4B are flow diagrams showing a section of the device in a manufacturing process (in step S1: surface oxidation step) corresponding to a manufacturing method for the semiconductor device having the power MISFET in the first embodiment of the invention of the present application (in which FIG. 4B substantially corresponds to the section taken along the line A-A' of FIG. 3, and FIG. 4A corresponds to the section taken along the line B-B' of FIG. 3, note that the same goes for the description below)
Figure 5:
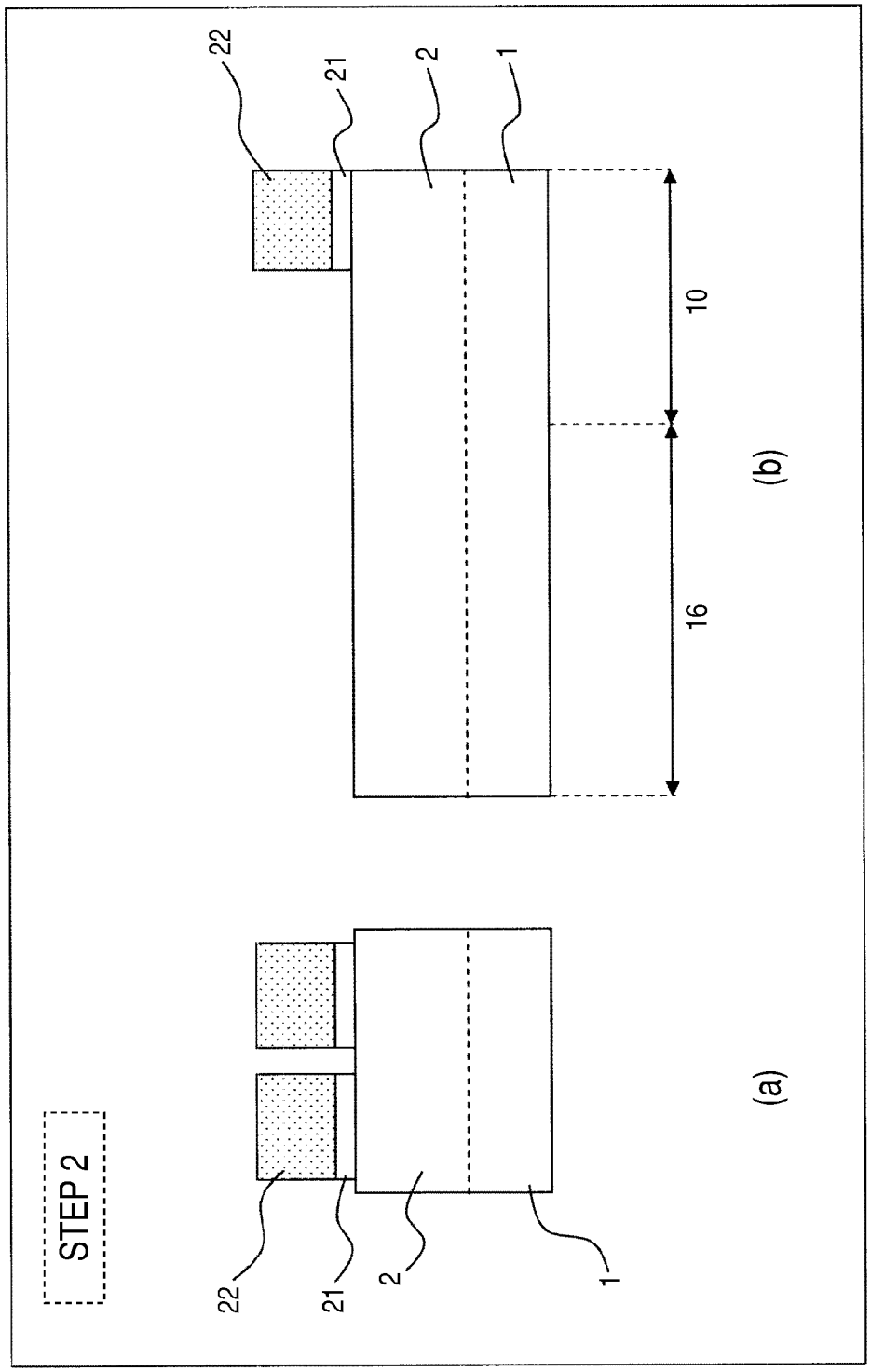
FIGS. 5A and 5B are flow diagrams showing a section of the device in a manufacturing process (in step S2: surface oxide film etching step) corresponding to the manufacturing method for the semiconductor device having the power MISFET in the first embodiment of the invention of the present application.
Figure 6:
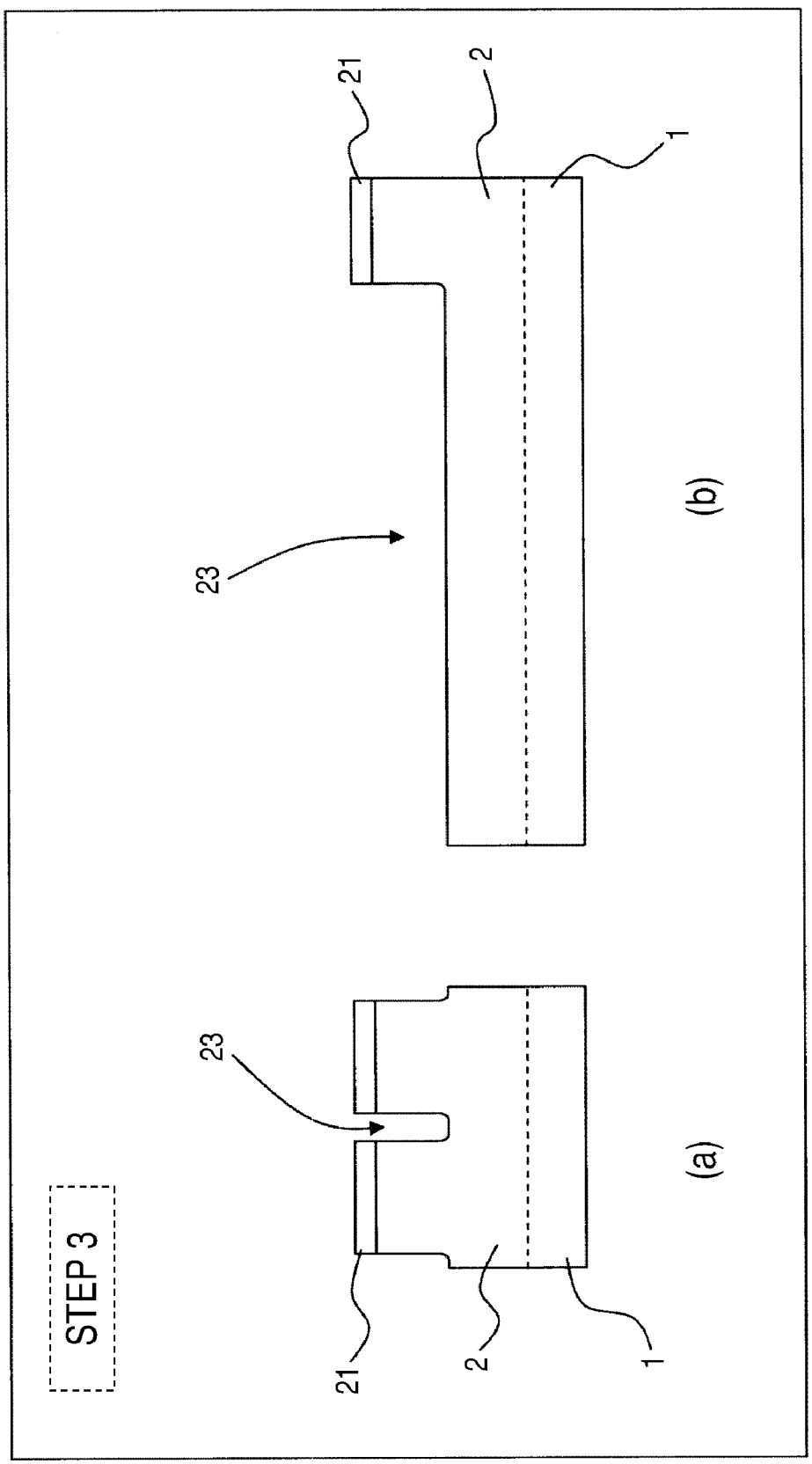
FIGS. 6A and 6B are flow diagrams showing a section of the device in a manufacturing process (in step S3: trench etching step) corresponding to the manufacturing method for the semiconductor device having the power MISFET in the first embodiment of the invention of the present application.
Figure 7:
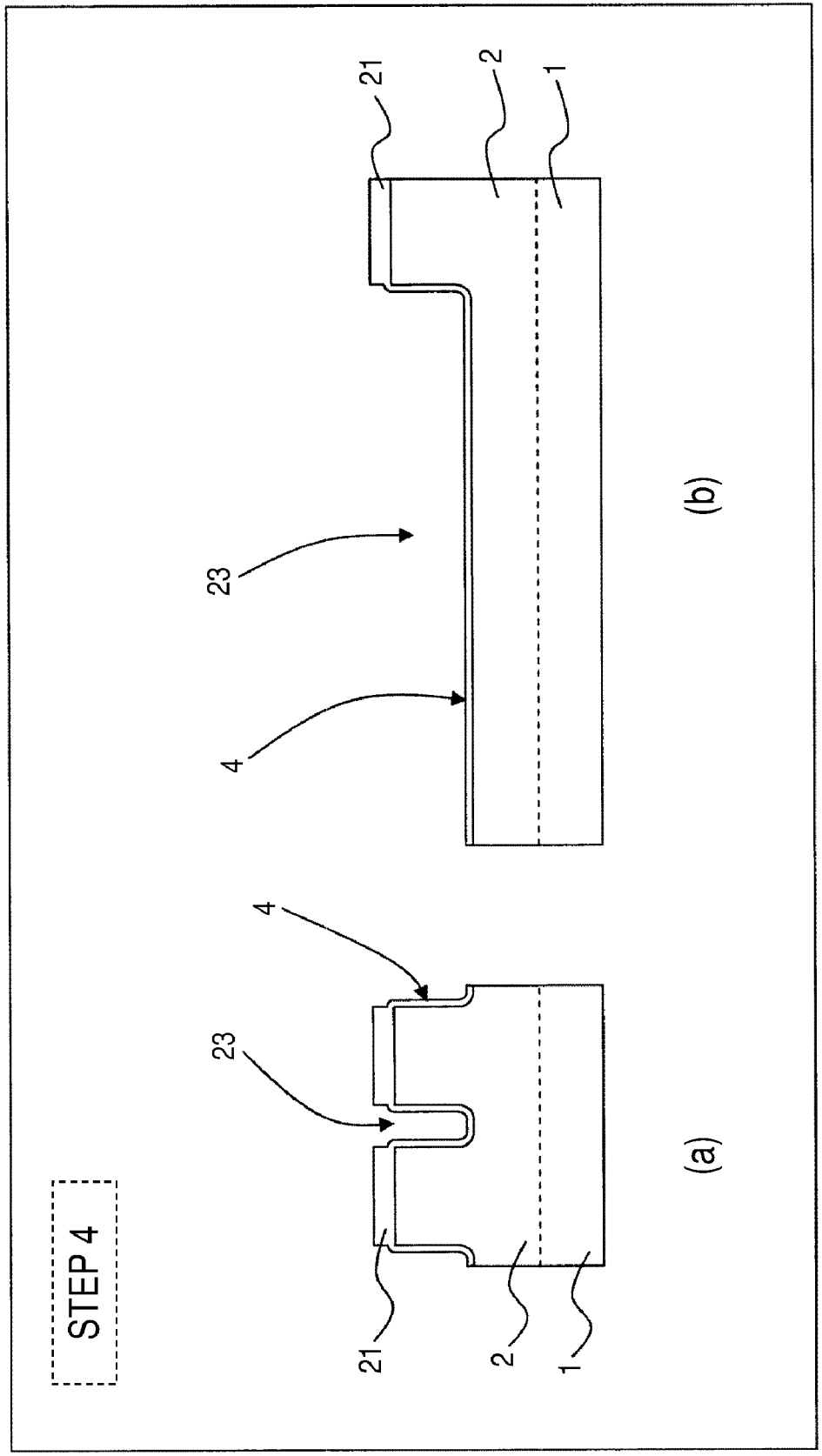
FIGS. 7A and 7B are flow diagrams showing a section of the device in a manufacturing process (in step S4: gate oxidation step) corresponding to the manufacturing method for the semiconductor device having the power MISFET in the first embodiment of the invention of the present application.
Figure 8:
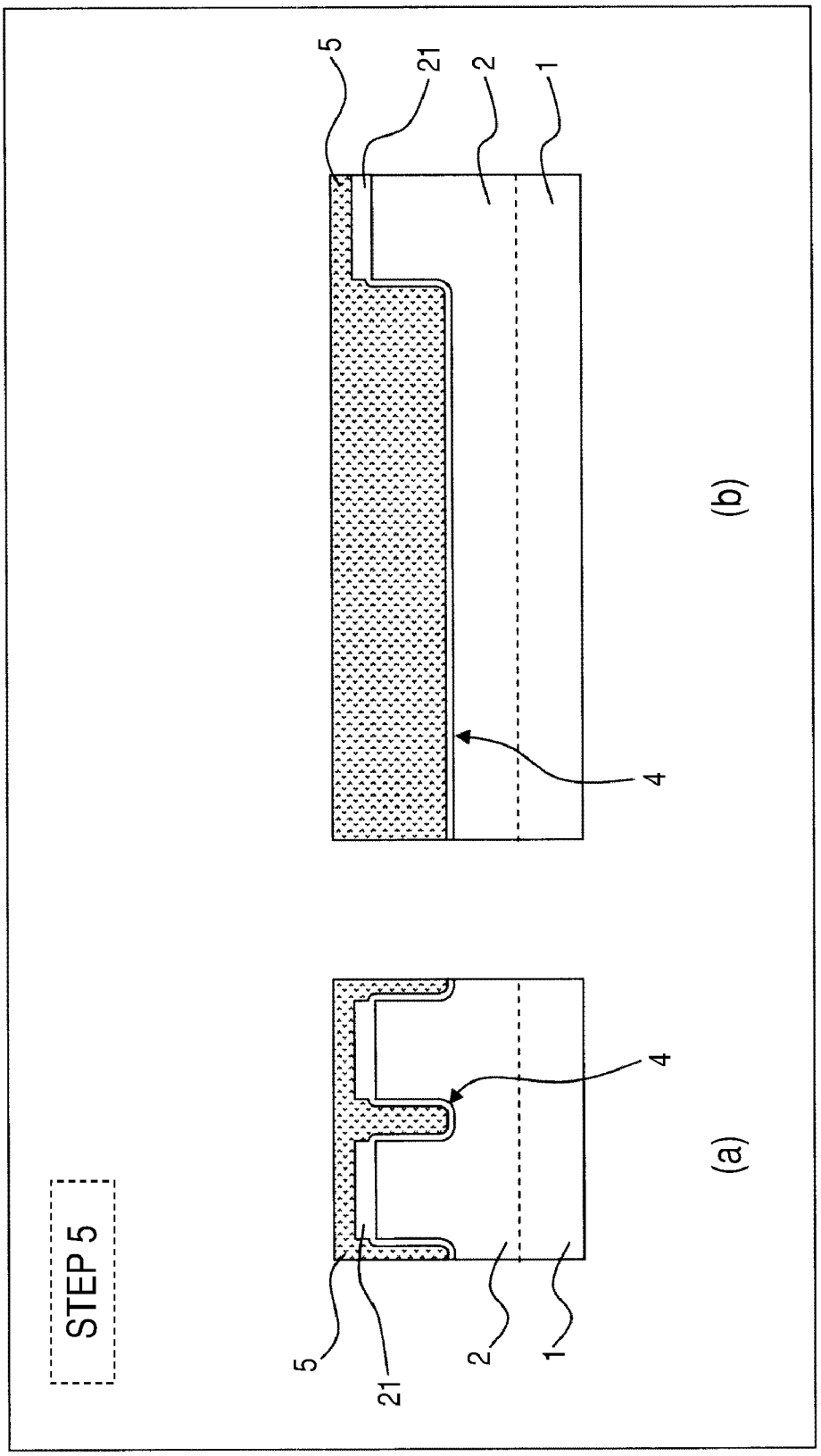
FIGS. 8A and 8B are flow diagrams showing a section of the device in a manufacturing process (in step S5: polysilicon CVD step) corresponding to the manufacturing method for the semiconductor device having the power MISFET in the first embodiment of the invention of the present application.
Figure 9:
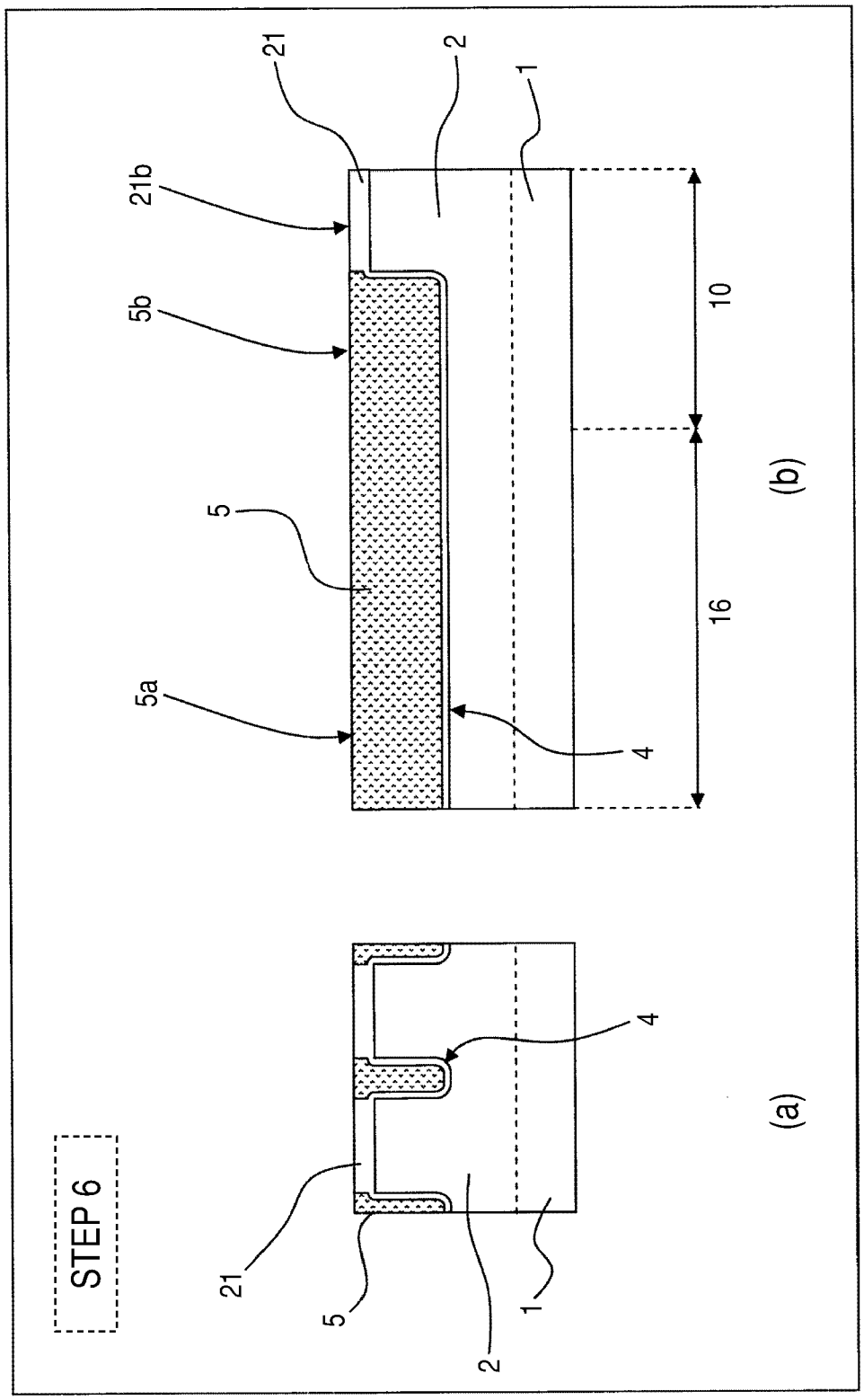
FIGS. 9A and 9B are flow diagrams showing a section of the device in a manufacturing process (in step S6: polysilicon etching step) corresponding to the manufacturing method for the semiconductor device having the power MISFET in the first embodiment of the invention of the present application.
Figure 10:
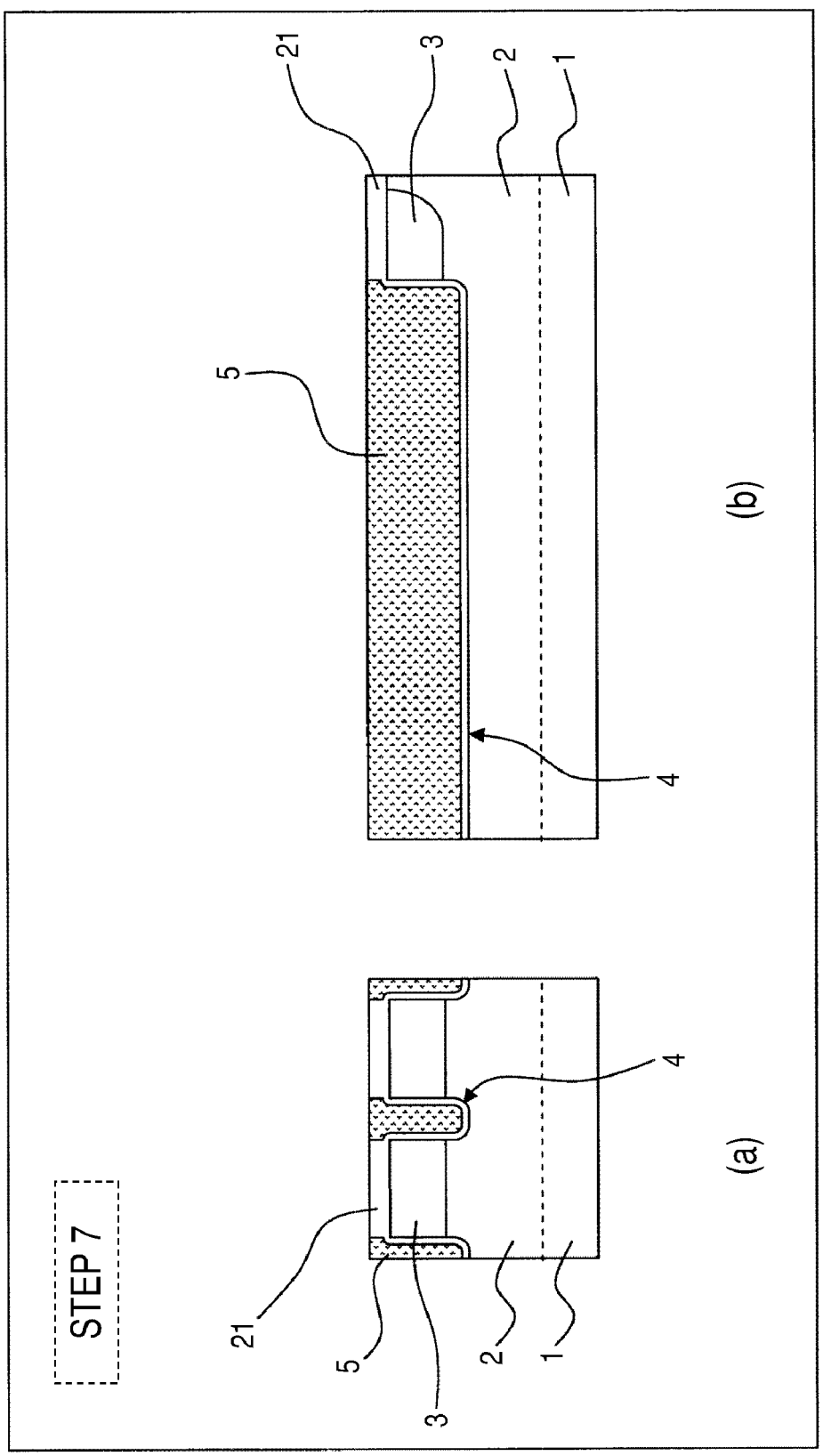
FIGS. 10A and 10B are flow diagrams showing a section of the device in a manufacturing process (in step S7: channel region impurity ion implantation step) corresponding to the manufacturing method for the semiconductor device having the power MISFET in the first embodiment of the invention of the present application.
Figure 11:
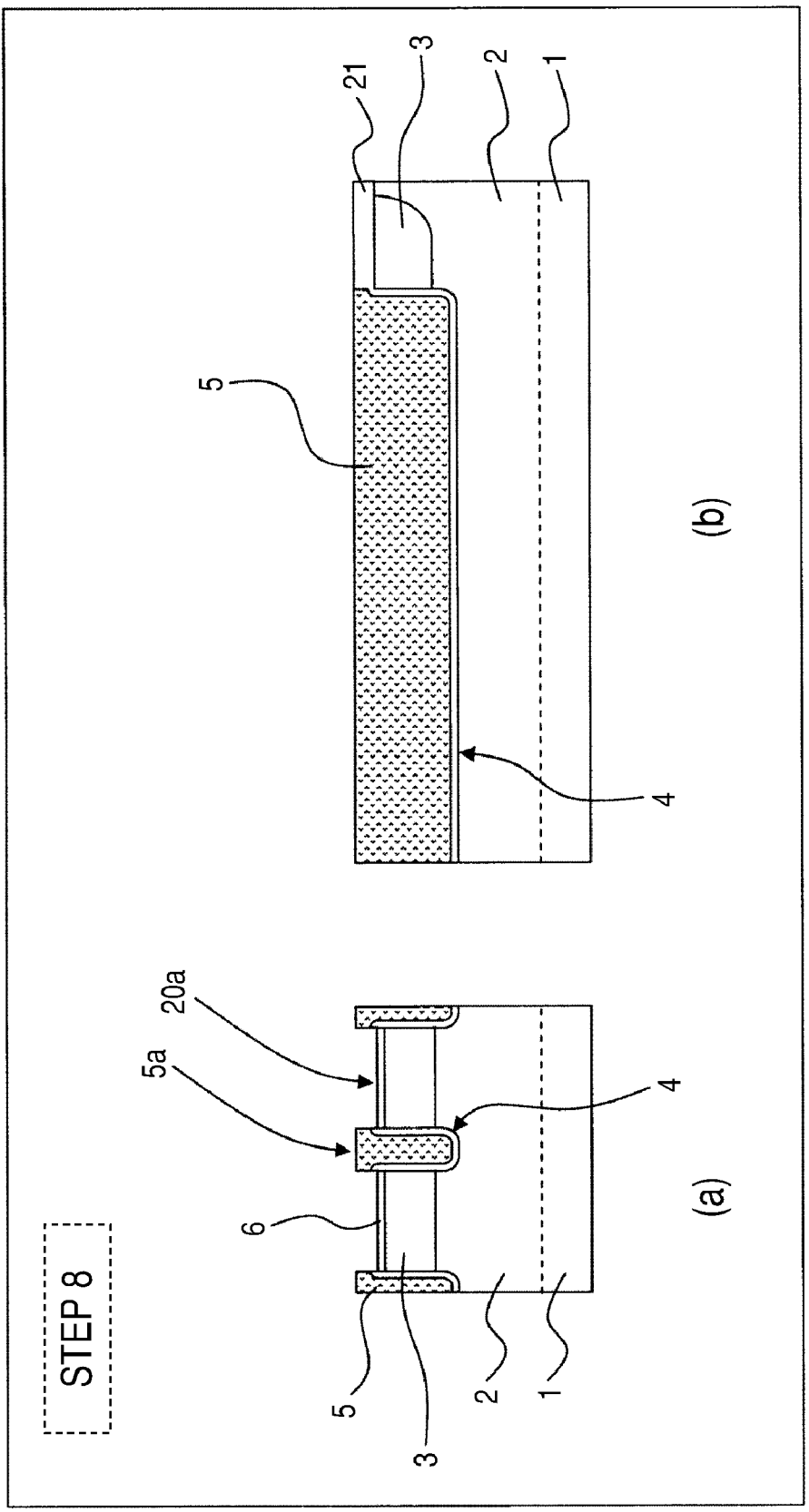
FIGS. 11A and 11B are flow diagrams showing a section of the device in a manufacturing process (in step S8: source region impurity introduction step) corresponding to the manufacturing method for the semiconductor device having the power MISFET in the first embodiment of the invention of the present application.
Figure 12:
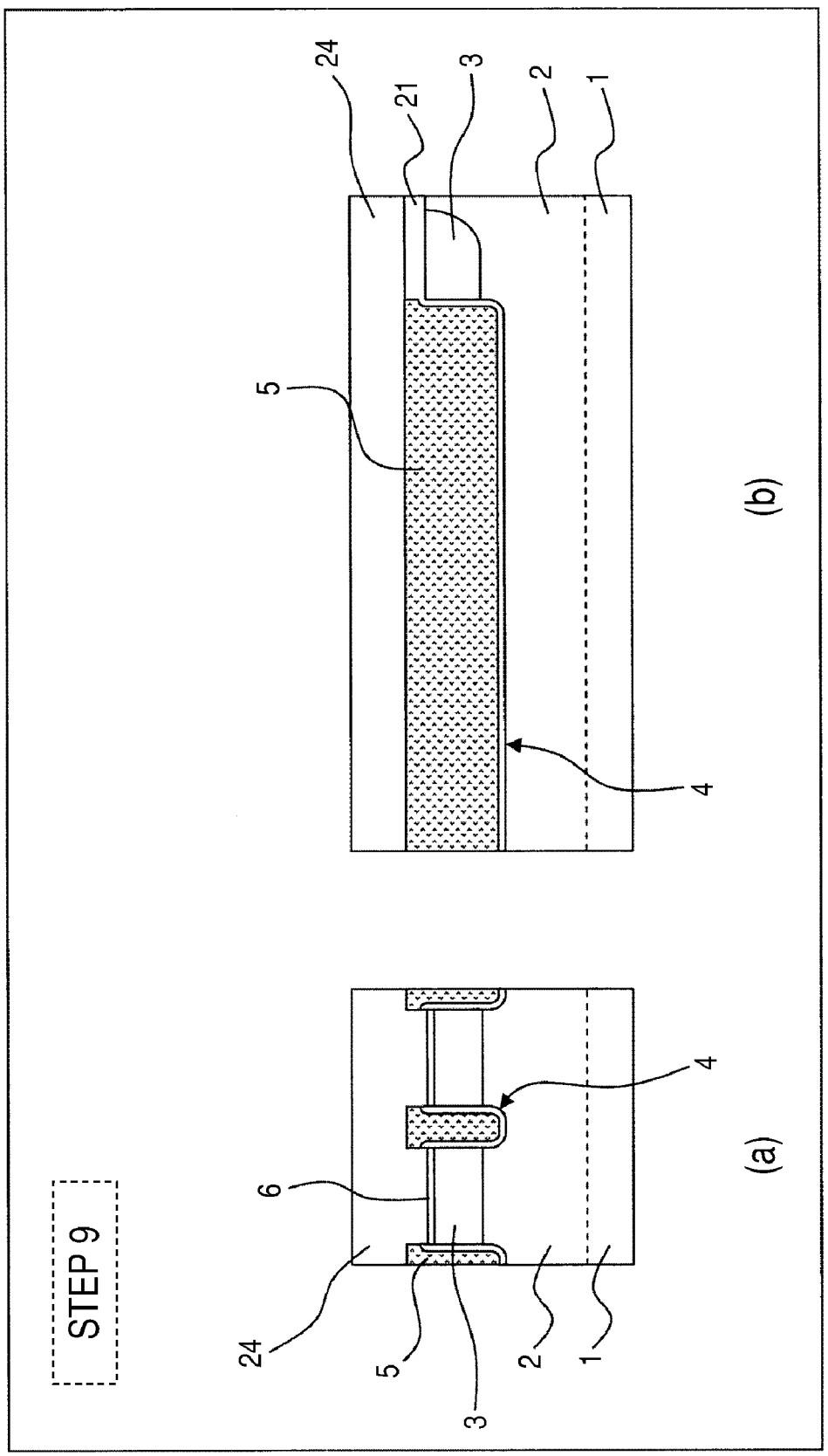
FIGS. 12A and 12B are flow diagrams showing a section of the device in a manufacturing process (in step S9: PSG-CVD step) corresponding to the manufacturing method for the semiconductor device having the power MISFET in the first embodiment of the invention of the present application.
Figure 13:
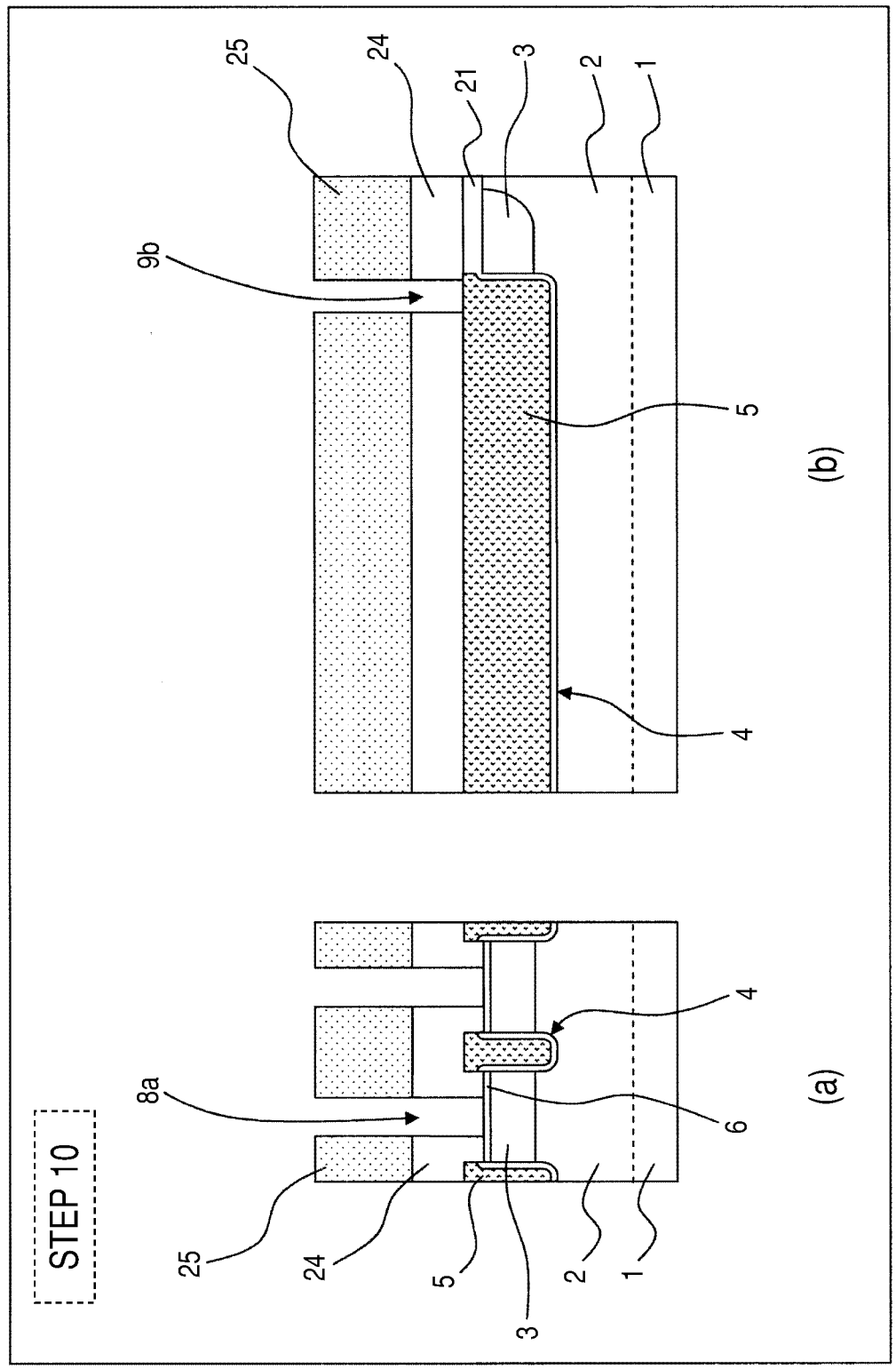
FIGS. 13A and 13B are flow diagrams showing a section of the device in a manufacturing process (in step S10: an opening formation step for a source contact trench) corresponding to the manufacturing method for the semiconductor device having the power MISFET in the first embodiment of the invention of the present application.
Figure 14:
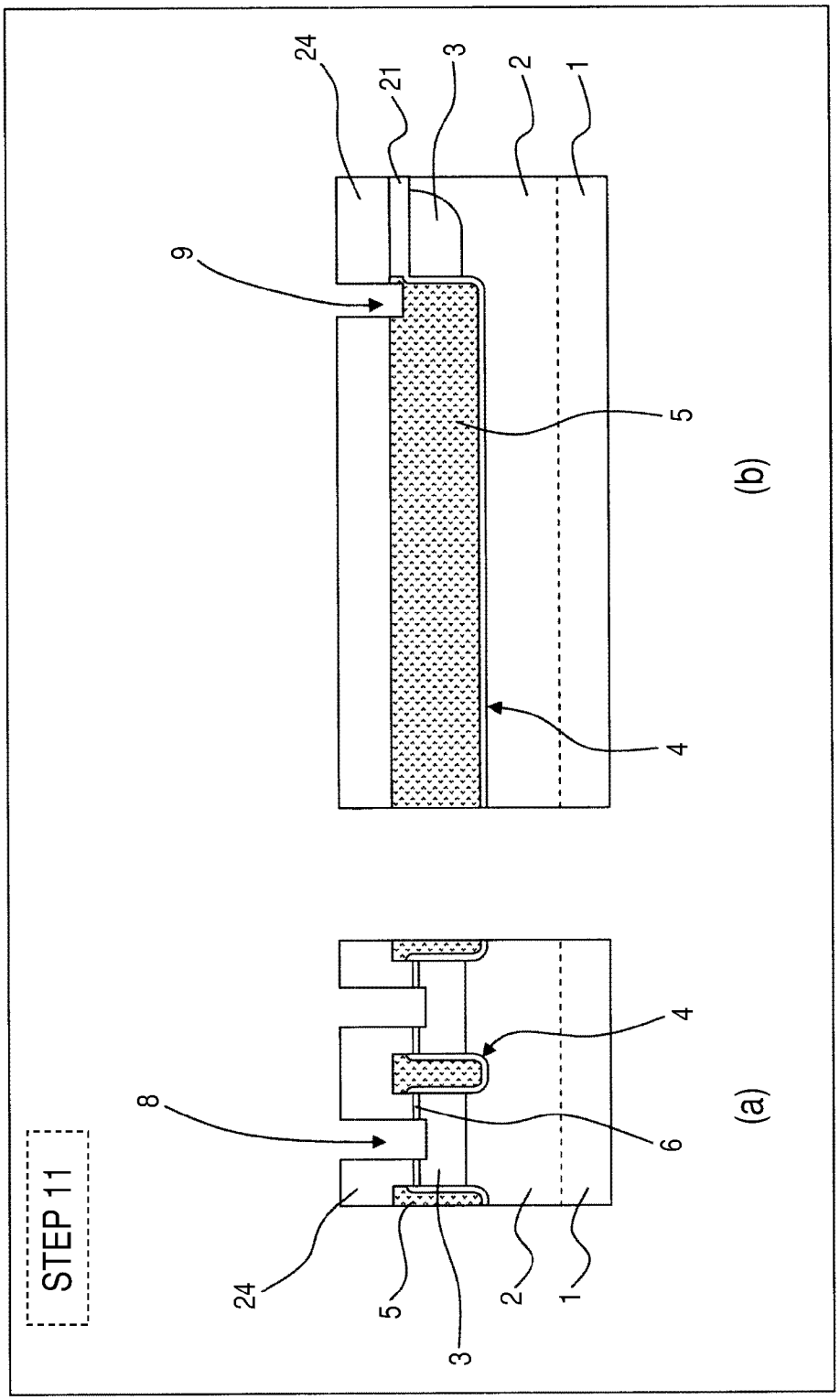
FIGS. 14A and 14B are flow diagrams showing a section of the device in a manufacturing process (in step S11: source contact trench formation step) corresponding to the manufacturing method for the semiconductor device having the power MISFET in the first embodiment of the invention of the present application.
Figure 15:
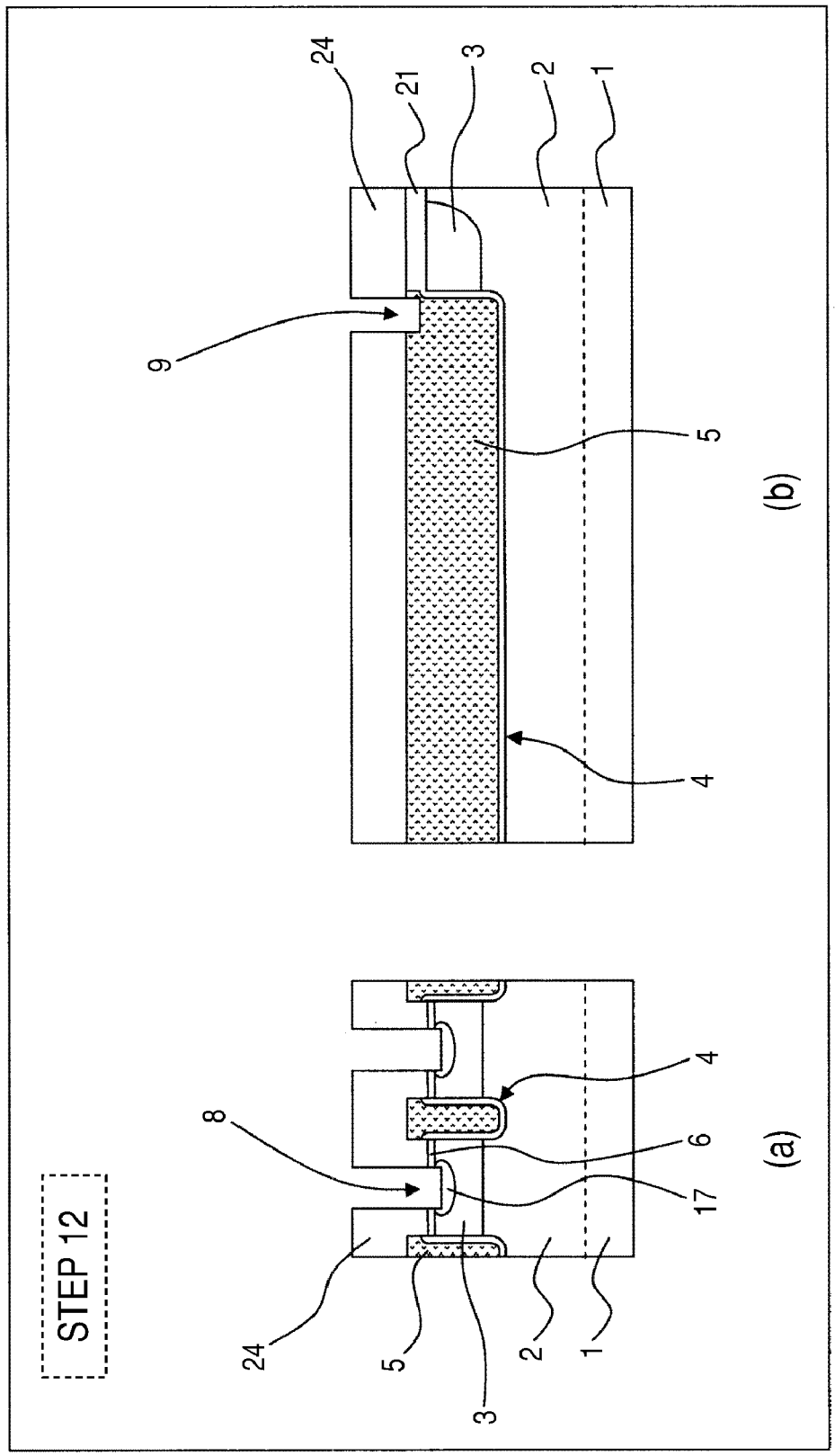
FIGS. 15A and 15B are flow diagrams showing a section of the device in a manufacturing process (in step S12: p+ type body contact region ion implantation step) corresponding to the manufacturing method for the semiconductor device having the power MISFET in the first embodiment of the invention of the present application.
Figure 16:
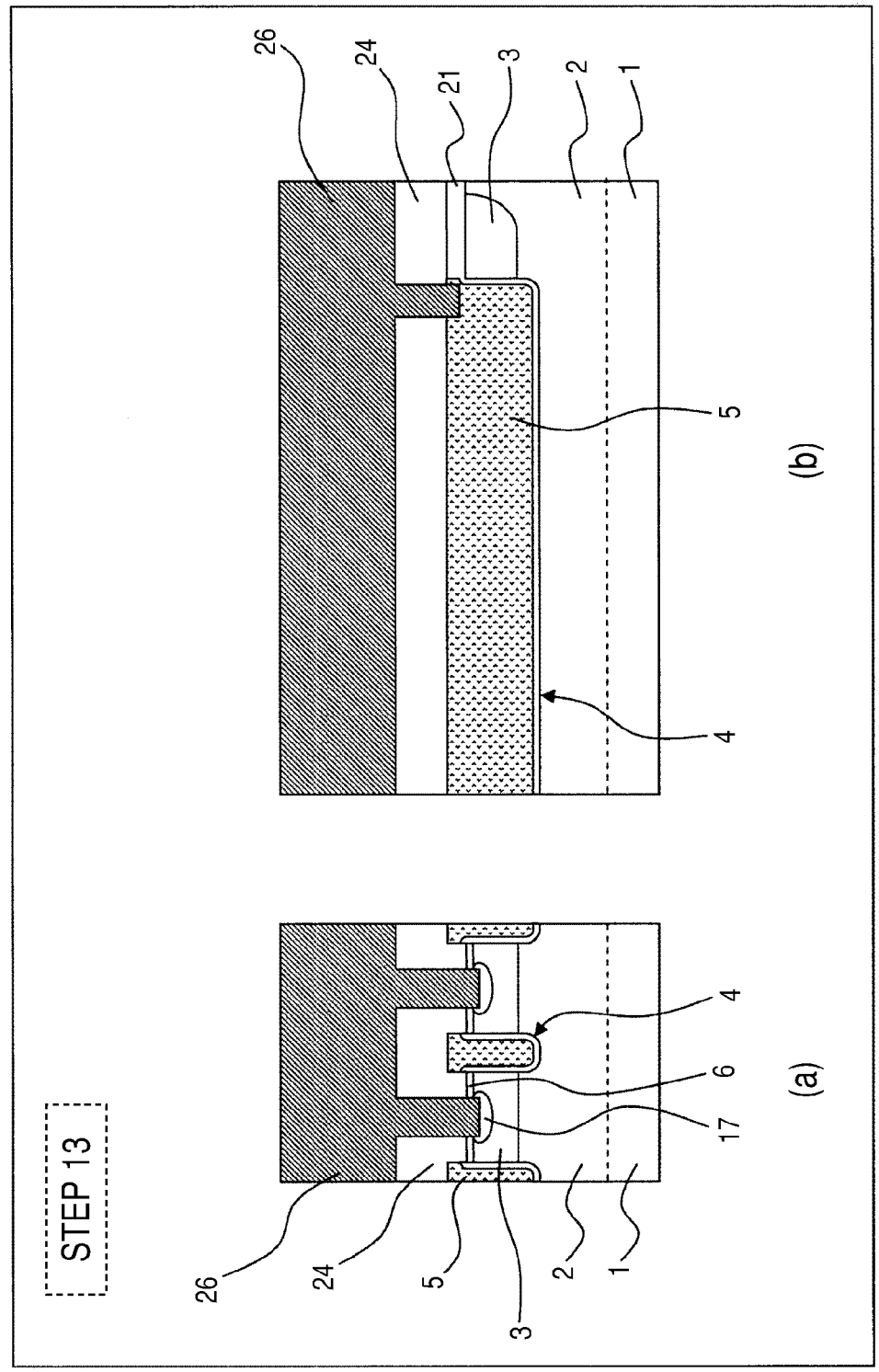
FIGS. 16A and 16B are flow diagrams showing a section of the device in a manufacturing process (in step S13: aluminum-based metal layer formation step) corresponding to the manufacturing method for the semiconductor device having the power MISFET in the first embodiment of the invention of the present application.
Figure 17:
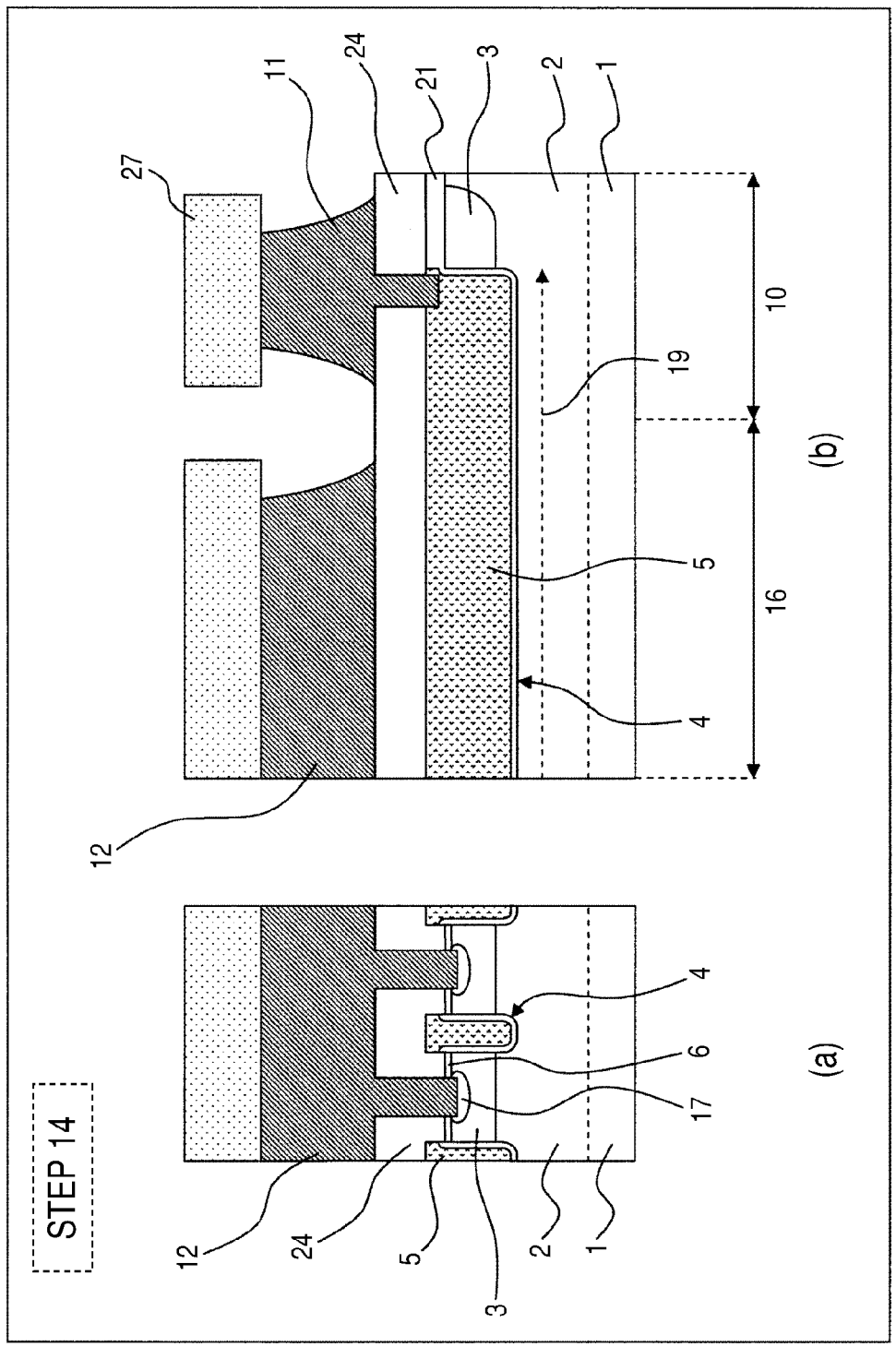
FIGS. 17A and 17B are flow diagrams showing a section of the device in a manufacturing process (in step S14: aluminum-based metal layer etching step) corresponding to the manufacturing method for the semiconductor device having the power MISFET in the first embodiment of the invention of the present application.
Figure 18:
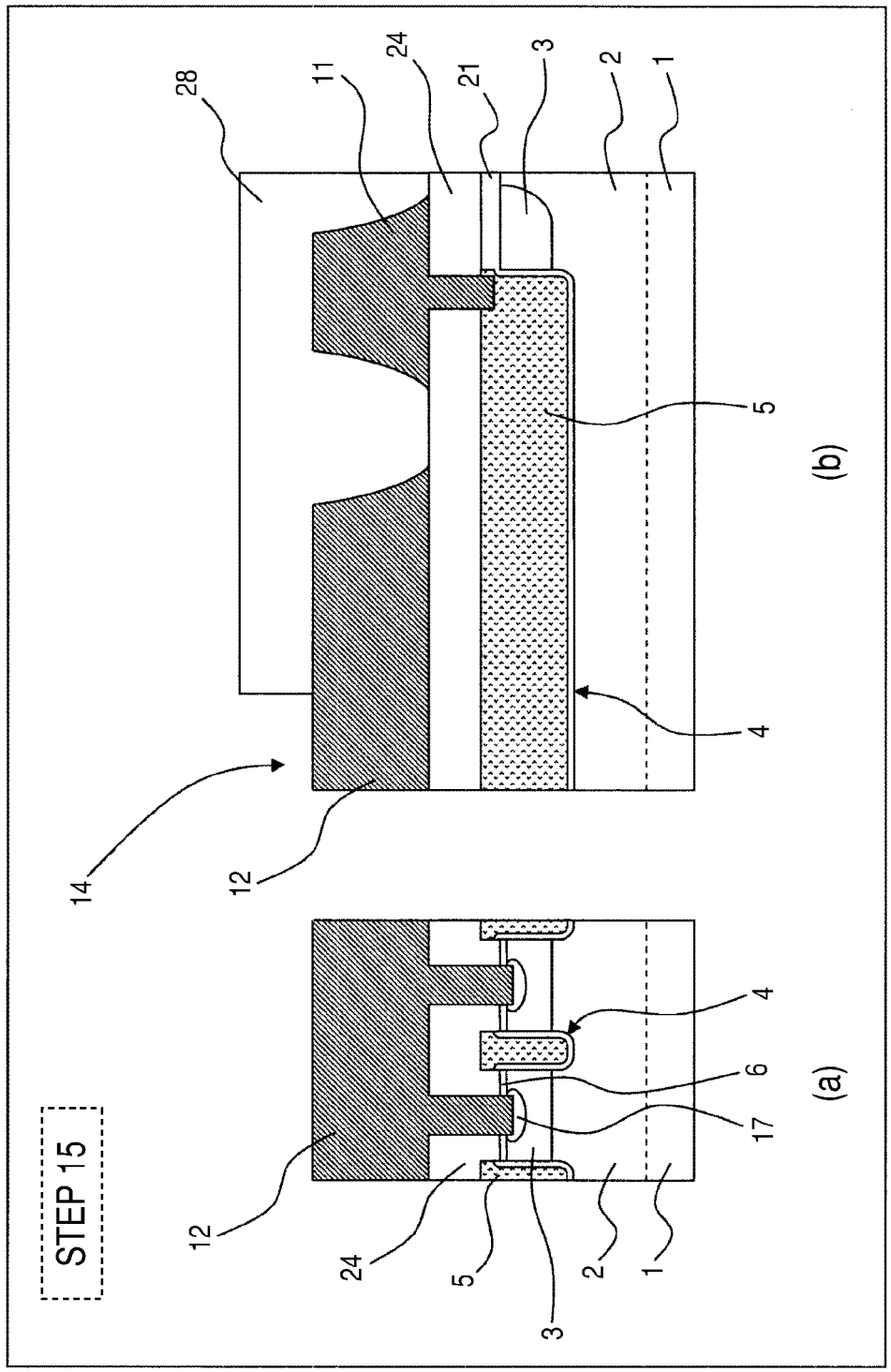
FIGS. 18A and 18B are flow diagrams showing a section of the device in a manufacturing process (in step S15: protective film formation and pad patterning step) corresponding to the manufacturing method for the semiconductor device having the power MISFET in the first embodiment of the invention of the present application.

First, for example, an n+ type single crystal silicon wafer 1 (20) of 200φ having an n-type epitaxial silicon layer 2 is prepared. It is apparent that the diameter of the wafer may be 300φ or 450φ, or any other value. As shown in FIG. 4, the n-type epitaxial silicon layer 2 has a surface subjected to thermal oxidation to form a thermal silicon oxide film 21 (field insulating film) thereon. Then, as shown in FIG. 5, a resist pattern 22 for forming of the trench is formed by normal lithography. An oxide film 21 serving as a primary coating is patterned using the resist pattern 22. After removing the unnecessary resist pattern 22, as shown in FIG. 6, anisotropic dry etching is performed using a silicon oxide film pattern 21 as a mask (using gas containing a halogen-based etching gas, for example, a combined gas containing $Cl_2$, HBr, Ar, $O_2$, or the like) to form trenches 23. Then, as shown in FIG. 7, the inner surface of each trench 23 is subjected to thermal oxidation to form a gate oxide film 4. Subsequently, as shown in FIG. 8, an n-type doped polysilicon film 5 is formed by a CVD method over the device surface 20a of the wafer 20, that is, in the trench 23 and over the field insulating film 21. Then, as shown in FIG. 9, the polysilicon film 5 is etched back to remove the polysilicon film 5 outside the trench 23. Then, as shown in FIG. 10, ion implantation is performed to introduce p-type impurities, while covering the outside portion of the p-type channel region 3m (see FIG. 3) with a resist film, thereby to form a p-type channel impurity-doped layer 3. As shown in FIG. 11, in the normal lithography, the field oxide film 21 of the active region 16 is removed by etching of the silicon oxide film, while covering the field oxide film 21 not located in the active region 16 with a resist film. Subsequently, ion implantation (using, for example, arsenic ions, whereas silicon ions may be used, note that the other following ion implantation being performed in the same way) is performed, while covering the outside portion of the region (see FIG. 3) to serve as an n+ source region 6m with a resist film thereby to form a source impurity-doped region 6 on the surface of the epitaxial layer 2 (the device surface 20a of the wafer 20). Then, as shown in FIG. 12, the interlayer insulating film 24 (for example, the PSG film) of, for example, about 700 nm in thickness is formed by a CVD method over the entire device surface 20a of the wafer 20. Next, as shown in FIG. 13, a resist pattern 25 is formed on the interlayer insulating film 24 by the normal lithography, and anisotropic dry etching (by use of gas containing a fluorocarbon-based etching gas, for example, a combined gas containing Ar, $C_4F_8$, $C_4F_6$, $O_2$ or the like) is performed using the formed pattern as a mask, whereby the source contact hole 8a and the gate contact hole 9b are opened substantially at the same time (in the same etching step). At this time, the upper surface of the trench gate 5 has substantially the same height over the entire regions, which is advantageous in lithography of a fine pattern, that is, improvement of patterning of the resist pattern and of an etching accuracy of the primary coating formed later. Then, as shown in FIG. 14, the source contact trench 8 and the gate contact trench 9 are formed by etching the silicon substrate as the underlayer and the polysilicon member are etched (by anisotropic dry etching using a combined gas, for example, containing $Cl_2$, HBr, Ar, $O_2$, or the like) so as to separate the source regions 6 on both sides. Then, as shown in FIG. 15, p-type impurities (for example, B+) are ion-implanted via the source contact trench 8 thereby to form a p+ type body contact region 17. Then, as shown in FIG. 16, an aluminum-based electrode layer 26 is formed over the device surface 20a of the wafer 20 by sputtering or the like. Thereafter, a resist pattern 27 is formed on the aluminum-based electrode layer 26, and wet etching (in which an etching liquid in use is, for example, a mixed acid of acetic acid, nitric acid, water, and phosphoric acid) (the wet etching being substituted by dry etching, or a combination of wet etching and dry etching) is performed using the formed resist pattern as a mask, whereby patterning is performed so as to separate the source electrode 12, the gate electrode 11, and the guard ring 35 (see FIG. 65). The unnecessary resist film 27 is removed. Then, as shown in FIG. 18, the final passivation film 28 made of a polyimide film or the like of about 2 μm in thickness is formed by a coating process. Subsequently, the source pad 14 and the gate pad (see FIG. 3) are opened in the final passivation film 28 by the normal lithography.

3. Explanation of Semiconductor Device Having Power MISFET in Second Embodiment (of Side Wall Type) of the Invention of Present Application (See Mainly FIGS. 19 to 26)

Figure 19:
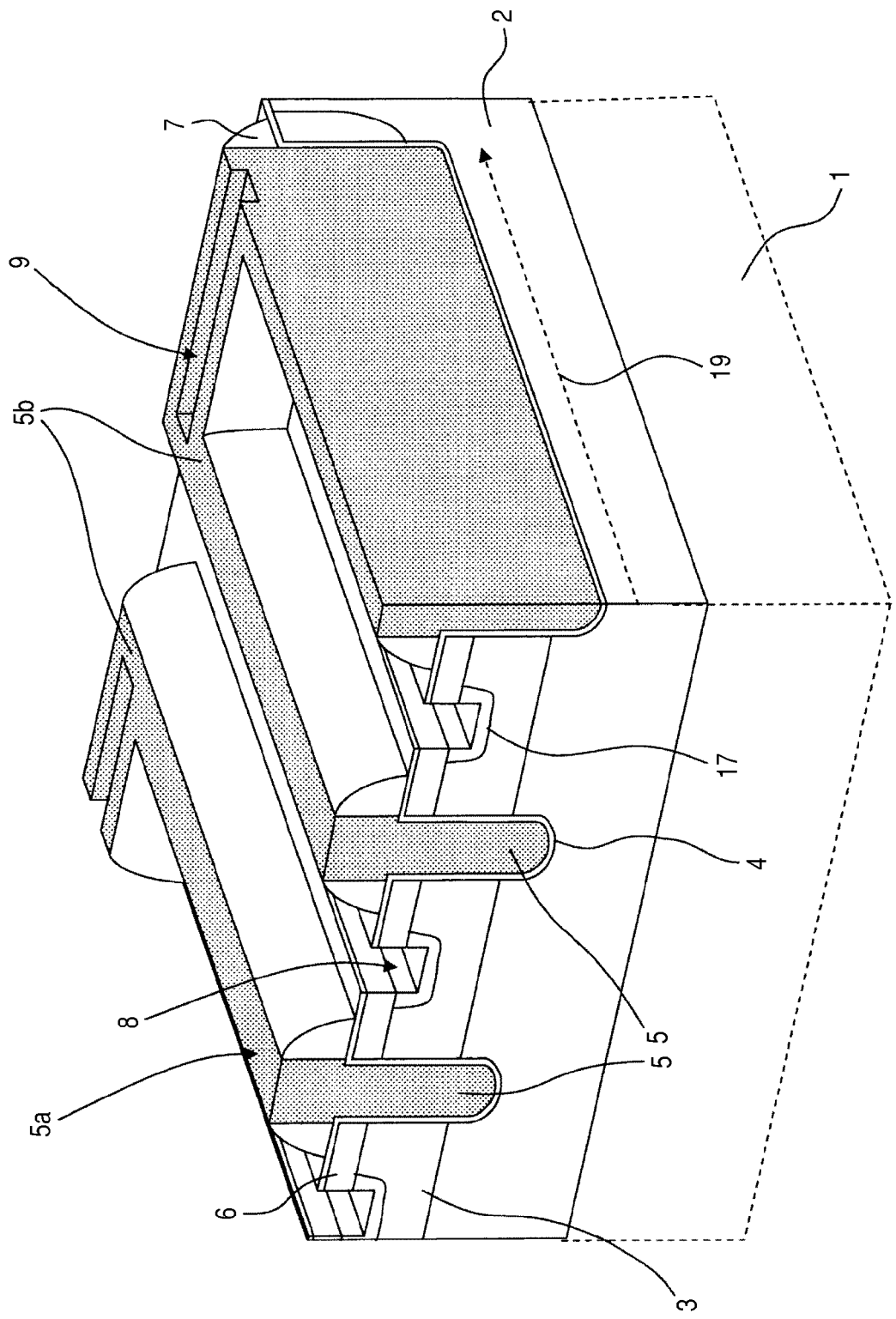
FIG. 19 is a perspective view showing a section of a main portion of a semiconductor device having a power MISFET according to a second embodiment (of a side wall type) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3, respectively)

FIG. 19 is a perspective view showing a section of a main portion of a semiconductor device having a power MISFET according to a second embodiment (of a side wall type) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3, respectively). FIGS. 20A and 20B are flow diagrams showing a section of the device in a manufacturing process (in step S7: channel region impurity ion implantation step) corresponding to the manufacturing method for the semiconductor device having the power MISFET according to the second embodiment of the invention of the present application (in which FIG. 20B substantially corresponds to the section taken along the line A-A' of FIG. 3, and FIG. 20A substantially corresponds to the section taken along the line B-B' of FIG. 3, note that the same goes for the description below). FIGS. 21A and 21B are flow diagrams showing a section of the device in a manufacturing process (in step S8: source region impurity introduction step) corresponding to the manufacturing method for the semiconductor device having the power MISFET according to the second embodiment of the invention of the present application. FIGS. 22A and 22B are flow diagrams showing a section of the device in a manufacturing process (in step S8-1: side wall insulating film CVD step) corresponding to the manufacturing method for the semiconductor device having the power MISFET in the second embodiment of the invention of the present application. FIGS. 23A and 23B are flow diagrams showing a section of the device in a manufacturing process (in step S8-2: side wall formation step) corresponding to the manufacturing method for the semiconductor device having the power MISFET in the second embodiment of the invention of the present application. FIGS. 24A and 24B are flow diagrams showing a section of the device in a manufacturing process (in step S9: PSG-CVD step) corresponding to the manufacturing method for the semiconductor device having the power MISFET in the second embodiment of the invention of the present application. FIGS. 25A and 25B are flow diagrams showing a section of the device in a manufacturing process (in step S10: opening formation step for a source contact trench) corresponding to the manufacturing method for the semiconductor device having the power MISFET in the second embodiment of the invention of the present application. FIGS. 26A and 26B are flow diagrams showing a section of the device in a manufacturing process (in step S11: source contact trench formation step) corresponding to the manufacturing method for the semiconductor device having the power MISFET in the second embodiment of the invention of the present application. Referring to the accompanying drawings, the semiconductor device having the power MISFET according to the second embodiment (of a side wall type) of the invention of the present application will be described below.

First, referring to FIG. 19, the semiconductor device structure having the power MISFET according to the second embodiment (of the side wall type) of the invention of the present application will be described below. The basic portions of the structure in this embodiment are basically the same as those described in section 2. Now, different points from the first embodiment will be mainly described. The same goes for the following sections. As shown in FIG. 19, the difference from the embodiment shown in FIGS. 1 and 2 is that side wall insulating films 7 are provided on both sides of the trench gate 5 instead of the field insulating film 21. Thus, this embodiment has an advantage that short-circuiting or the like with the substrate can be avoided due to a displacement in position in forming the gate contact hole 9b or the like.

Figure 20:
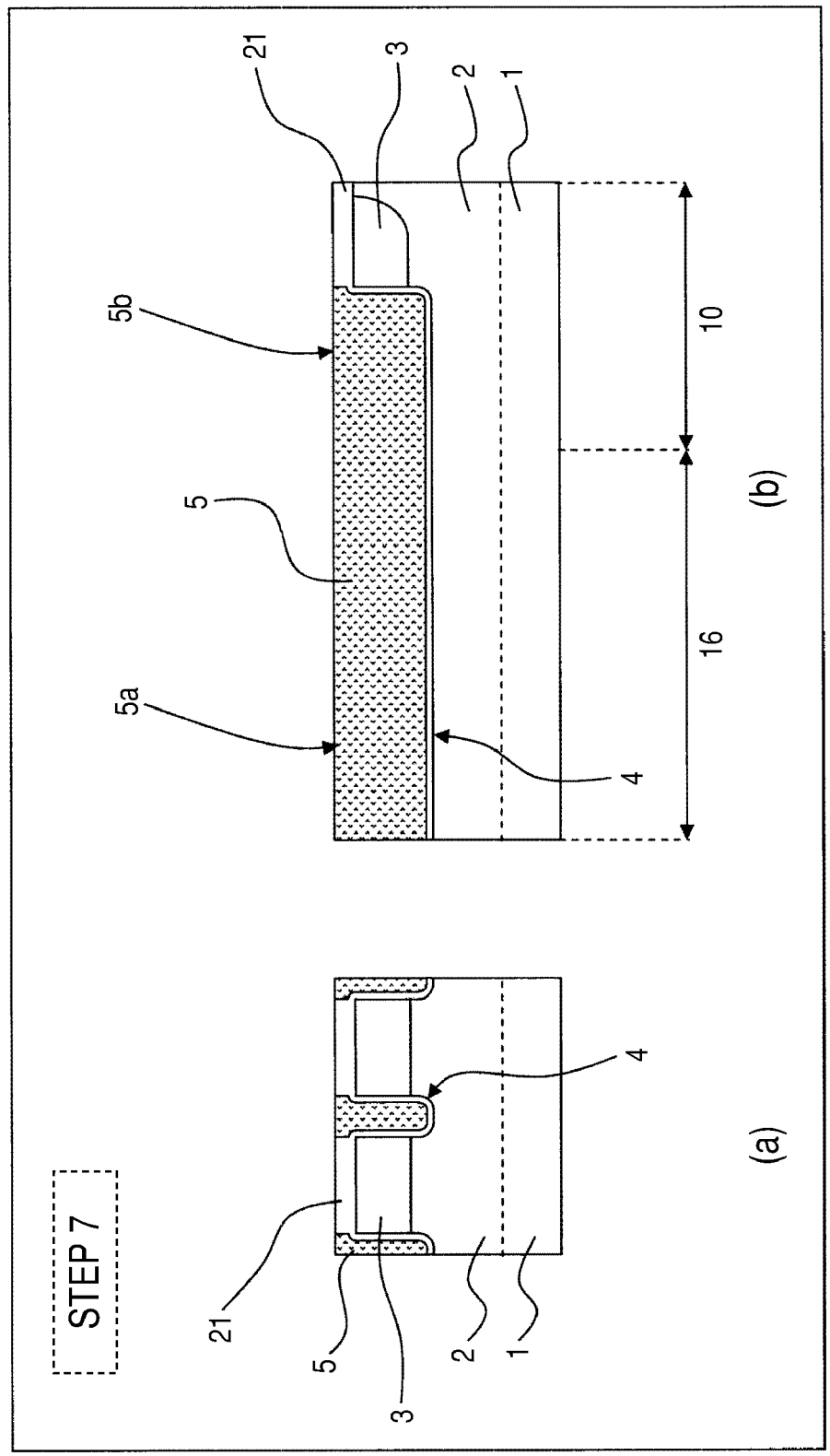
FIGS. 20A and 20B are flow diagrams showing a section of the device in a manufacturing process (in step S7: channel region impurity ion implantation step) corresponding to the manufacturing method for the semiconductor device having the power MISFET in the second embodiment of the invention of the present application (in which FIG. 20B substantially corresponds to a section taken along the line A-A' of FIG. 3, and FIG. 20A corresponds to a section taken along the line B-B' of FIG. 3, note that the same goes for the description below)
Figure 21:
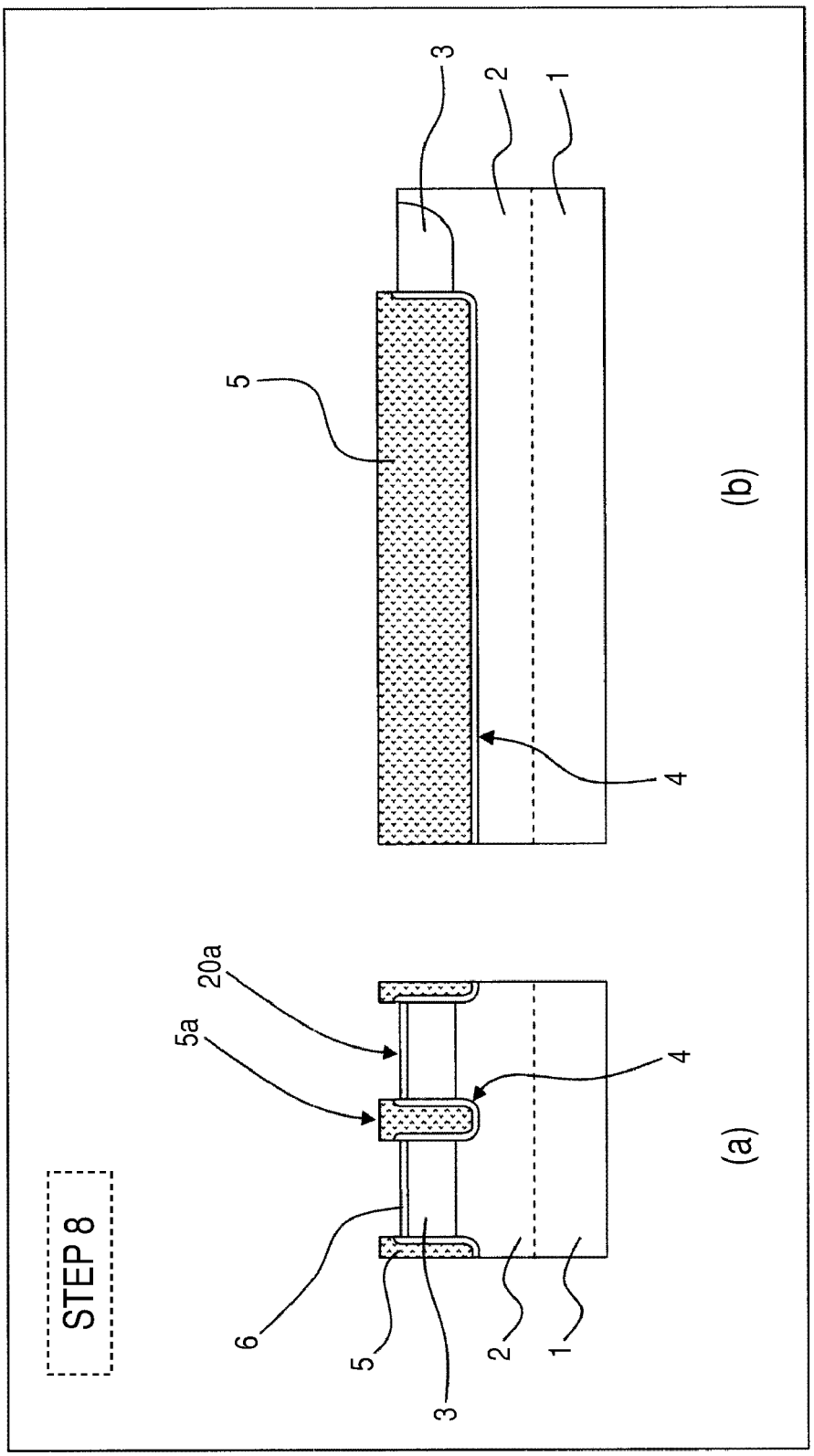
FIGS. 21A and 21B are flow diagrams showing a section of the device in a manufacturing process (in step S8: source region impurity introduction step) corresponding to the manufacturing method for the semiconductor device having the power MISFET in the second embodiment of the invention of the present application.
Figure 22:
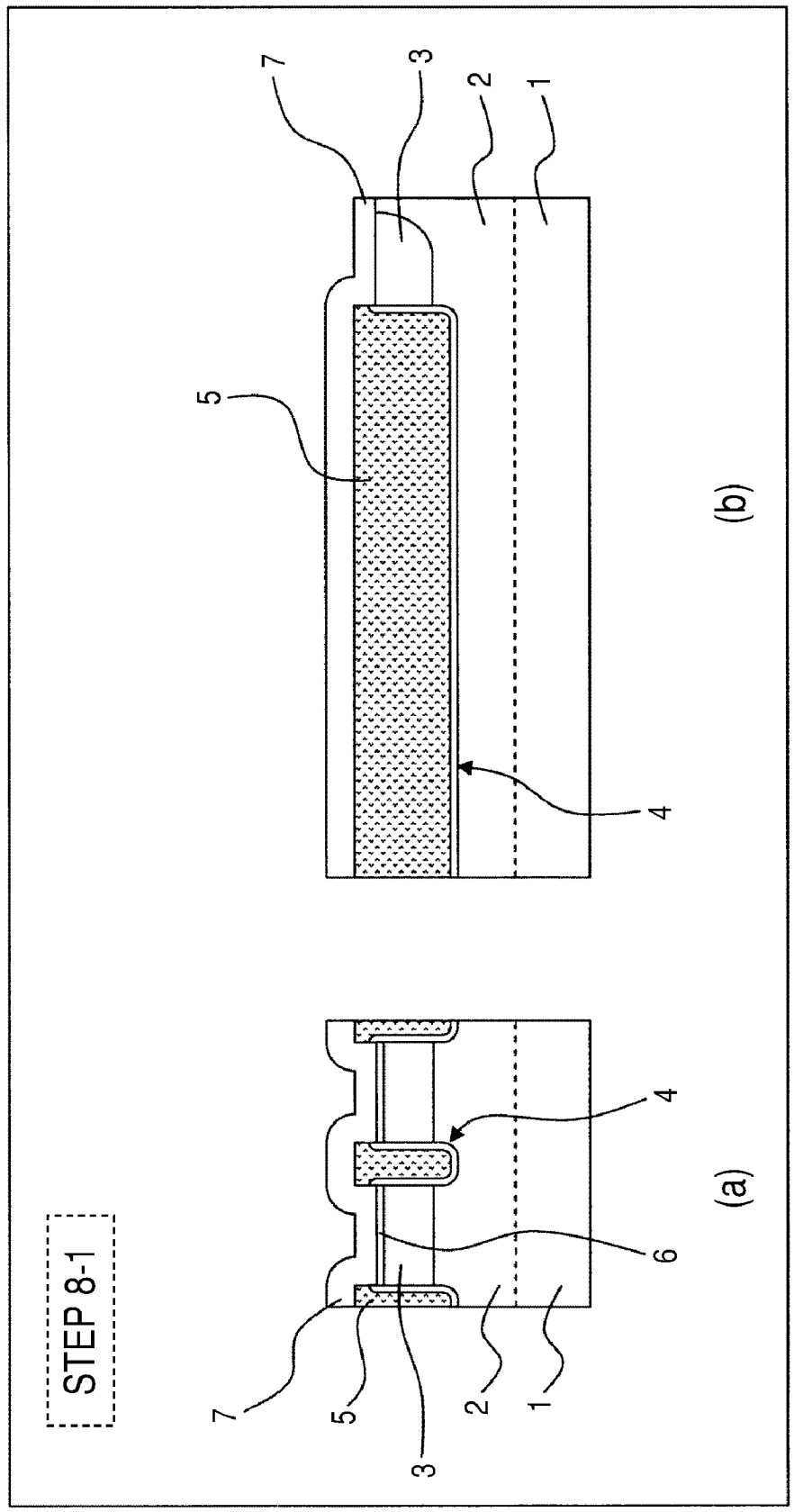
FIGS. 22A and 22B are flow diagrams showing a section of the device in a manufacturing process (in step S8-1: side wall insulating film CVD step) corresponding to the manufacturing method for the semiconductor device having the power MISFET in the second embodiment of the invention of the present application.
Figure 23:
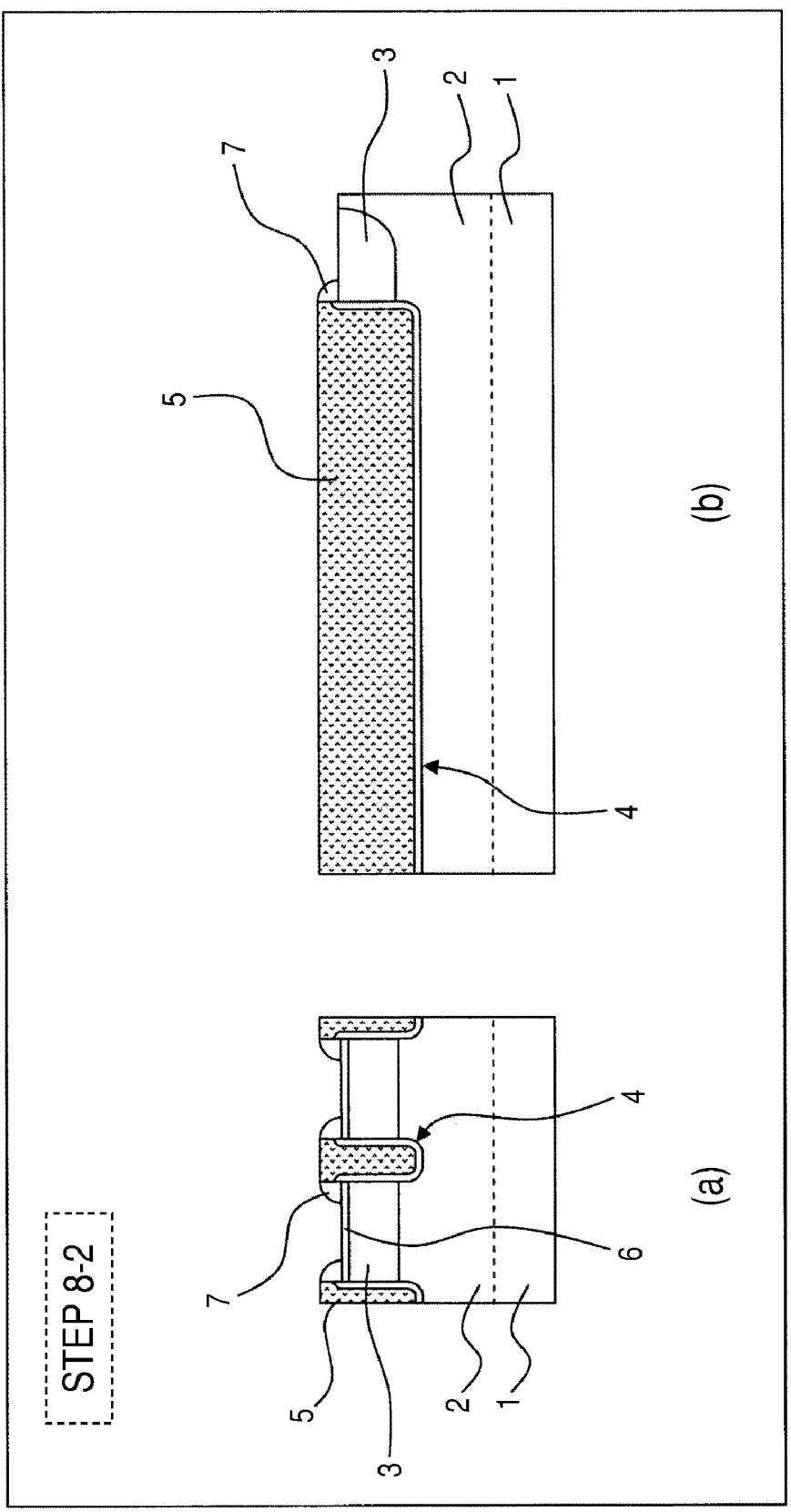
FIGS. 23A and 23B are flow diagrams showing a section of the device in a manufacturing process (in step S8-2: side wall formation step) corresponding to the manufacturing method for the semiconductor device having the power MISFET in the second embodiment of the invention of the present application.
Figure 24:
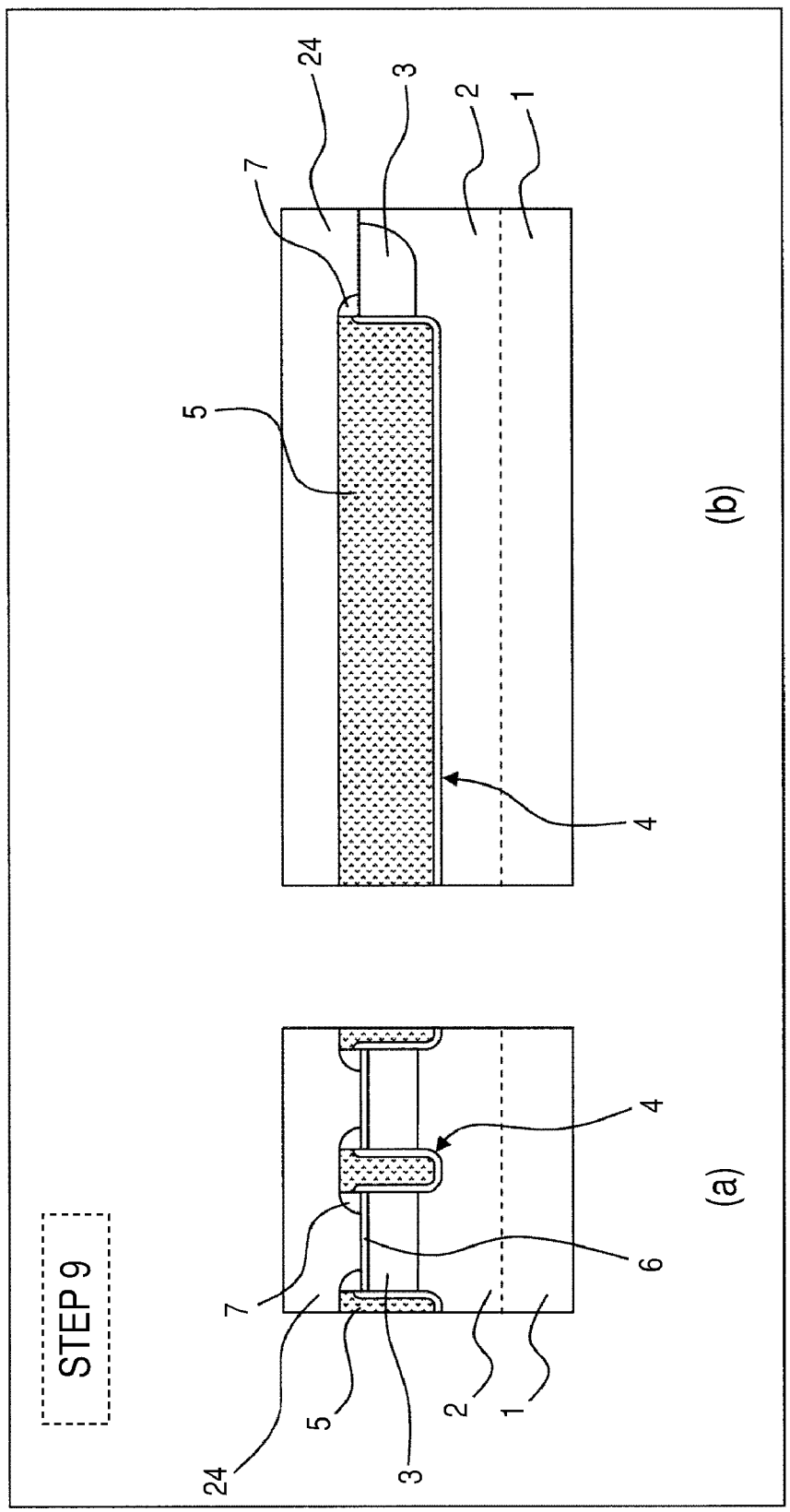
FIGS. 24A and 24B are flow diagrams showing a section of the device in a manufacturing process (in step S9: PSG-CVD step) corresponding to the manufacturing method for the semiconductor device having the power MISFET in the second embodiment of the invention of the present application.
Figure 25:
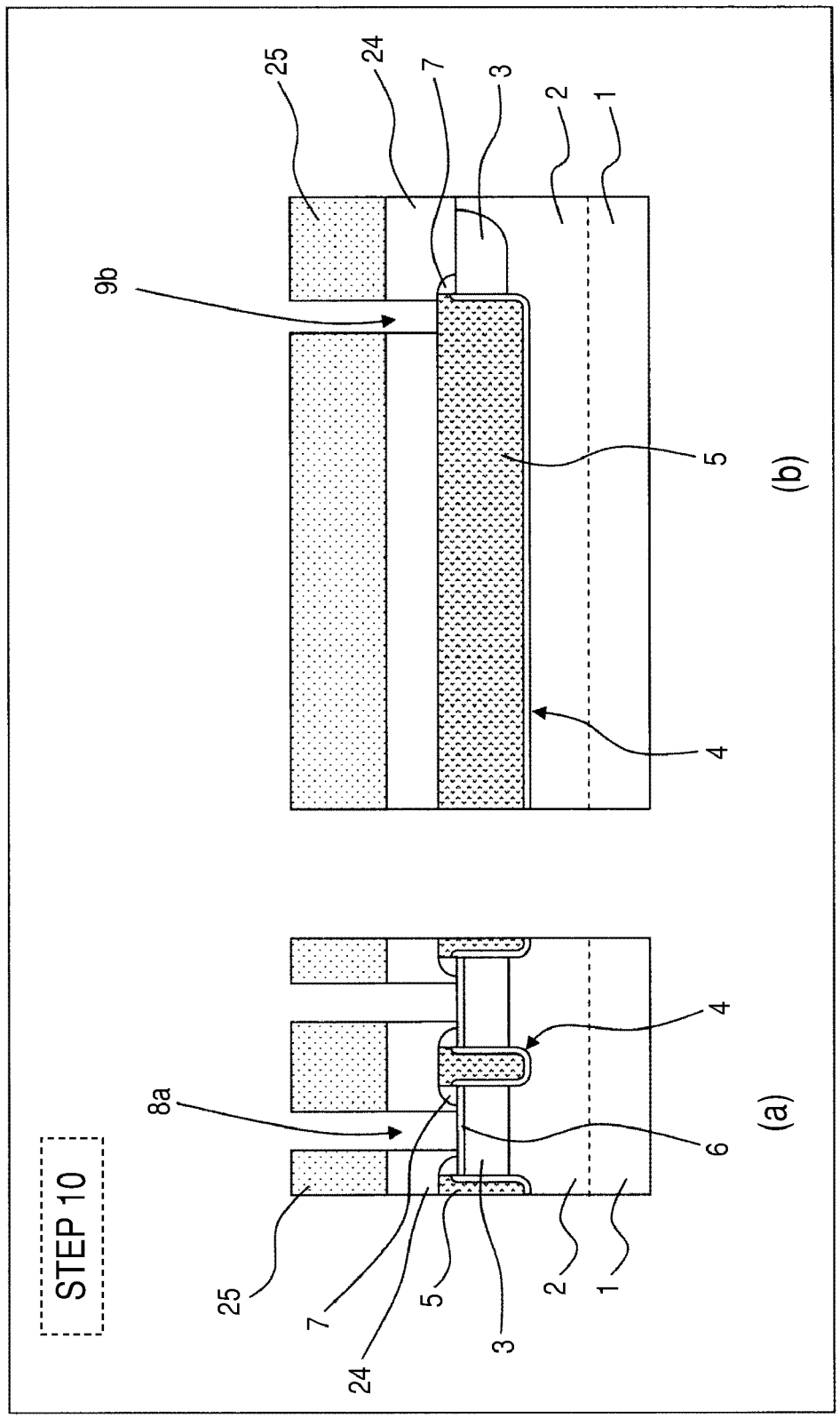
FIGS. 25A and 25B are flow diagrams showing a section of the device in a manufacturing process (in step S10: opening formation step for a source contact trench) corresponding to the manufacturing method for the semiconductor device having the power MISFET in the second embodiment of the invention of the present application.
Figure 26:
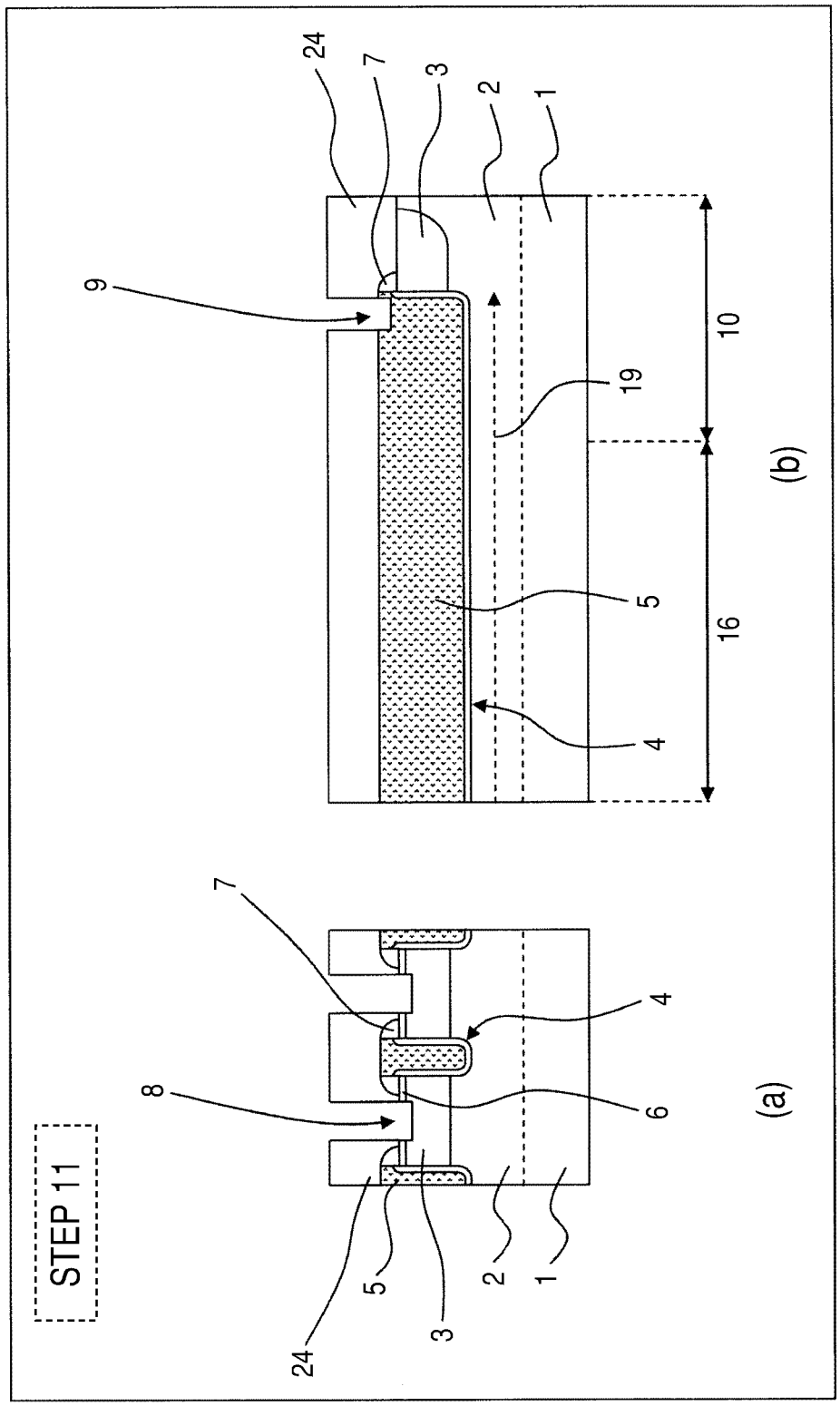
FIGS. 26A and 26B are flow diagrams showing a section of the device in a manufacturing process (in step S11: source contact trench formation step) corresponding to the manufacturing method for the semiconductor device having the power MISFET in the second embodiment of the invention of the present application.

Next, the manufacturing method will be described below based on FIGS. 20 to 26 according to the section 2. Matter not described in this section is basically the same as that described in Section 2. That is, different portions will be described and a repeated description will be avoided as far as possible. The same goes for the following sections. First, as shown in FIG. 20 (corresponding to FIG. 10 of the section 2), ion implantation is performed to introduce p-type impurities while covering an outside portion of the p-type channel region 3m (see FIG. 3) with a resist film, thereby to form a p-type channel impurity-doped layer 3. Then, as shown in FIG. 21, the entire field oxide film 21 over the upper surface 20a of the semiconductor substrate 20 will be removed. Subsequently, ion implantation (using, for example, arsenic ions) is performed while covering an outside portion of a region to serve as the n+ source region 6m (see FIG. 3) with a resist film, so that a source impurity-doped region 6 is formed over the surface of the epitaxial layer 2 (on the device surface 20a of the wafer 20). Then, as shown in FIG. 22, a silicon oxide film 7 to serve as the side wall insulating film 7 is formed by CVD method over the entire device surface 20a of the wafer 20. Material for the side wall insulating film 7 may be silicon nitride or the like in use. Subsequently, as shown in FIG. 23, parts of the silicon oxide film 7 except for both sides of the trench gate 5 are removed by anisotropic dry etching (for example, by use of gas containing a fluorocarbon-based etching gas) to form the side wall insulating film 7. Then, as shown in FIG. 24, the interlayer insulating film 24 (for example, the PSG film) is formed by the CVD method over the device surface 20a of the wafer 20. Next, as shown in FIG. 25, a resist pattern 25 is formed on the interlayer insulating film 24 by the normal lithography, and anisotropic dry etching (for example, by use of gas containing a fluorocarbon-based etching gas) is performed using the formed pattern as a mask, whereby the source contact hole 8a and the gate contact hole 9b are opened substantially at the same time (in the same etching step). At this time, the upper surface of the trench gate 5 has substantially the same height over the entire regions, which is advantageous in lithography of a fine pattern, that is, improvement of patterning of the resist pattern and of an etching accuracy of the primary coating formed later. Then, as shown in FIG. 26, the source contact trench 8 and the gate contact trench 9 are formed by etching the silicon substrate as the underlayer and the polysilicon member so as to separate the source regions 6 on both sides. This embodiment and the first embodiment slightly differ from each other in steps after the step shown in FIG. 15 and in the device structure described in section 2, but are almost the same in manufacturing procedure.

4. Explanation of Semiconductor Device Having Power MISFET in Third Embodiment (of Partial Etch Stop Coating Type) of the Invention of Present Application (See Mainly FIGS. 27 to 34)

Figure 27:
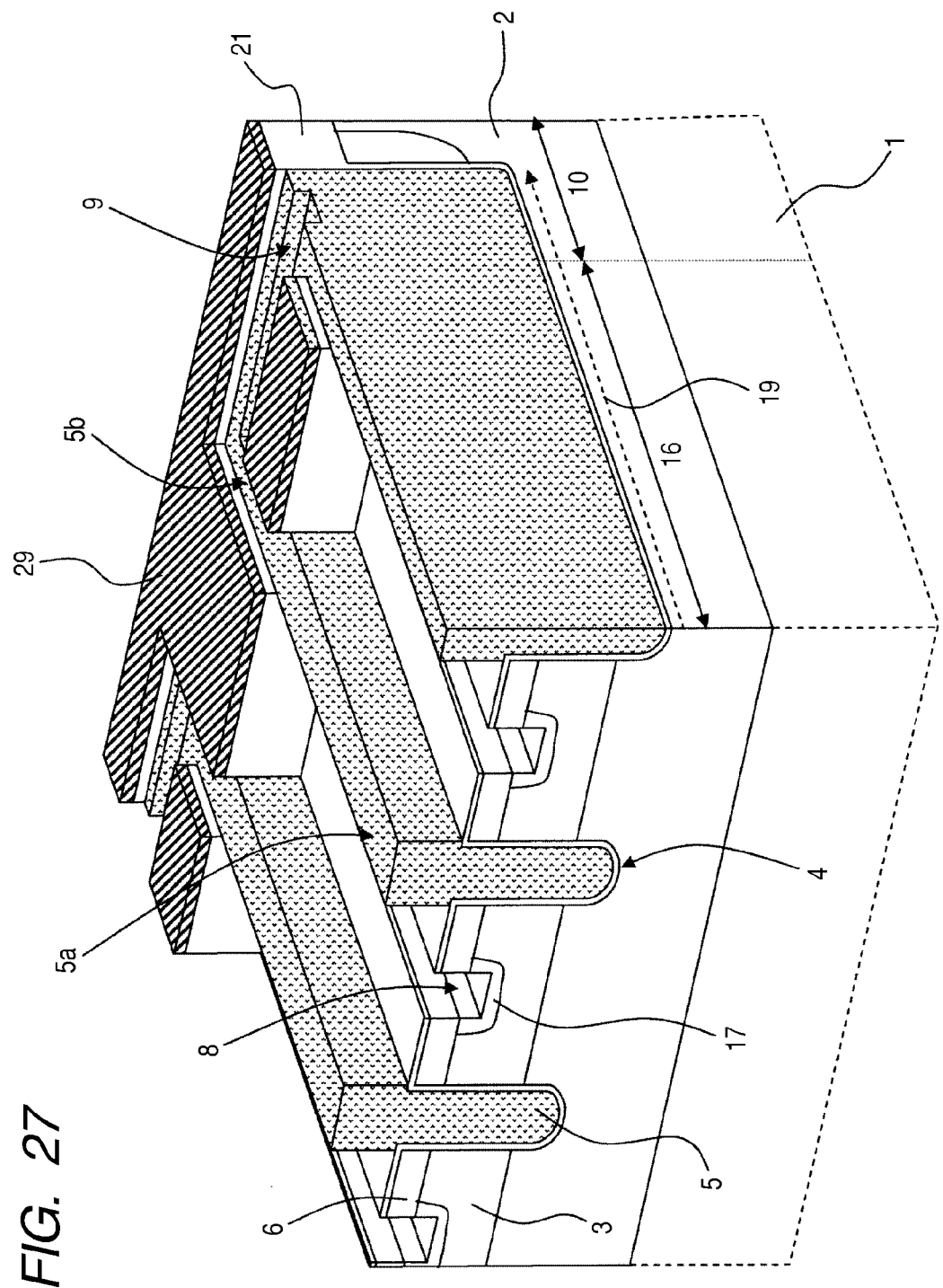
FIG. 27 is a perspective view showing a section of a main portion of a semiconductor device having a power MISFET according to a third embodiment (of a partial etch stop coating type) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3, respectively)

FIG. 27 is a perspective view including a section of a main portion of a semiconductor device having a power MISFET according to a third embodiment (of a partial etch stop coating type) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3, respectively). FIGS. 28A and 28B are flow diagrams showing a section of the device in a manufacturing process (in step S7: channel region impurity ion implantation step) corresponding to the manufacturing method for the semiconductor device having the power MISFET in the third embodiment of the invention of the present application (in which FIG. 28B substantially corresponds to the section taken along the line A-A' of FIG. 3, and FIG. 28A substantially corresponds to the section taken along the line B-B' of FIG. 3, note that the same goes for the description below). FIGS. 29A and 29B are flow diagrams showing a section of the device in a manufacturing process (in step S7-1: SiN-CVD step) corresponding to the manufacturing method for the semiconductor device having the power MISFET in the third embodiment of the invention of the present application. FIGS. 30A and 30B are flow diagrams showing a section of the device in a manufacturing process (in step S8: source region impurity introduction step) corresponding to the manufacturing method for the semiconductor device having the power MISFET in the third embodiment of the invention of the present application. FIGS. 31A and 31B are flow diagrams showing a section of the device in a manufacturing process (in step S9: PSG-CVD step) corresponding to the manufacturing method for the semiconductor device having the power MISFET in the third embodiment of the invention of the present application. FIGS. 32A and 32B are flow diagrams showing a section of the device in a manufacturing process (in step S10: opening formation step for a source contact trench) corresponding to the manufacturing method for the semiconductor device having the power MISFET in the third embodiment of the invention of the present application. FIGS. 33A and 33B are flow diagrams showing a section of the device in a manufacturing process (in step S10-1: opening bottom SiN etching step for a gate contact trench) corresponding to the manufacturing method for the semiconductor device having the power MISFET in the third embodiment of the invention of the present application. FIGS. 34A and 34B are flow diagrams showing a section of the device in a manufacturing process (in step S11: source contact trench formation step) corresponding to the manufacturing method for the semiconductor device having the power MISFET in the third embodiment of the invention of the present application. Referring to the above-mentioned drawings, the semiconductor device having the power MISFET according to the third embodiment (of the partial etch stop coating type) of the invention of the present application will be described below.

First, referring to FIG. 27, the semiconductor device structure having the power MISFET according to the third embodiment (of the partial etch stop coating type) of the invention of the present application will be described below. As shown in FIG. 27, an etching stop film 29 (for example, a CVD silicon nitride film) is formed thinly on the field oxide film 21 in the gate contact region 10, as compared to the field oxide film 21, which is the feature of this embodiment. As explained by the following manufacturing processes, the reliability and process margin of the contact etching process can be improved.

Figure 28:
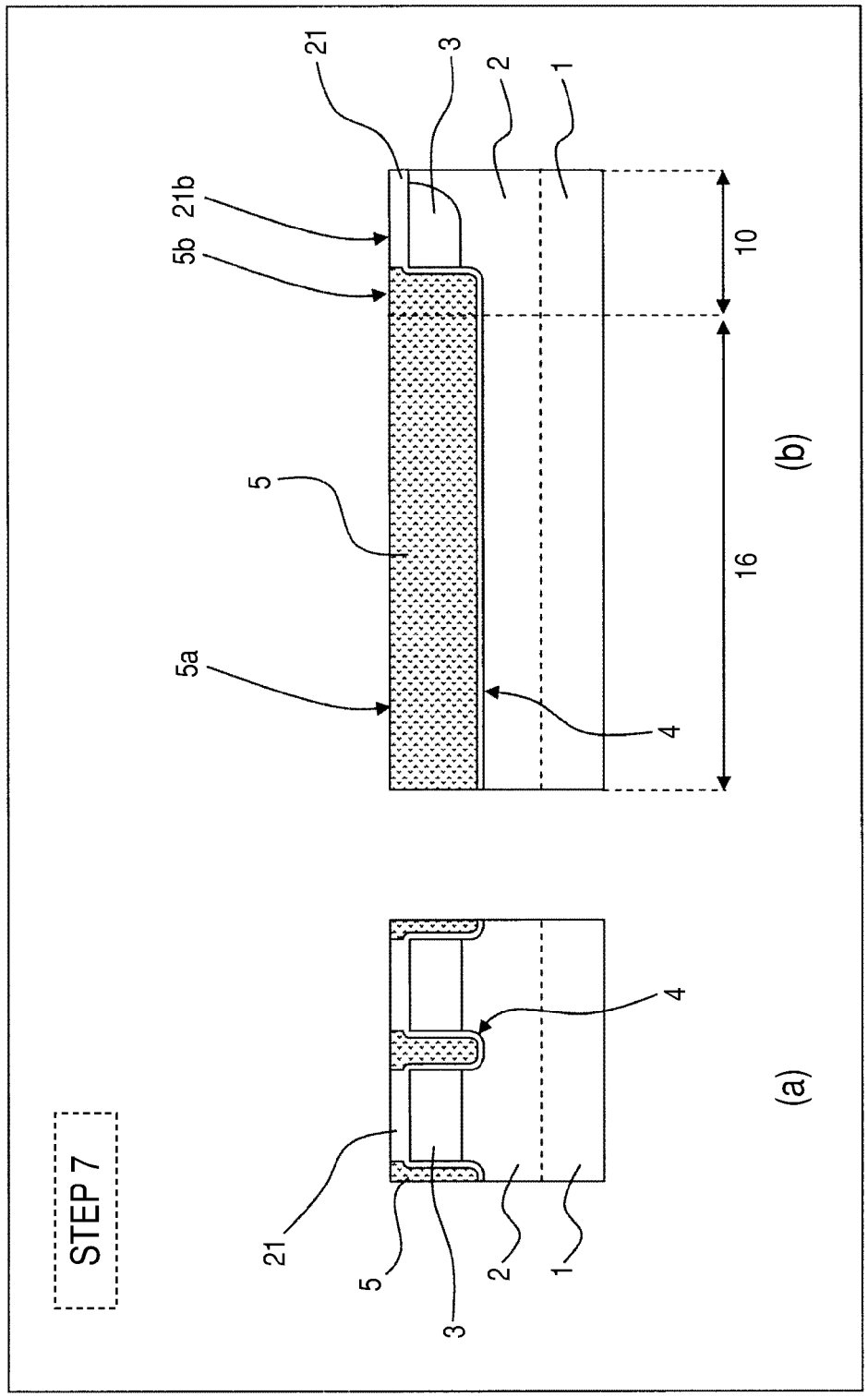
FIGS. 28A and 28B are flow diagrams showing a section of the device in a manufacturing process (in step S7: channel region impurity ion implantation step) corresponding to the manufacturing method for the semiconductor device having the power MISFET in the third embodiment of the invention of the present application (in which FIG. 28B substantially corresponds to the section taken along the line A-A' of FIG. 3, and FIG. 28A corresponds to the section taken along the line B-B' of FIG. 3, note that the same goes for the description below)
Figure 29:
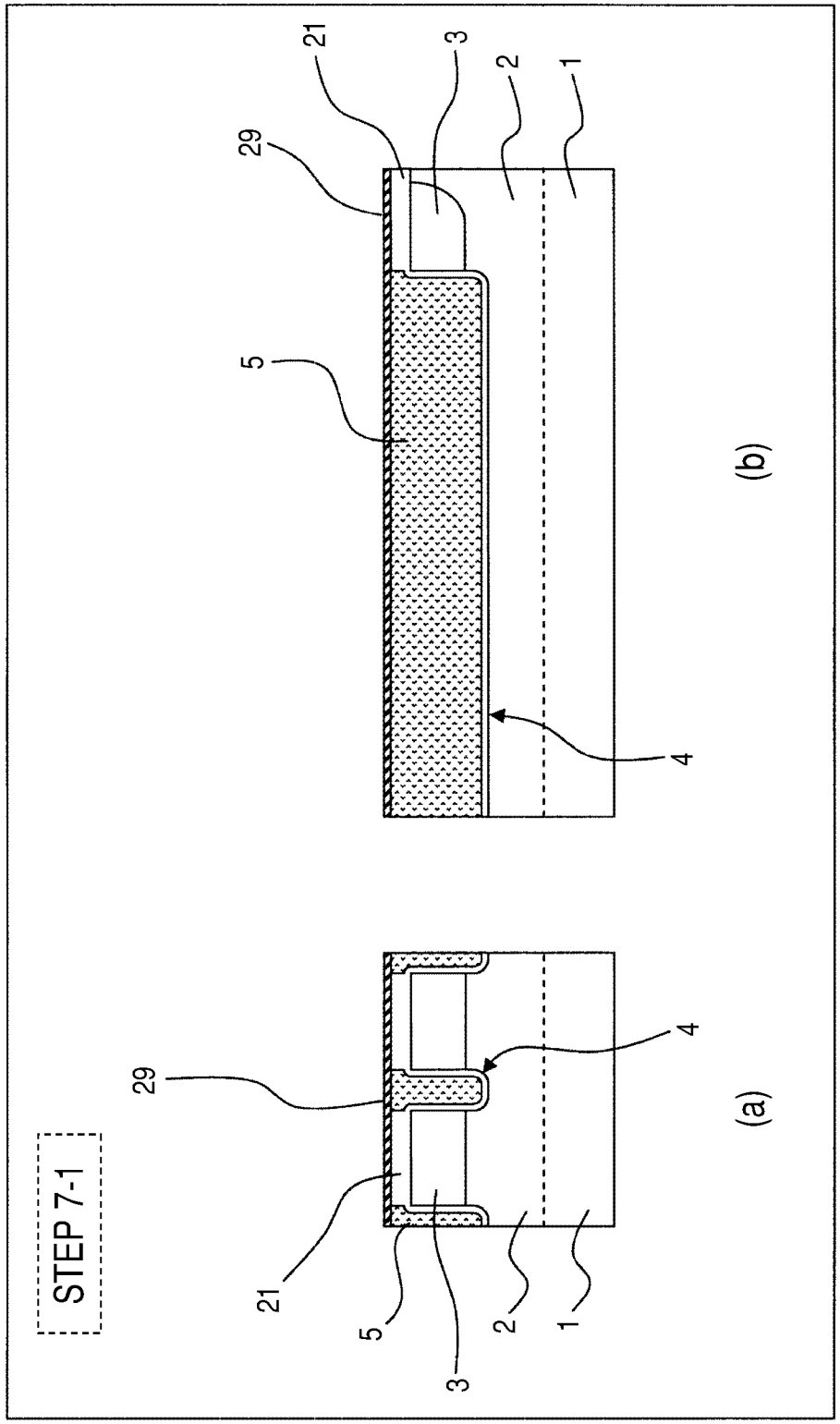
FIGS. 29A and 29B are flow diagrams showing a section of the device in a manufacturing process (in step S7-1: SiN-CVD step) corresponding to the manufacturing method for the semiconductor device having the power MISFET in the third embodiment of the invention of the present application.
Figure 30:
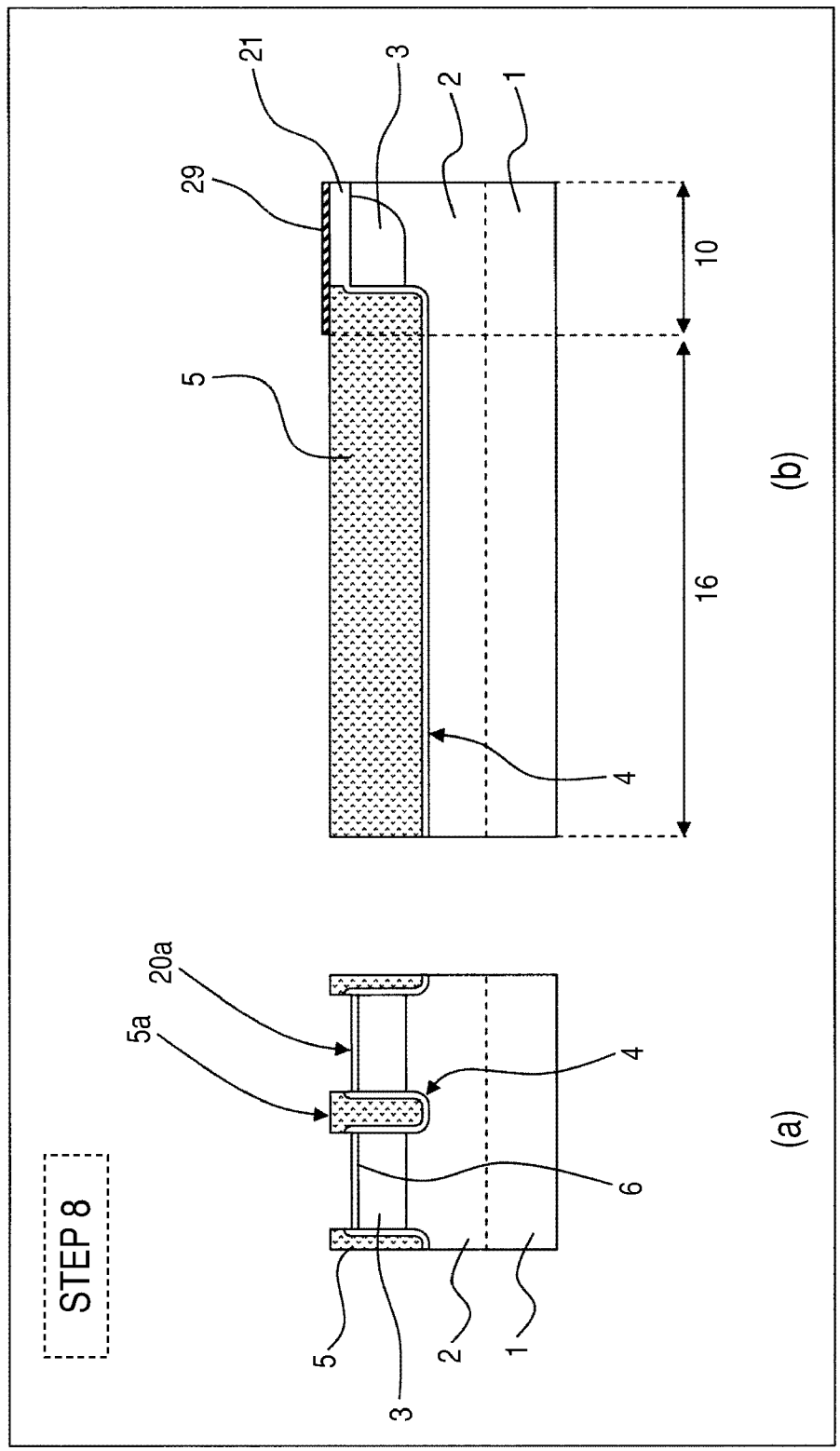
FIGS. 30A and 30B are flow diagrams showing a section of the device in a manufacturing process (in step S8: source region impurity introduction step) corresponding to the manufacturing method for the semiconductor device having the power MISFET in the third embodiment of the invention of the present application.
Figure 31:
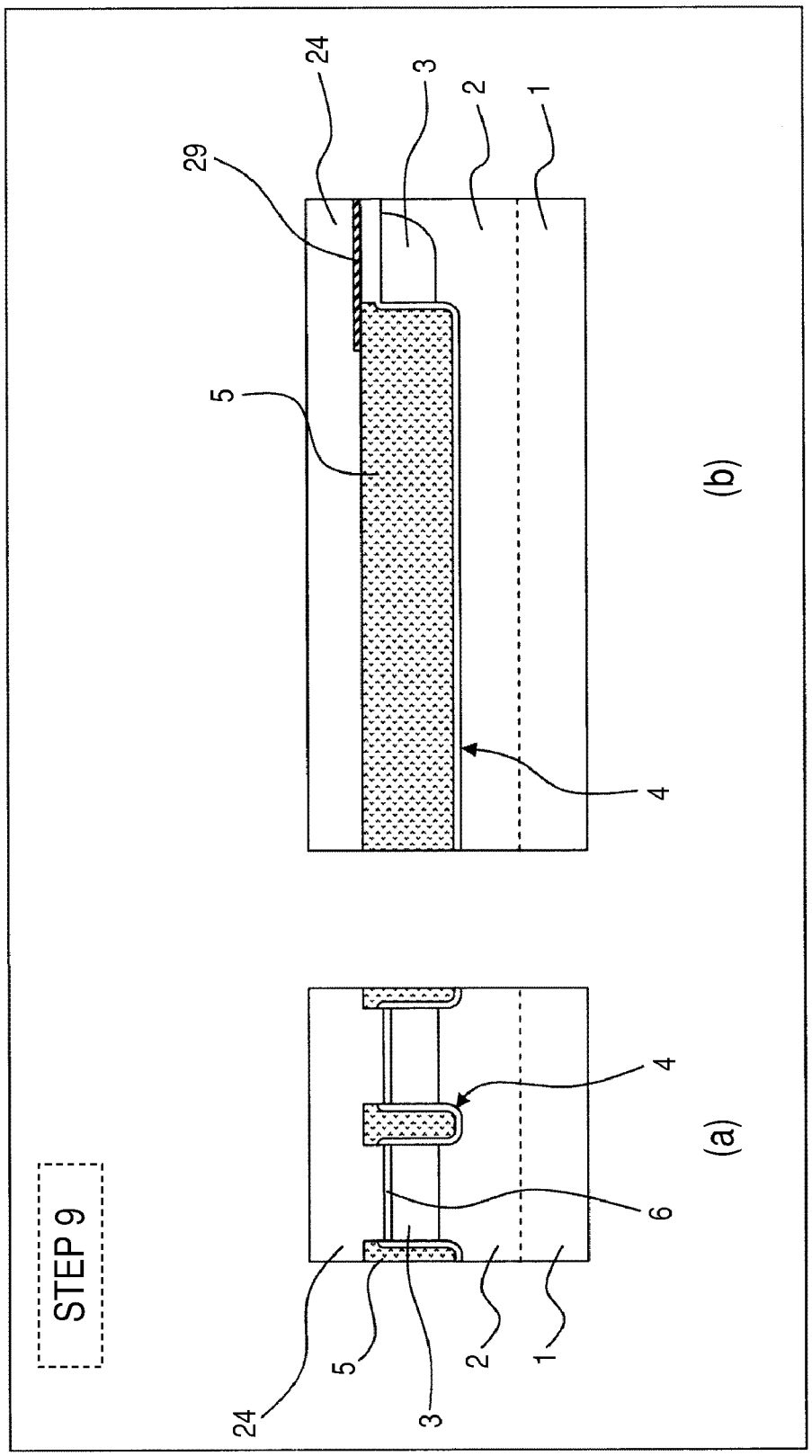
FIGS. 31A and 31B are flow diagrams showing a section of the device in a manufacturing process (in step S9: PSG-CVD step) corresponding to a manufacturing method for the semiconductor device having the power MISFET in the third embodiment of the invention of the present application.
Figure 32:
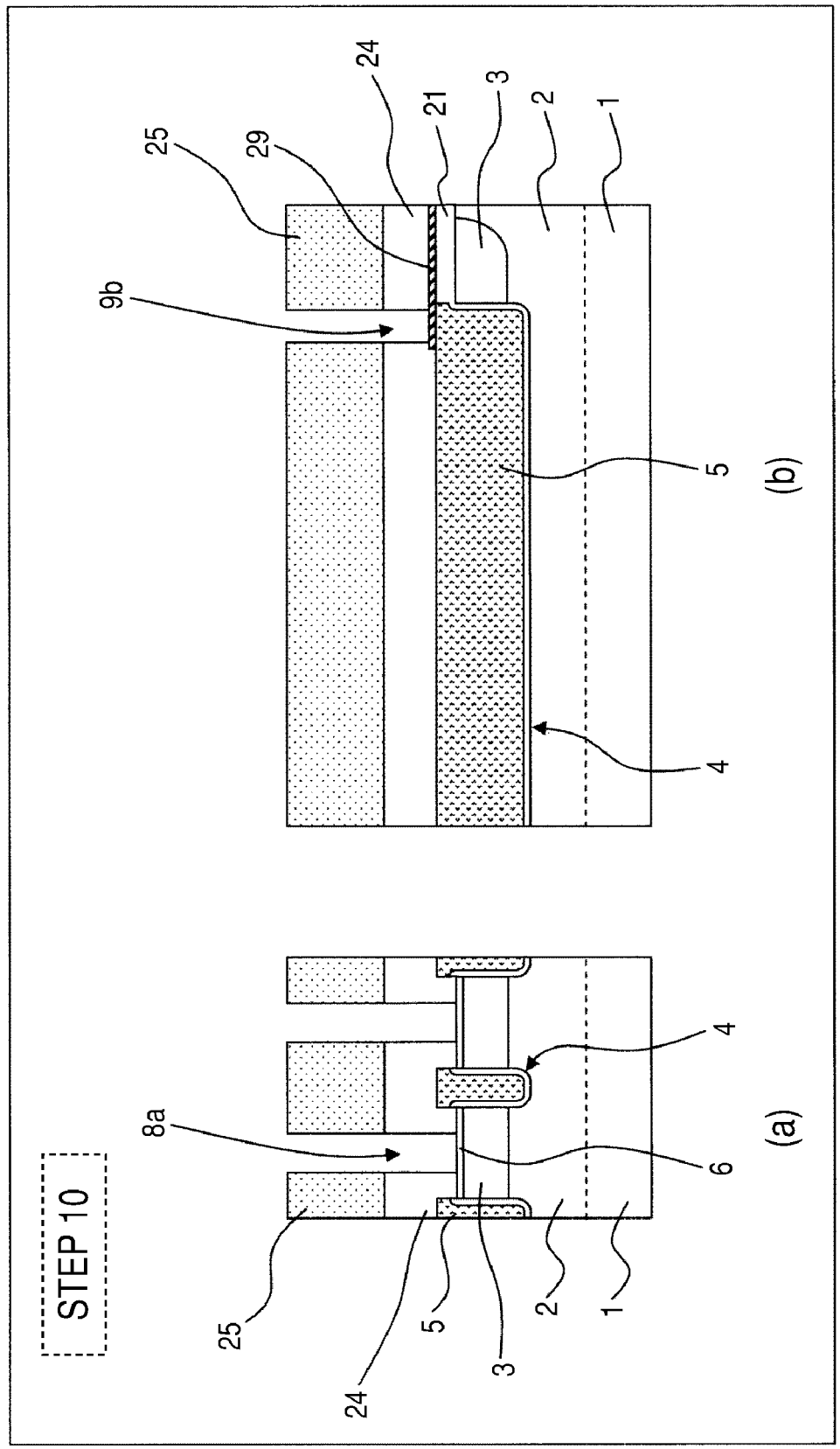
FIGS. 32A and 32B are flow diagrams showing a section of the device in a manufacturing process (in step S10: opening formation step for a source contact trench) corresponding to the manufacturing method for the semiconductor device having the power MISFET in the third embodiment of the invention of the present application.
Figure 33:
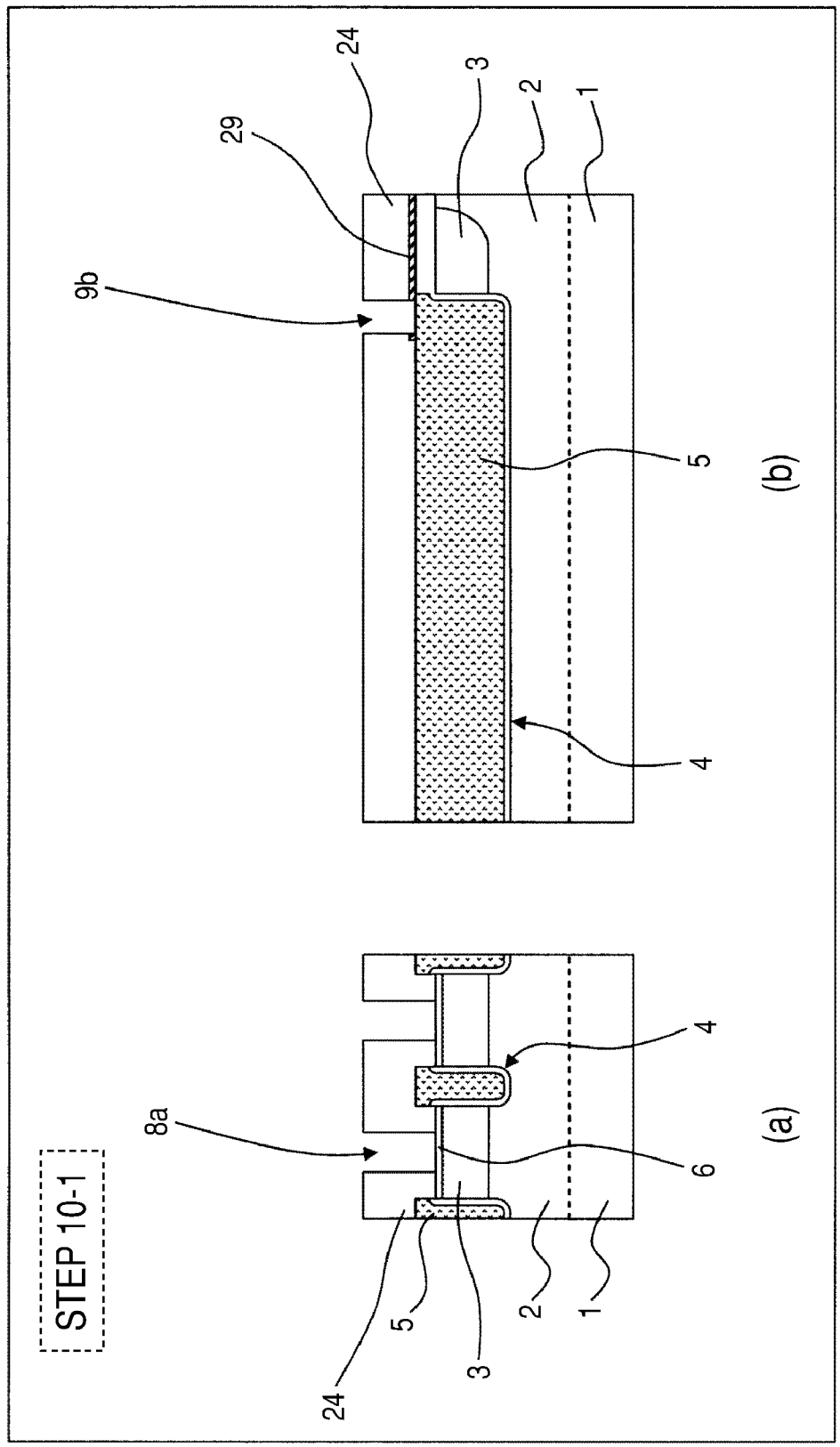
FIGS. 33A and 33B are flow diagrams showing a section of the device in a manufacturing process (in step S10-1: opening bottom SiN etching step for a gate contact trench) corresponding to the manufacturing method for the semiconductor device having the power MISFET in the third embodiment of the invention of the present application.
Figure 34:
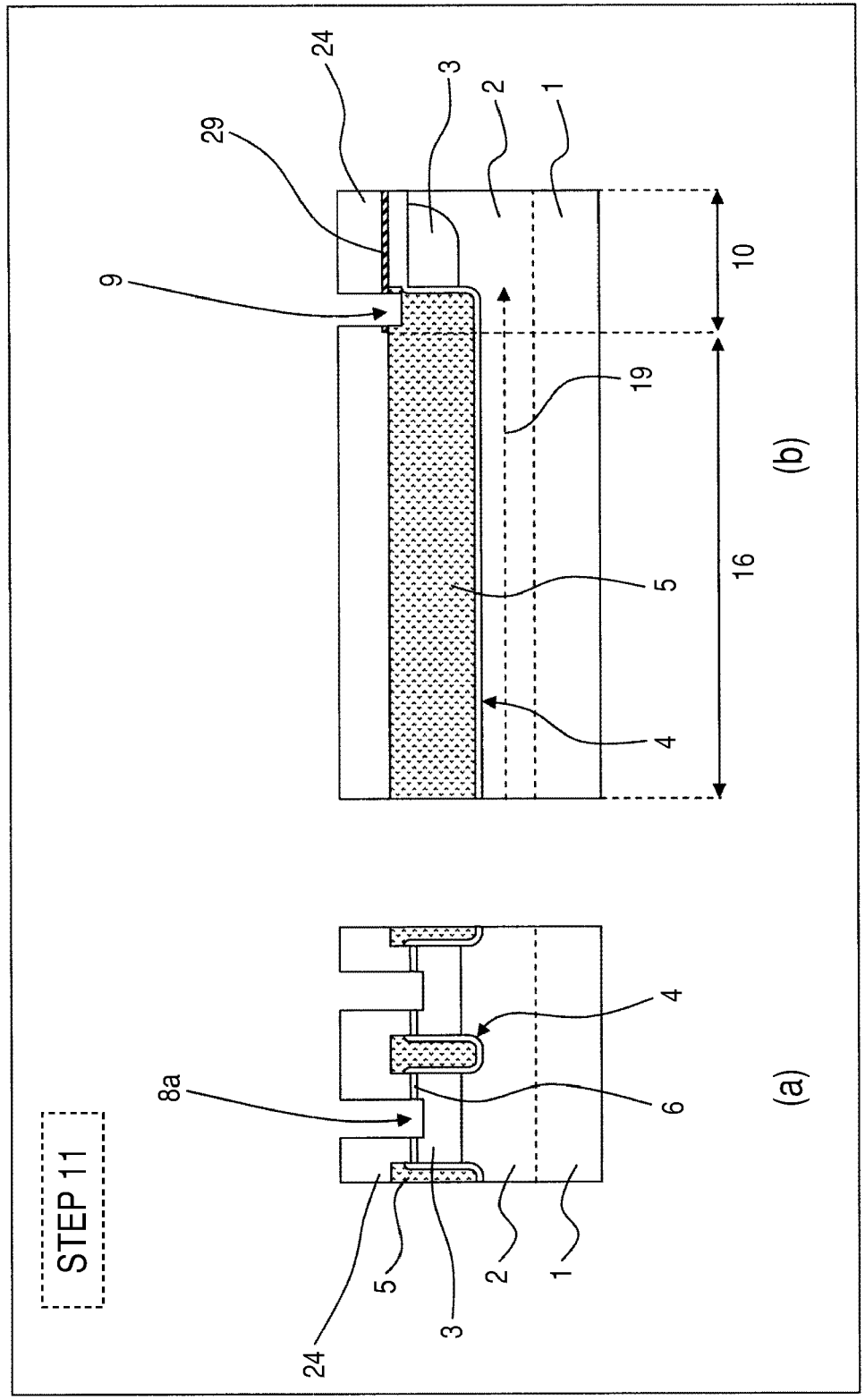
FIGS. 34A and 34B are flow diagrams showing a section of the device in a manufacturing process (in step S11: source contact trench formation step) corresponding to the manufacturing method for the semiconductor device having the power MISFET in the third embodiment of the invention of the present application.

Next, the manufacturing method will be described below based on FIGS. 28 to 34 according to the section 2. First, as shown in FIG. 28, ion implantation is performed to introduce p-type impurities while covering an outside portion of the p-type channel region 3m (see FIG. 3) with a resist film, thereby to form a p-type channel impurity-doped layer 3. At this time, the upper surface 21b of the field oxide film 21 in the gate contact region 10 and the upper surface 5b of the trench gate 5 in the same region form substantially the same surface, like the example described in the section 2. Then, as shown in FIG. 29, a silicon nitride film is formed by the CVD method as the etching stop film 29 over the entire device surface 20a of the wafer 20. Subsequently, as shown in FIGS. 29 and 30, the etching stop film 29 and the field oxide film 21 in the active region 16 are removed. Then, ion implantation is performed (using, for example, arsenic ions), while covering the outside portion of a region (see FIG. 3) to serve as the n+ source region 6m (see FIG. 3) with a resist film, thereby to form a source impurity-doped region 6 at the surface of the epitaxial layer 2 (the device surface 20a of the wafer 20). Then, as shown in FIG. 31, the interlayer insulating film 24 (for example, the PSG film) is formed by the CVD over the entire device surface 20a of the wafer 20. Next, as shown in FIG. 32, the resist pattern 25 is formed on the interlayer insulating film 24 by the normal lithography, and anisotropic dry etching (by use of gas containing a fluorocarbon-based etching gas, for example, a combined gas containing, for example, Ar, $C_4F_6$, $O_2$ or the like) is performed using the formed pattern as a mask, whereby the source contact hole 8a and the gate contact hole 9b are opened substantially at the same time (in the same etching step). Since the etching stop film 29 is formed at the bottom of the gate contact hole 9b, etching is surely stopped at this time. Then, as shown in FIG. 33, the silicon nitride film 29 at the bottom of the gate contact hole 9b is selectively removed (using a gas containing the fluorocarbon-based etching gas, for example, a combined gas containing $CF_4$, $CHF_3$, $O_2$, or the like). Then, as shown in FIG. 34, the source contact trench 8 and the gate contact trench 9 are respectively formed by etching the silicon substrate as the underlayer and the polysilicon member so as to separate the source regions 6 on both sides. This embodiment and the first embodiment slightly differ from each other in steps after the step shown in FIG. 15 and in the device structure described in section 2, but are almost the same in manufacturing procedure.

5. Explanation of Semiconductor Device Having Power MISFET in Fourth Embodiment (of Etch Stop Type On Side Wall) of the Invention of Present Application (See Mainly FIGS. 35 to 41)

Figure 35:
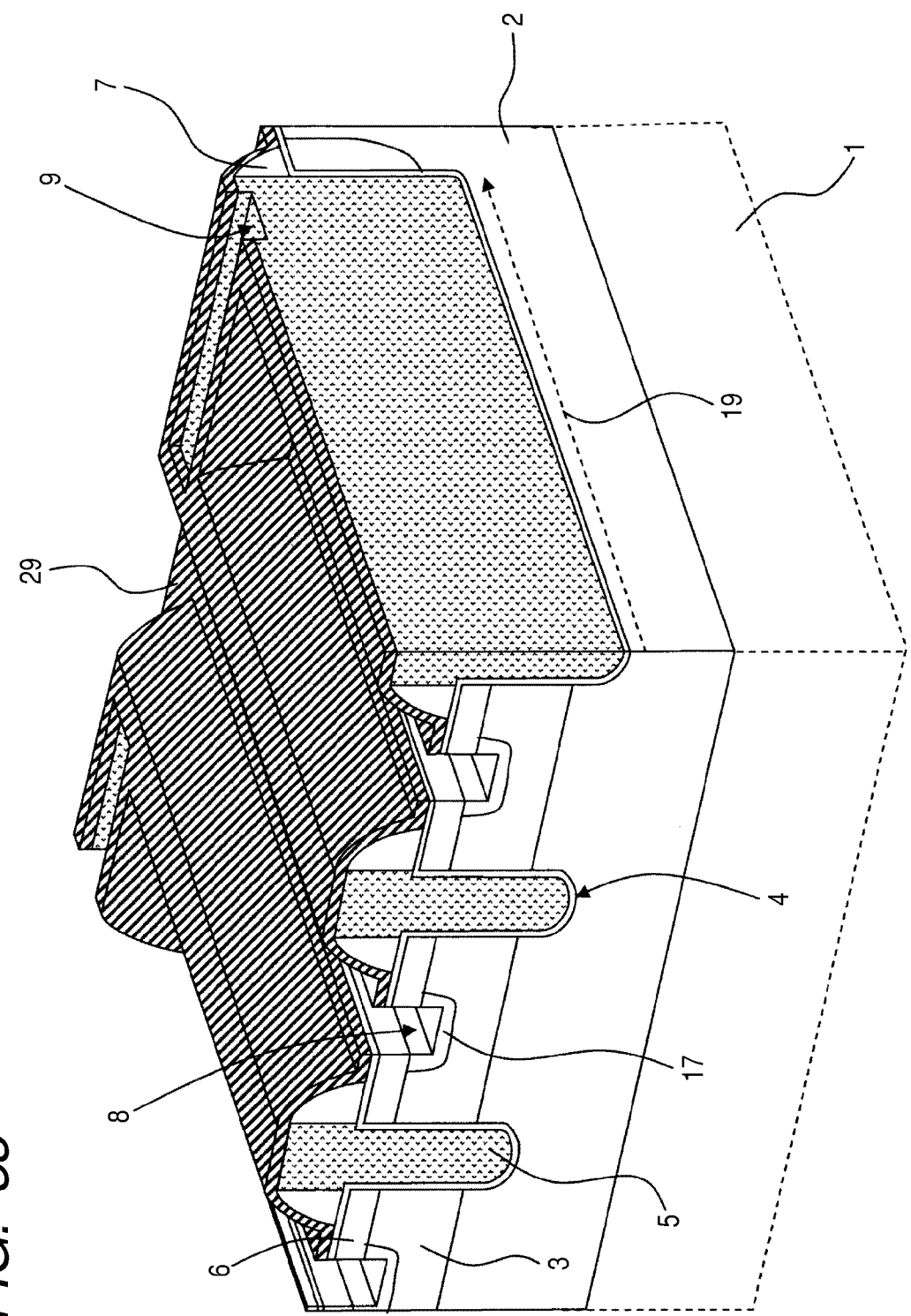
FIG. 35 is a perspective view showing a section of a main portion of a semiconductor device having a power MISFET according to a fourth embodiment (of an etch stop type on a side wall) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3, respectively)

FIG. 35 is a perspective view showing a section of a main portion of a semiconductor device having a power MISFET according to a fourth embodiment (of an etch stop type on a side wall) of the invention of the present application (in which an aluminum-based metal layer as an upper layer and a PSG layer as a lower layer are removed for easy understanding, and in which the right section and the left section substantially correspond to a section taken along the line A-A' of FIG. 3, and a section taken along the line B-B' of FIG. 3). FIGS. 36A and 36B are flow diagrams showing a section of the device in a manufacturing process (in step S8-2: side wall formation step) corresponding to the manufacturing method for the semiconductor device having the power MISFET in the fourth embodiment of the invention of the present application (in which FIG. 36B substantially corresponds to the section taken along the line A-A' of FIG. 3, and FIG. 36A substantially corresponds to the section taken along the line B-B' of FIG. 3, note that the same goes for the description below). FIGS. 37A and 37B are flow diagrams showing a section of the device in a manufacturing process (in step S8-3: SiN-CVD step) corresponding to the manufacturing method for the semiconductor device having the power MISFET in the fourth embodiment of the invention of the present application. FIGS. 38A and 38B are flow diagrams showing a section of the device in a manufacturing process (in step S9: PSG-CVD step) corresponding to the manufacturing method for the semiconductor device having the power MISFET in the fourth embodiment of the invention of the present application. FIGS. 39A and 39B are flow diagrams showing a section of the device in a manufacturing process (in step S10: opening formation step for a source contact trench) corresponding to the manufacturing method for the semiconductor device having the power MISFET in the fourth embodiment of the invention of the present application. FIGS. 40A and 40B are flow diagrams showing a section of the device in a manufacturing process (in step S10-1: opening bottom SiN etching step for the source contact trench) corresponding to the manufacturing method for the semiconductor device having the power MISFET in the fourth embodiment of the invention of the present application. FIGS. 41A and 41B are flow diagrams showing a section of the device in a manufacturing process (in step S11: source contact trench formation step) corresponding to the manufacturing method for the semiconductor device having the power MISFET in the fourth embodiment of the invention of the present application. Referring to these figures, the semiconductor device having the power MISFET according to the fourth embodiment (of an etch stop type on the side wall) of the invention of the present application will be described below.

First, referring to FIG. 35, the semiconductor device structure having the power MISFET according to the fourth embodiment (of the etch stop type on the side wall) of the invention of the present application will be described below. The structure of this embodiment is based on the structure described in section 2 but differs from the above-mentioned embodiments in that the side wall insulating film 7 described in the section 3 and the etching stop film 29 described in the section 4 are formed in use over the entire regions. As explained by the following manufacturing processes, the reliability and process margin of contact etching process can be improved.

Next, the manufacturing method will be described below based on FIG. 36 to 41 according to the section 3 (the sections 2 and 4).

Figure 36:
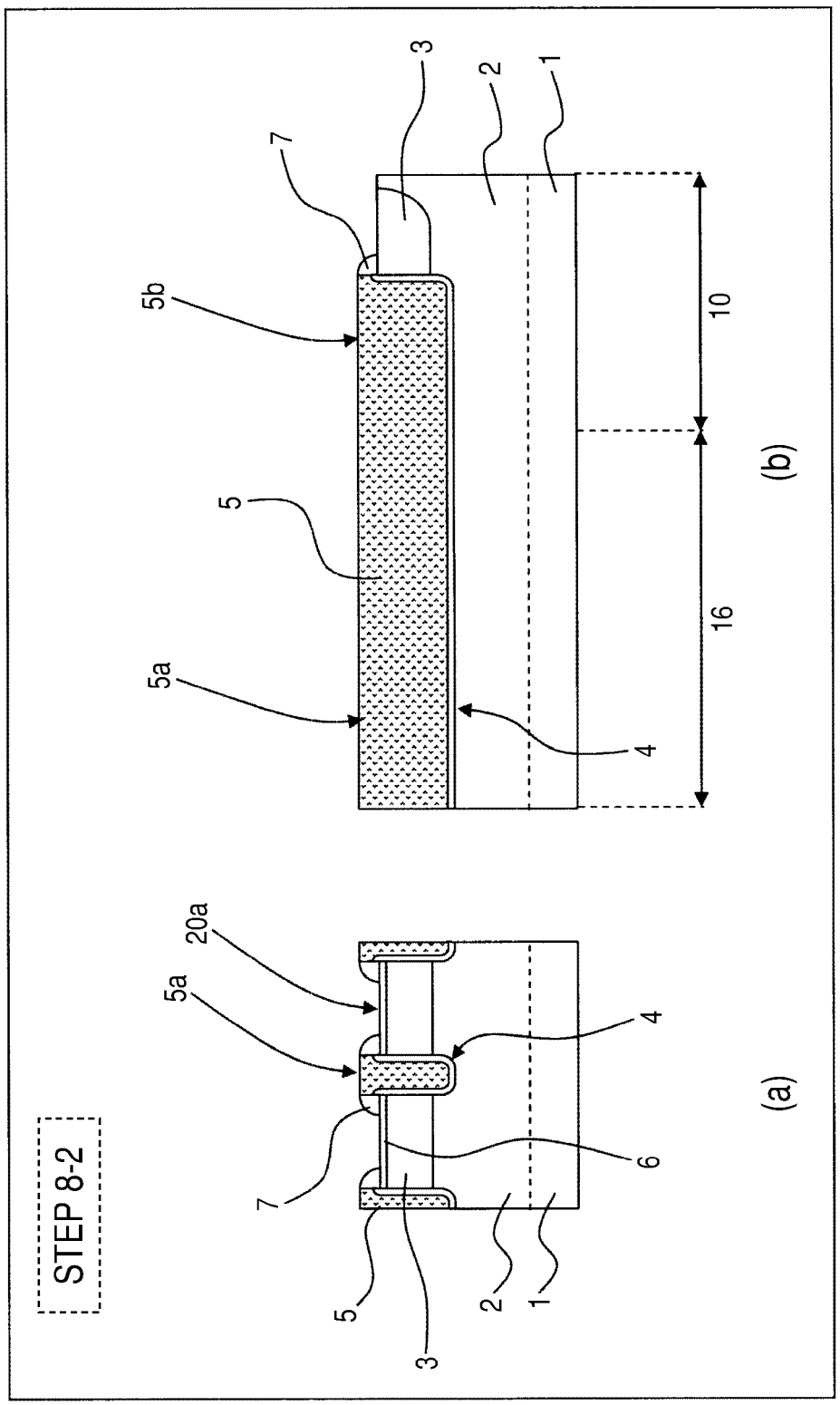
FIGS. 36A and 36B are flow diagrams showing a section of the device in a manufacturing process (in step S8-2: side wall formation step) corresponding to the manufacturing method for the semiconductor device having the power MISFET according to the fourth embodiment of the invention of the present application (in which FIG. 36B substantially corresponds to the section taken along the line A-A' of FIG. 3, and FIG. 36A substantially corresponds to the section taken along the line B-B' of FIG. 3, note that the same goes for the description below)
Figure 37:
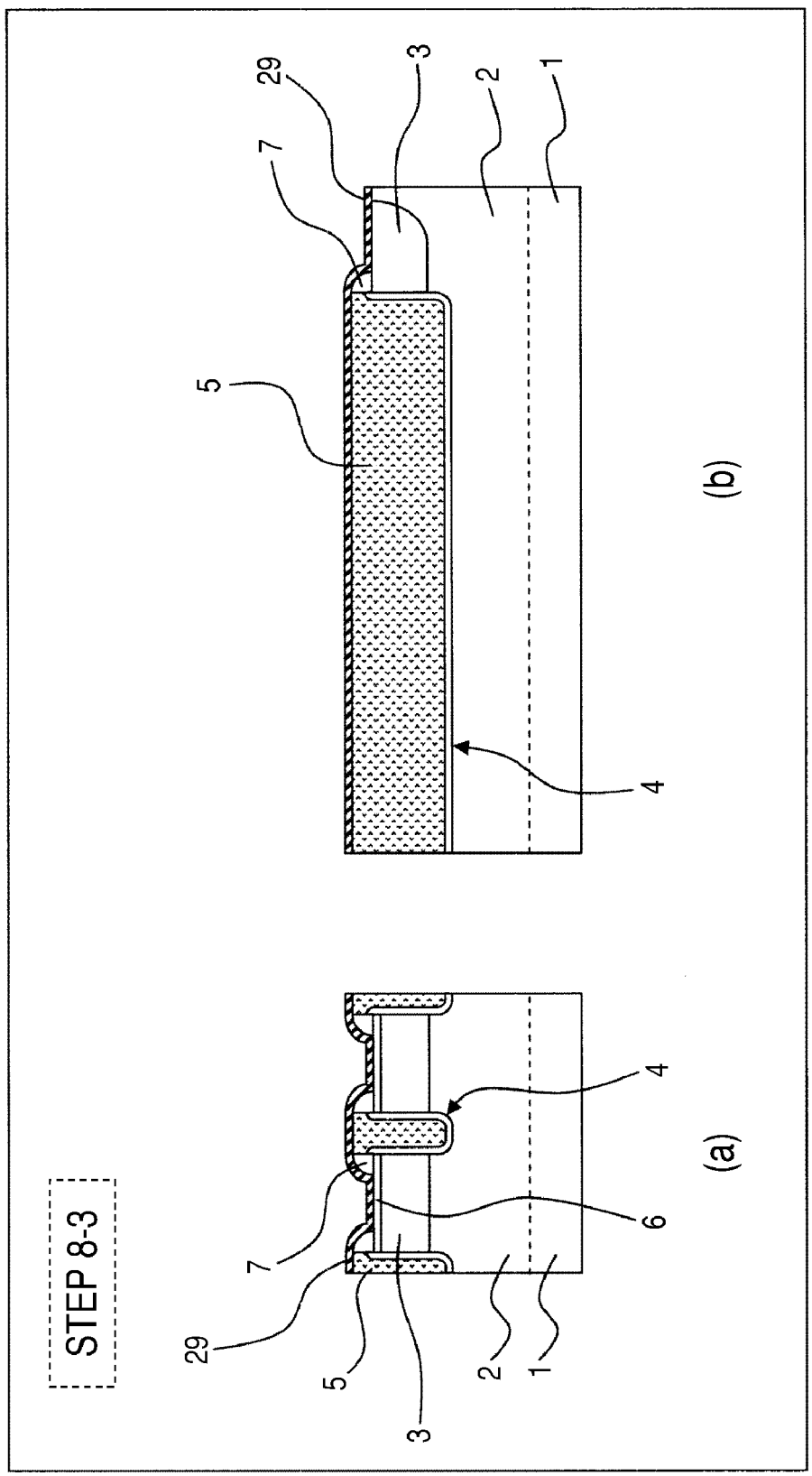
FIGS. 37A and 37B are flow diagrams showing a section of the device in a manufacturing process (in step S8-3: SiN-CVD step) corresponding to the manufacturing method for the semiconductor device having the power MISFET in the fourth embodiment of the invention of the present application.
Figure 38:
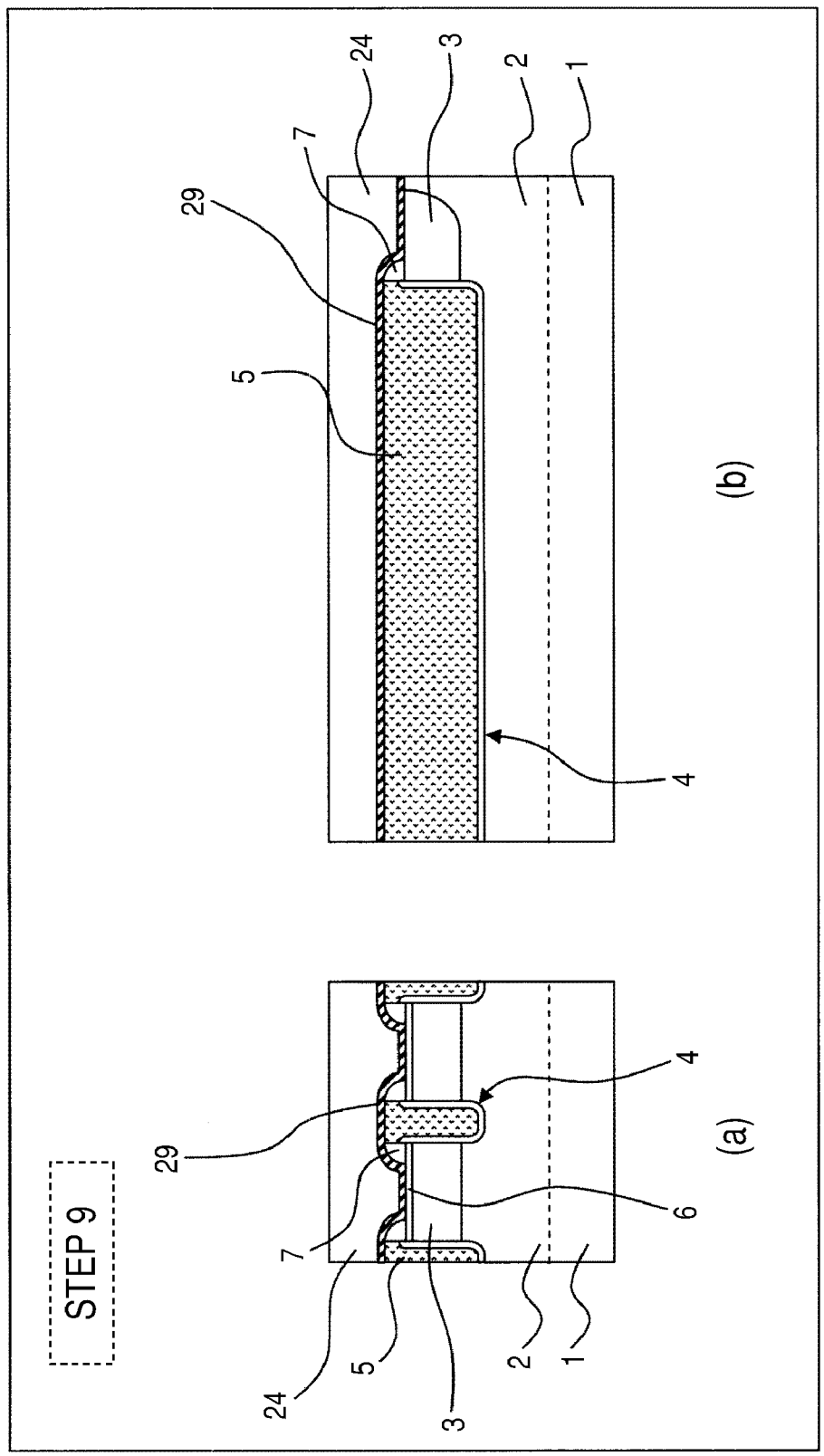
FIGS. 38A and 38B are flow diagrams showing a section of the device in a manufacturing process (in step S9: PSG-CVD step) corresponding to the manufacturing method for the semiconductor device having the power MISFET in the fourth embodiment of the invention of the present application.
Figure 39:
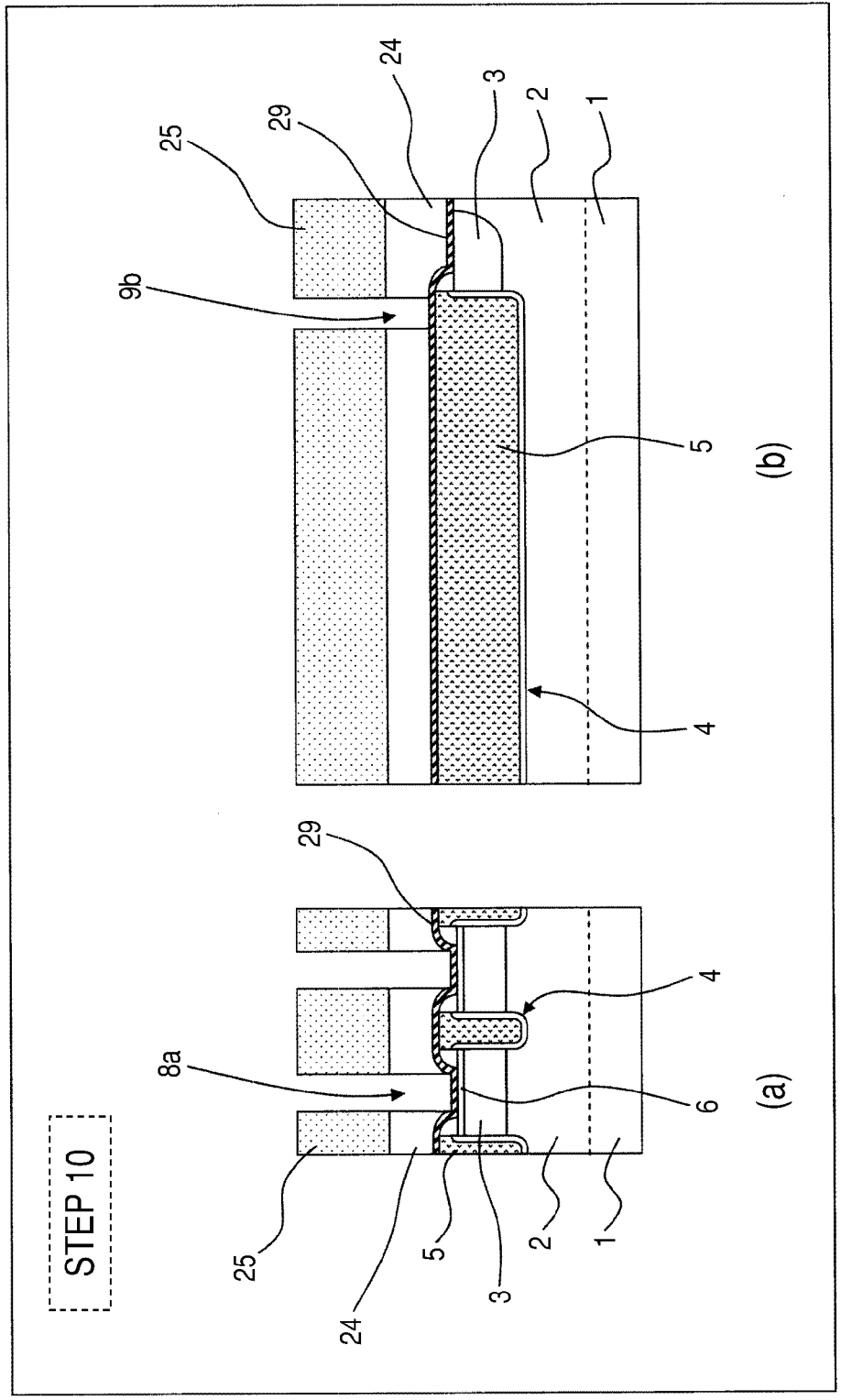
FIGS. 39A and 39B are flow diagrams showing a section of the device in a manufacturing process (in step S10: opening formation step for a source contact trench) corresponding to the manufacturing method for the semiconductor device having the power MISFET in the fourth embodiment of the invention of the present application.
Figure 40:
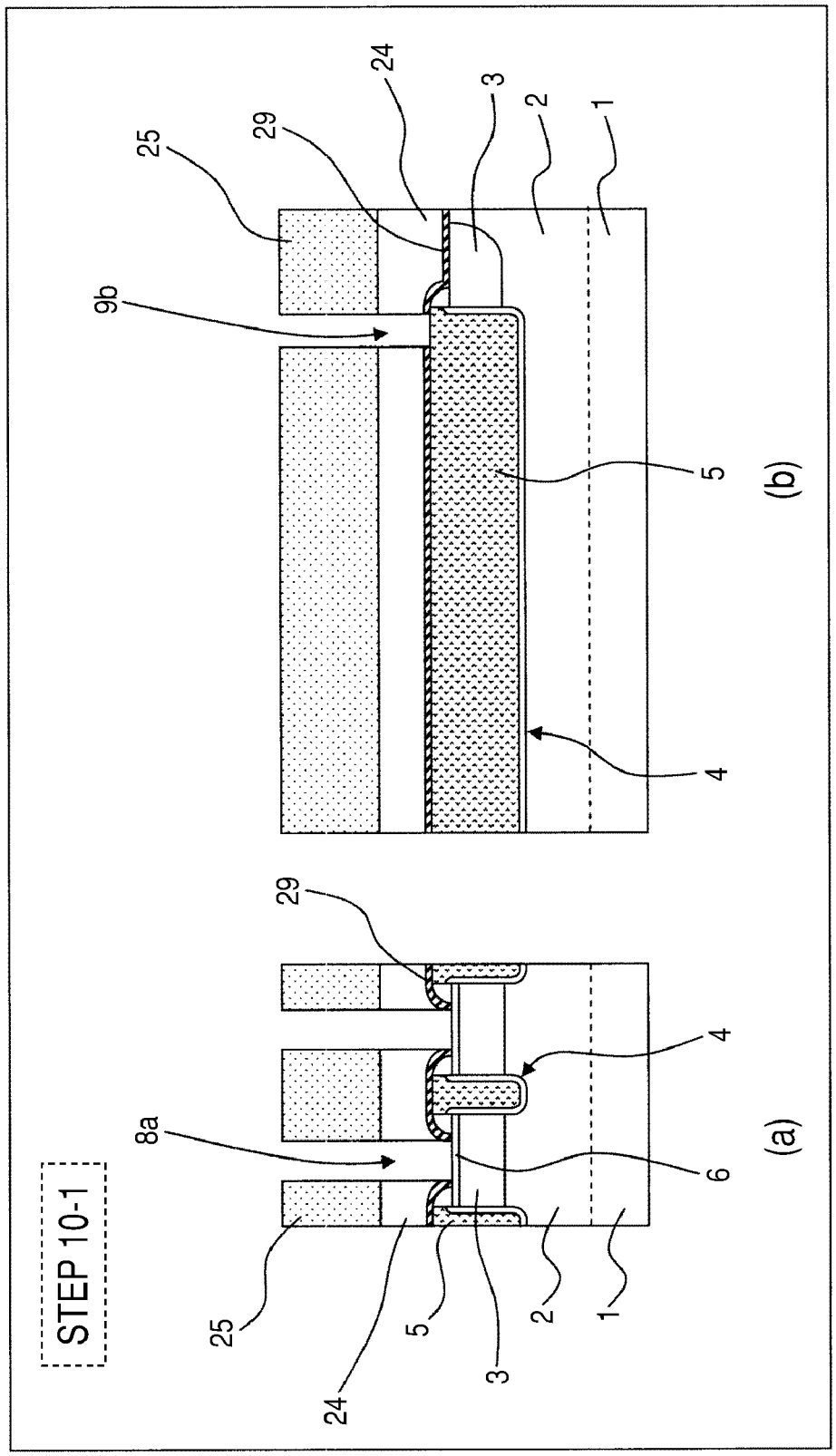
FIGS. 40A and 40B are flow diagrams showing a section of the device in a manufacturing process (in step S10-1: opening bottom SiN etching step for the source contact trench) corresponding to the manufacturing method for the semiconductor device having the power MISFET in the fourth embodiment of the invention of the present application.
Figure 41:
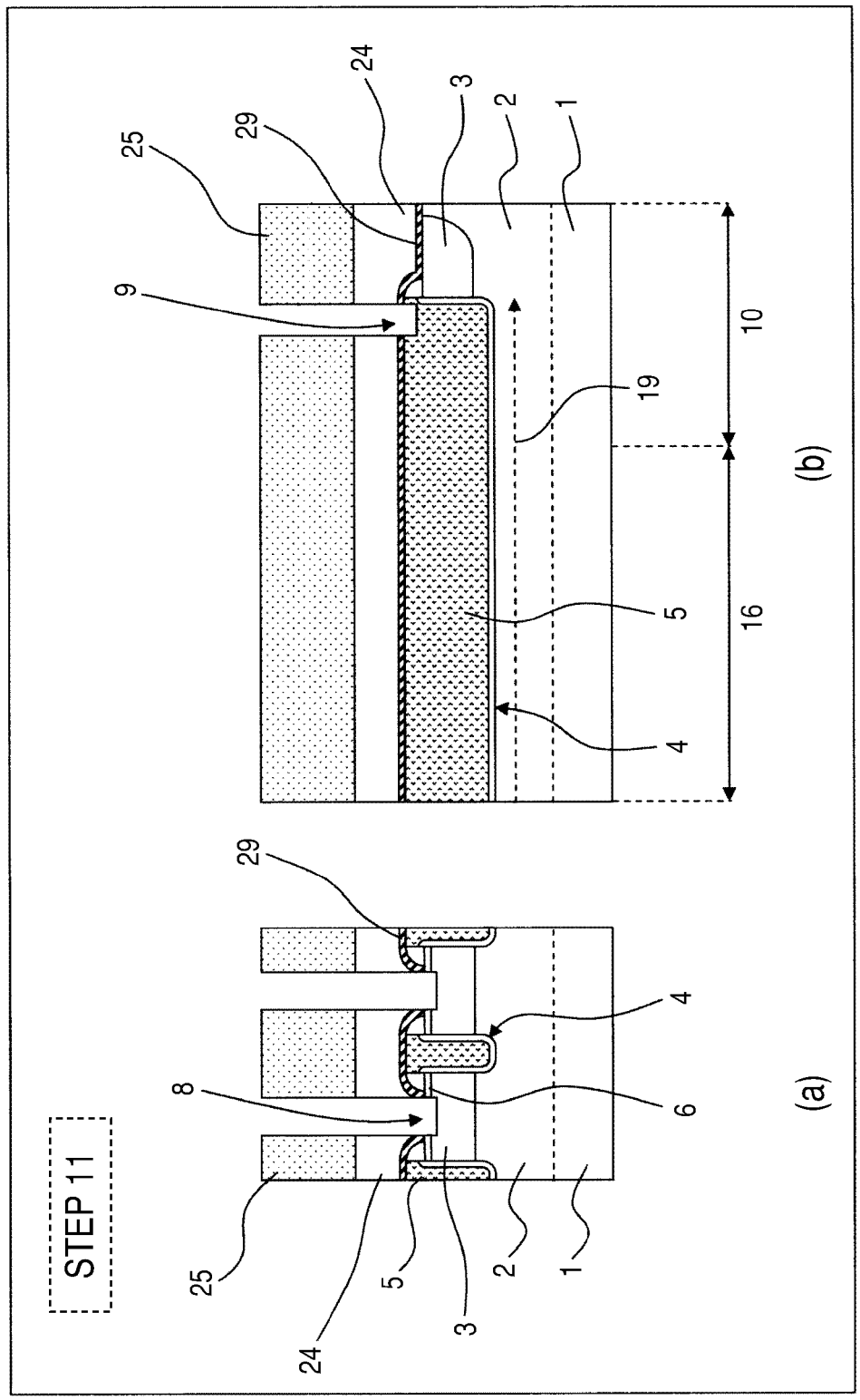
FIGS. 41A and 41B are flow diagrams showing a section of the device in a manufacturing process (in step S11: source contact trench formation step) corresponding to the manufacturing method for the semiconductor device having the power MISFET in the fourth embodiment of the invention of the present application.

First, as shown in FIG. 36, parts of the silicon oxide film 7 except for both sides of the trench gate 5 are removed by anisotropic dry etching to form a side wall insulating film 7. Then, as shown in FIG. 37, a silicon nitride film is formed as the etching stop film 29 by the CVD method over the entire device surface 20a of the wafer 20. Subsequently, as shown in FIG. 38, the PSG film is formed as the interlayer insulating film 24 by the CVD method over the entire surface of the etching stop film 29. Then, as shown in FIG. 39, the resist pattern 25 is formed on the interlayer insulating film 24 by the normal lithography, and anisotropic dry etching is performed using the formed pattern as a mask, whereby the source contact hole 8a and the gate contact hole 9b are opened substantially at the same time (in the same etching step). Since the etching stop film 29 is formed at both bottoms of the source contact hole 8a and the gate contact hole 9b, etching is surely stopped at this time even with a difference in thickness between both interlayer insulating films 24. Then, as shown in FIG. 40, the silicon nitride film 29 is selectively removed at both bottoms of the source contact hole 8a and the gate contact hole 9b. As shown in FIG. 41, the source contact trench 8 and the gate contact trench 9 are formed by etching the silicon substrate as the underlayer and the polysilicon member so as to separate the source regions 6 on both sides. This embodiment and the first embodiment slightly differ from each other in steps after the step shown in FIG. 15 and in the device structure described in section 2, but are almost the same in manufacturing procedure.

6. Explanation of Semiconductor Device Having Power MISFET in Fifth Embodiment (of Entire Surface Etch Stop type) of the Invention of Present Application (See Mainly FIGS. 42 to 48)

Figure 42:
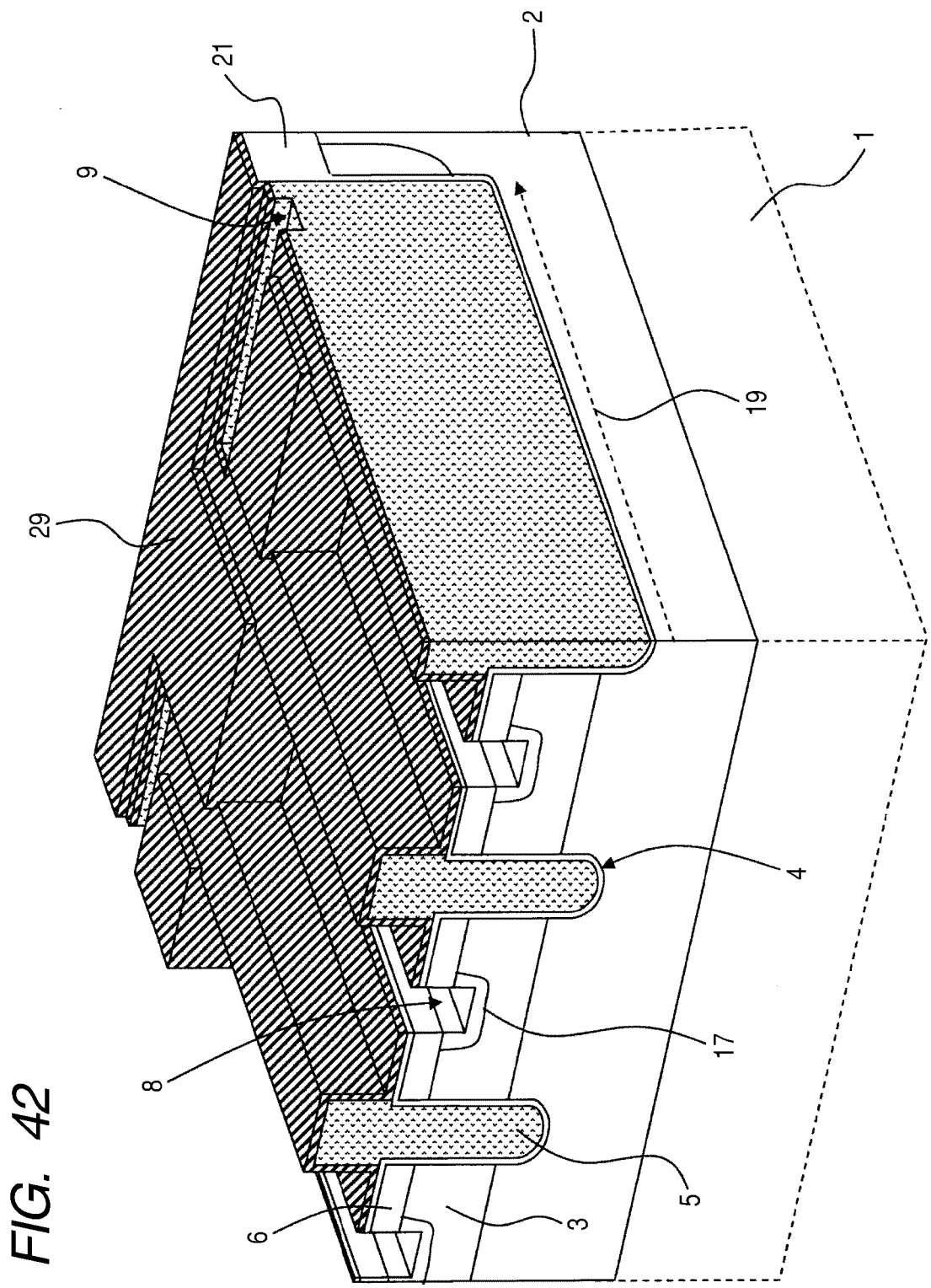
FIG. 42 is a perspective view containing a section of a main portion of a semiconductor device having a power MISFET according to the fifth embodiment (of an entire surface etch stop type) of the invention of the present application (in which an aluminum-based metal layer as an upper layer and a PSG layer a lower layer are removed for easy understanding, and in which the right section and the left section substantially correspond to a section taken along the line A-A' of FIG. 3, and a section taken along the line B-B' of FIG. 3, respectively)

FIG. 42 is a perspective view containing a section of a main portion of a semiconductor device having a power MISFET according to the fifth embodiment (of an entire surface etch stop type) of the invention of the present application (in which an aluminum-based metal layer as an upper layer and a PSG layer as a lower layer are removed for easy understanding, and in which the right section and the left section correspond to a section taken along the line A-A' of FIG. 3, and a section taken along the line B-B' of FIG. 3, respectively). FIGS. 43A and 43B are flow diagrams showing a section of the device in a manufacturing process (in step S8: source region impurity introduction step) corresponding to the manufacturing method for the semiconductor device having the power MISFET in the fifth embodiment of the invention of the present application (in which FIG. 43B substantially corresponds to the section taken along the line A-A' of FIG. 3, and FIG. 43A substantially corresponds to the section taken along the line B-B' of FIG. 3, note that the same goes for the description below). FIGS. 44A and 44B are flow diagrams showing a section of the device in a manufacturing process (in step S8-3: SiN-CVD step) corresponding to the manufacturing method for the semiconductor device having the power MISFET in the fifth embodiment of the invention of the present application. FIGS. 45A and 45B are flow diagrams showing a section of the device in a manufacturing process (in step S9: PSG-CVD step) corresponding to the manufacturing method for the semiconductor device having the power MISFET in the fifth embodiment of the invention of the present application. FIGS. 46A and 46B are flow diagrams showing a section of the device in a manufacturing process (in step S10: opening formation step for a source contact trench) corresponding to the manufacturing method for the semiconductor device having the power MISFET in the fifth embodiment of the invention of the present application. FIGS. 47A and 47B are flow diagrams showing a section of the device in a manufacturing process (in step S10-1: opening bottom SiN etching step for the source contact trench) corresponding to the manufacturing method for the semiconductor device having the power MISFET in the fifth embodiment of the invention of the present application. FIGS. 48A and 48B are flow diagrams showing a section of the device in a manufacturing process (in step S11: source contact trench formation step) corresponding to the manufacturing method for the semiconductor device having the power MISFET in the fifth embodiment of the invention of the present application. Referring to theses figures, the semiconductor device having the power MISFET according to the fifth embodiment (of the entire surface etch stop type) of the invention of the present application will be described below.

First, the semiconductor device structure having the power MISFET according to the fifth embodiment (of the entire surface etch stop type) of the invention of the present application will be described below based on FIG. 42. This embodiment has a feature that the etching stop film 29 is formed over the entire surface like the structure described in the section 5, in addition to the structure of the example described in the section 2 as a basis. As explained by the following manufacturing processes, the reliability and process margin of the contact etching process can be improved.

Figure 43:
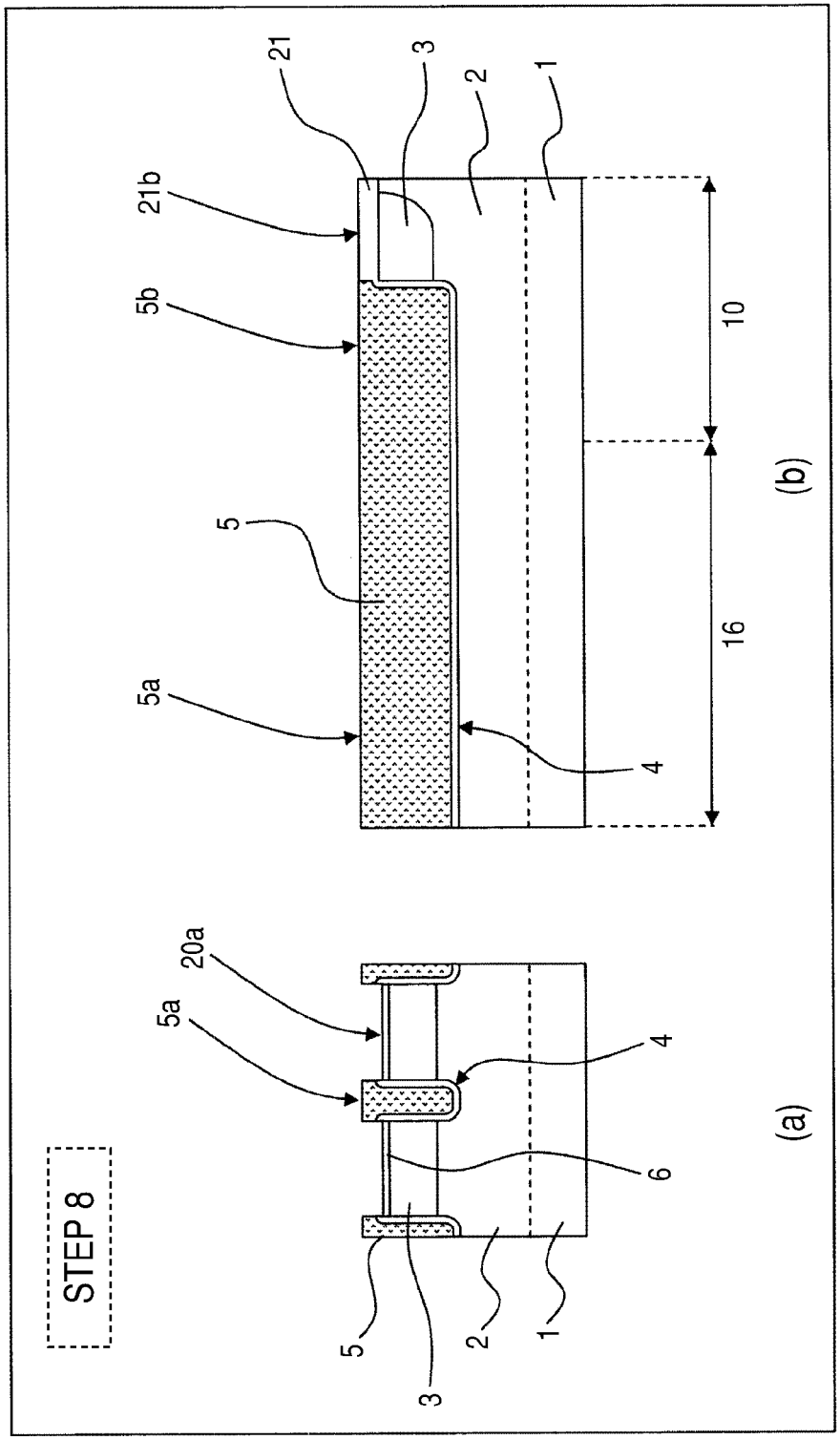
FIGS. 43A and 43B are flow diagrams showing a section of the device in a manufacturing process (in step S8: source region impurity introduction step) corresponding to the manufacturing method for the semiconductor device having the power MISFET in the fifth embodiment of the invention of the present application (in which FIG. 43B substantially corresponds to the section taken along the line A-A' of FIG. 3, and FIG. 43A substantially corresponds to the section taken along the line B-B' of FIG. 3, note that the same goes for the description below)
Figure 44:
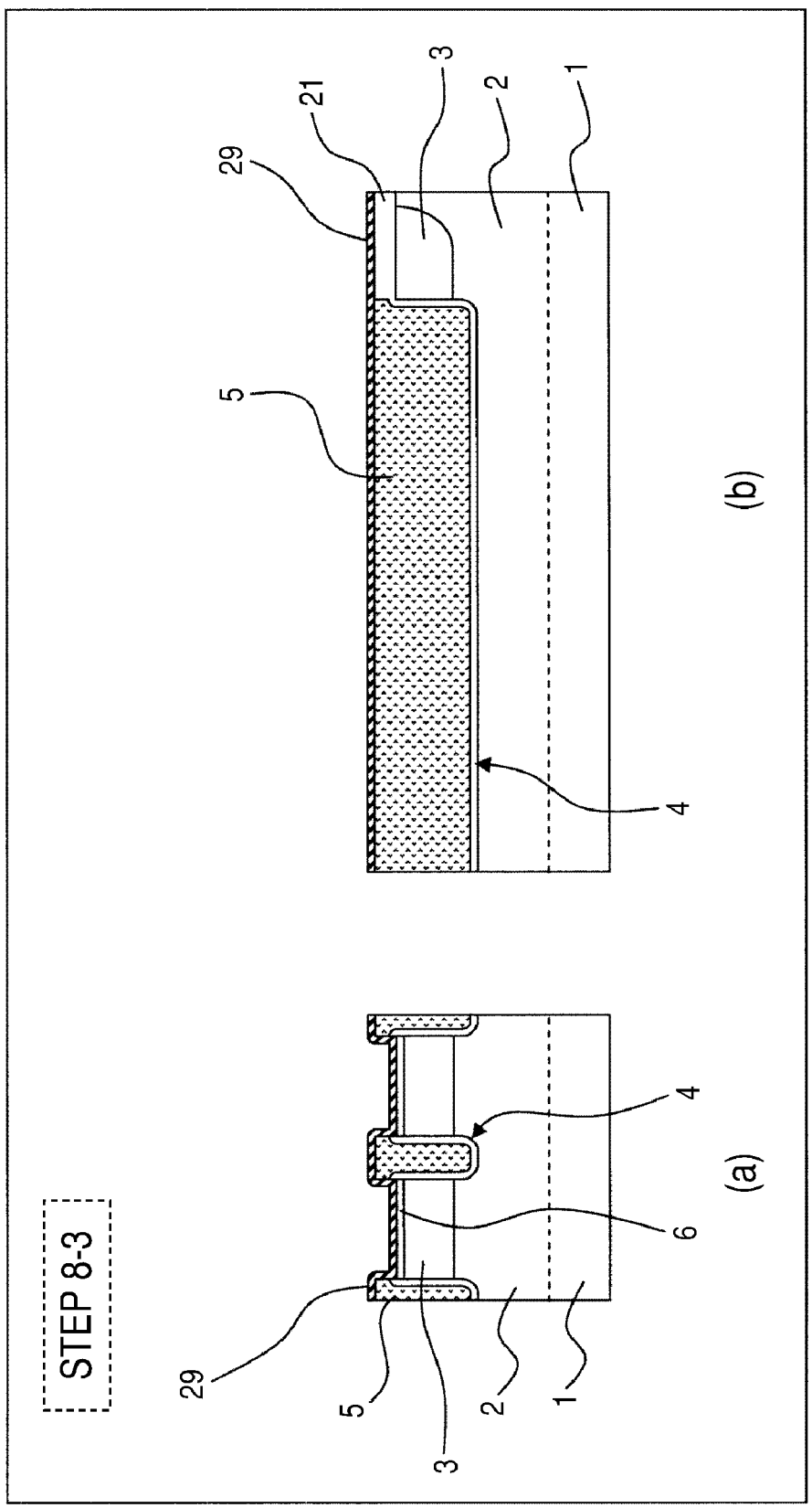
FIGS. 44A and 44B are flow diagrams showing a section of the device in a manufacturing process (in step S8-3: SiN-CVD step) corresponding to the manufacturing method for the semiconductor device having the power MISFET in the fifth embodiment of the invention of the present application.
Figure 45:
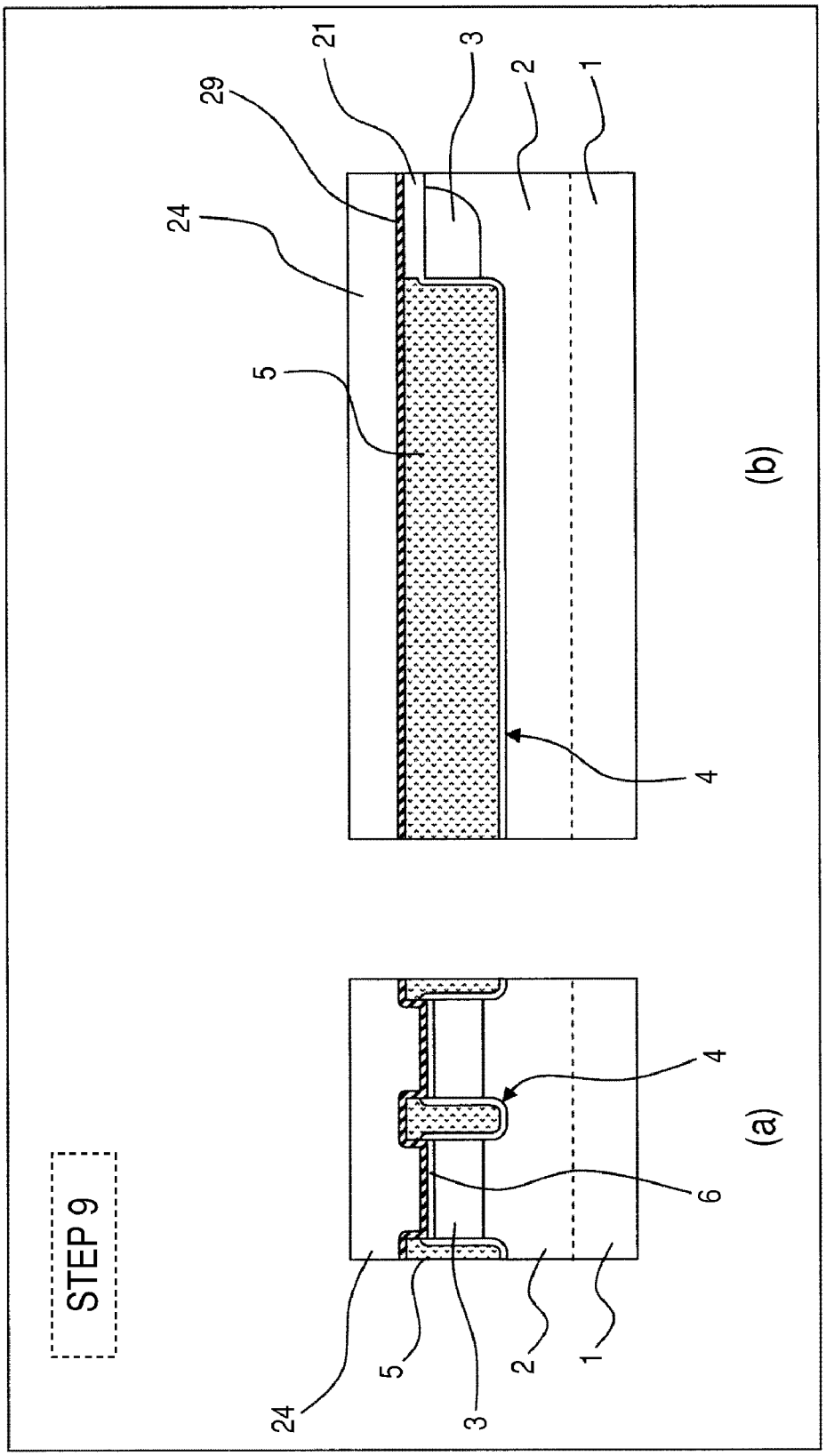
FIGS. 45A and 45B are flow diagrams showing a section of the device in a manufacturing process (in step S9: PSG-CVD step) corresponding to the manufacturing method for the semiconductor device having the power MISFET in the fifth embodiment of the invention of the present application.
Figure 46:
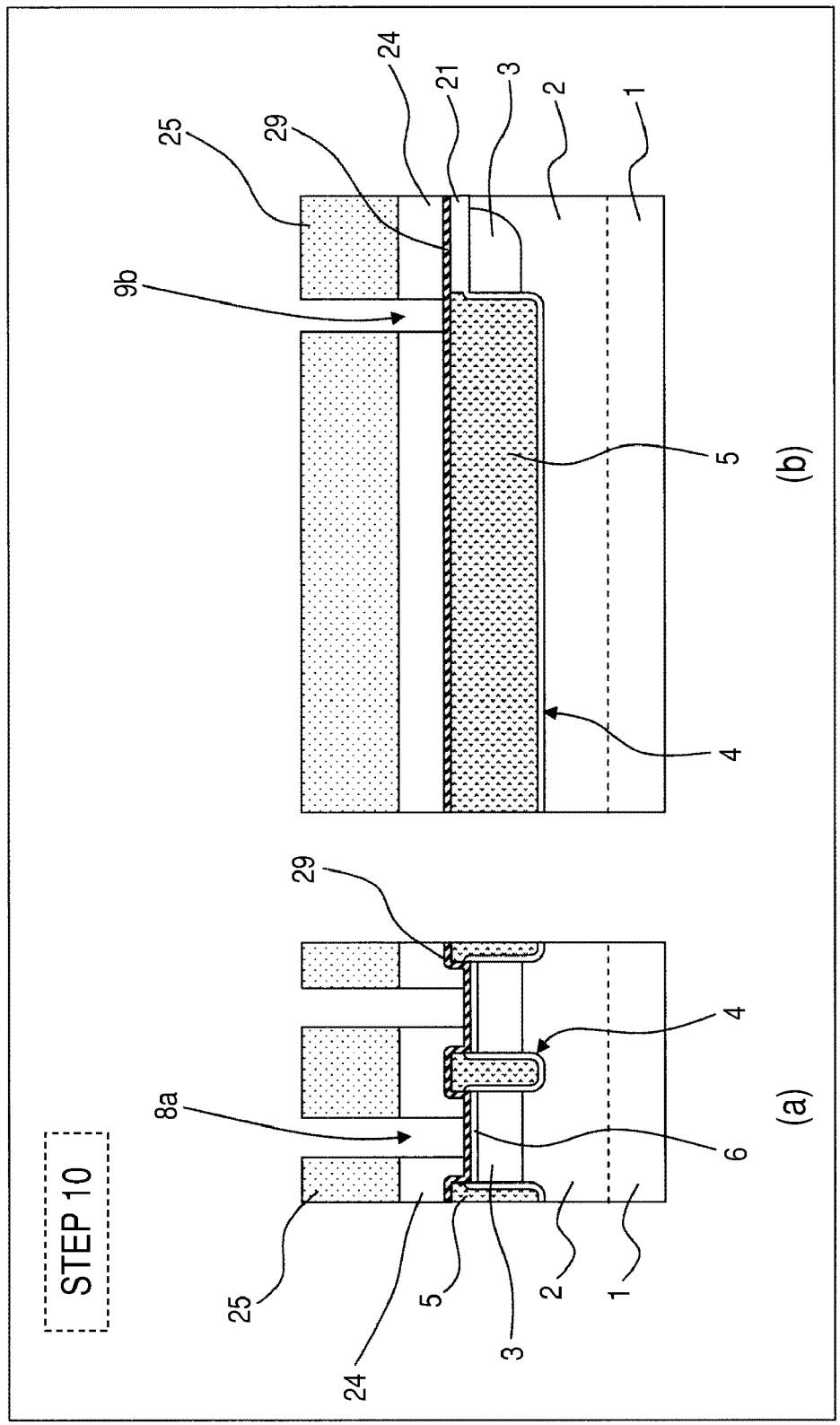
FIGS. 46A and 46B are flow diagrams showing a section of the device in a manufacturing process (in step S10: opening formation step for a source contact trench) corresponding to the manufacturing method for the semiconductor device having the power MISFET in the fifth embodiment of the invention of the present application.
Figure 47:
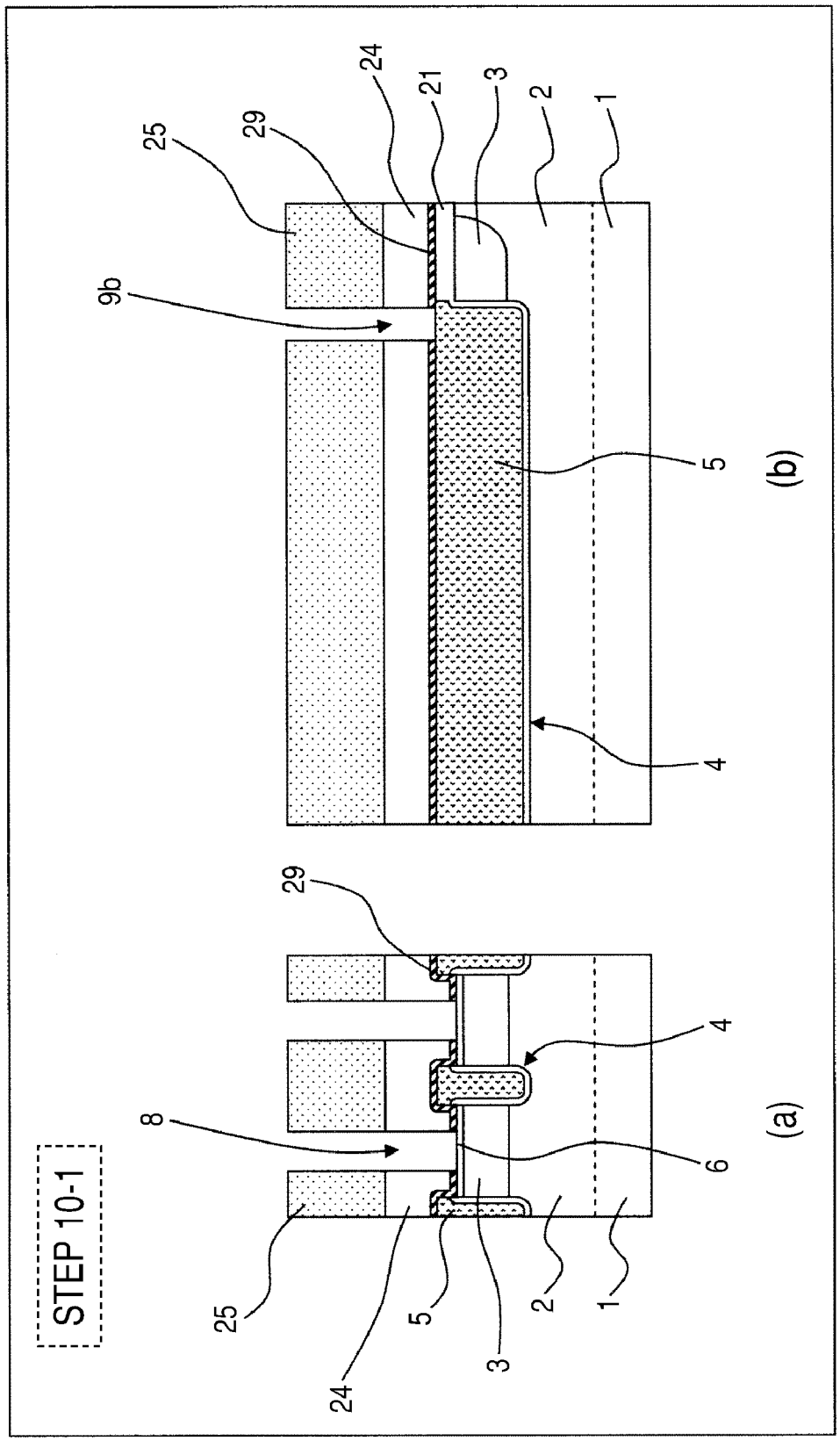
FIGS. 47A and 47B are flow diagrams showing a section of the device in a manufacturing process (in step S10-1: opening bottom SiN etching step for the source contact trench) corresponding to the manufacturing method for the semiconductor device having the power MISFET in the fifth embodiment of the invention of the present application.
Figure 48:
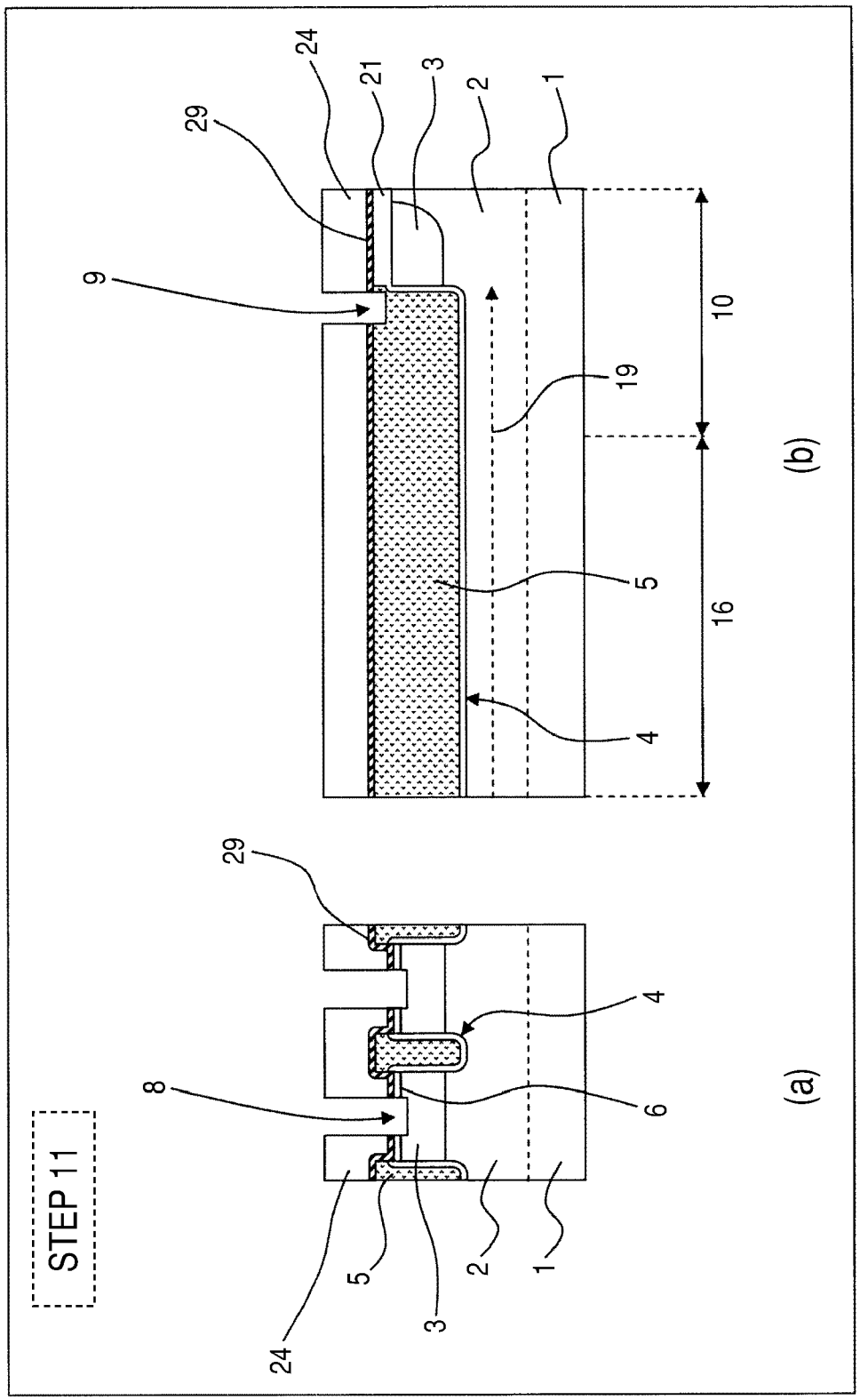
FIGS. 48A and 48B are flow diagrams showing a section of the device in a manufacturing process (in step S11: source contact trench formation step) corresponding to the manufacturing method for the semiconductor device having the power MISFET in the fifth embodiment of the invention of the present application.

Now, the manufacturing method of this embodiment will be described below based on FIGS. 43 to 48 according to the section 2 (sections 2 and 5). As shown in FIG. 43, in the normal lithography, the field oxide film 21 in the active region 16 is removed by etching the silicon oxide film, while covering a part of the field oxide film 21 except for the active region 16 with a resist film. Subsequently, ion implantation (using for example, arsenic ions) is performed while covering the outside portion of the region to serve as the n+ source region 6m (see FIG. 3) with the resist film thereby to form the source impurity-doped region 6 on the surface of the epitaxial layer 2 (the device surface 20a of the wafer 20). Then, as shown in FIG. 44, a silicon nitride film is formed as the etching stop film 29 by the CVD method over the entire device surface 20a of the wafer 20. Subsequently, as shown in FIG. 45, a PSG film is formed as the interlayer insulating film 24 by the CVD method over the entire surface of the etching stop film 29. Then, as shown in FIG. 46, the resist pattern 25 is formed on the interlayer insulating film 24 by the normal lithography, and anisotropic dry etching is performed using the formed pattern as a mask, whereby the source contact hole 8a and the gate contact hole 9b are opened substantially at the same time (in the same etching step). Since the etching stop film 29 is formed at both bottoms of the source contact hole 8a and the gate contact hole 9b, etching is surely stopped at this time even with a difference in thickness between both the interlayer insulating films 24. Then, as shown in FIG. 47, the silicon nitride film 29 at both bottoms of the source contact hole 8a and the gate contact hole 9b is selectively removed. Then, as shown in FIG. 48, the source contact trench 8 and the gate contact trench 9 are formed by etching the silicon substrate as the underlayer and the polysilicon member so as to separate the source regions 6 on both sides. This embodiment and the first embodiment slightly differ from each other in steps after the step shown in FIG. 15 and in the device structure described in section 2, but are almost the same in manufacturing procedure.

7. Explanation of Semiconductor Device Having Power MISFET in Sixth Embodiment (of an SAC Type: Self-Aligned Contact Type) of the Invention of Present Application (See Mainly FIGS. 49 to 59, and FIG. 68)

Figure 68:
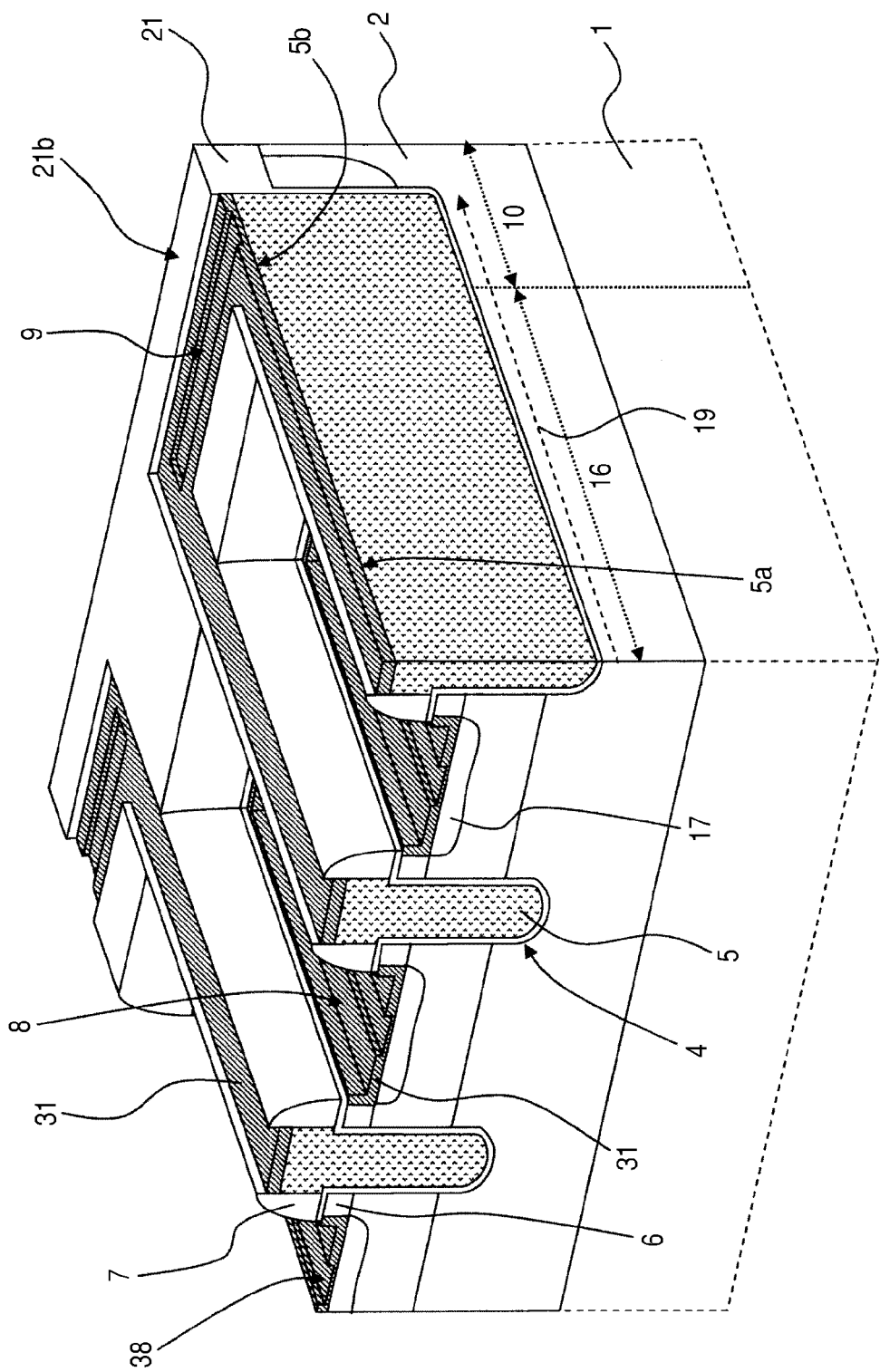
FIG. 68 is a perspective view showing a section of a main portion of the semiconductor device having the power MISFET according to the sixth embodiment (of an active-side side wall type self-aligned cobalt salicide system) of the invention of the present application (in which an aluminum-based metal layer as an upper layer and a PSG layer as a lower layer are removed for easy understanding, and in which the right section and the left section correspond to the section taken along the line A-A' of FIG. 3, and the section taken along the line B-B' of FIG. 3, respectively).

FIG. 68 is a perspective view containing a section of a main portion of a semiconductor device having a power MISFET according to a sixth embodiment (of an active-side side wall type self-aligned cobalt salicide system) of the invention of the present application (in which an aluminum-based metal layer as an upper layer and a PSG layer as a lower layer are removed for easy understanding, and in which the right section and the left section correspond to a section taken along the line A-A' of FIG. 3, and a section taken along the line B-B' of FIG. 3, respectively). FIGS. 49A and 49B are flow diagrams showing a section of the device in a manufacturing process (in step S7: channel region impurity ion implantation step) based on the manufacturing method for the semiconductor device having the power MISFET in the sixth embodiment (of the SAC type: self-aligned contact type) of the invention of the present application corresponding to FIG. 68 (in which FIG. 49B substantially corresponds to a section taken along the line A-A' of FIG. 3, and FIG. 49A substantially corresponds to a section taken along the line B-B' of FIG. 3, note that the same goes for the description below).

FIGS. 50A and 50B are flow diagrams showing a section of the device in a manufacturing process (in step S7-1: active region field oxide film selecting removing step) corresponding to the manufacturing method for the semiconductor device having the power MISFET in the sixth embodiment (of the SAC type: self-aligned contact type) of the invention of the present application. FIGS. 51A and 51B are flow diagrams showing a section of the device in a manufacturing process (in step S8: source region impurity introduction step) corresponding to the manufacturing method for the semiconductor device having the power MISFET in the sixth embodiment of the invention of the present application. FIGS. 52A and 52B are flow diagrams showing a section of the device in a manufacturing process (in step S8-1: side wall insulating film CVD step) corresponding to the manufacturing method for the semiconductor device having the power MISFET in the sixth embodiment of the invention of the present application. FIGS. 53A and 53B are flow diagrams showing a section of the device in a manufacturing process (in step S8-2: side wall formation step) corresponding to the manufacturing method for the semiconductor device having the power MISFET in the sixth embodiment of the invention of the present application. FIGS. 54A and 54B are flow diagrams showing a section of the device in a manufacturing process (in step S8-3: self-aligned source contact trench formation step) corresponding to the manufacturing method for the semiconductor device having the power MISFET in the sixth embodiment of the invention of the present application. FIGS. 55A and 55B are flow diagrams showing a section of the device in a manufacturing process (in step S8-4: p+ type body contact region ion implantation step) corresponding to the manufacturing method for the semiconductor device having the power MISFET in the sixth embodiment of the invention of the present application. FIGS. 56A and 56B are flow diagrams showing a section of the device in a manufacturing process (in step S8-5: cobalt film sputtering step) corresponding to the manufacturing method for the semiconductor device having the power MISFET in the sixth embodiment of the invention of the present application. FIGS. 57A and 57B are flow diagrams showing a section of the device in a manufacturing process (in step S8-6: unnecessary cobalt film removing step) corresponding to the manufacturing method for the semiconductor device having the power MISFET in the sixth embodiment of the invention of the present application. FIGS. 58A and 58B are flow diagrams showing a section of the device in a manufacturing process (in step S9: PSG-CVD step) corresponding to the manufacturing method for the semiconductor device having the power MISFET in the sixth embodiment of the invention of the present application. FIGS. 59A and 59B are flow diagrams showing a section of the device in a manufacturing process (in step S10: opening formation step for source contact trench) corresponding to the manufacturing method for the semiconductor device having the power MISFET in the sixth embodiment of the invention of the present application. Referring to theses figures, the semiconductor device having the power MISFET according to the sixth embodiment (of the SAC type: self-aligned contact type) of the invention of the present application will be described below.

First, the semiconductor device structure having the power MISFET according to the sixth embodiment (of the SAC type: self-aligned contact type) will be described below based on FIG. 68. The device structure of this embodiment has the feature that the side wall spacer 7 described in the section 3 is basically used. In this embodiment, the source contact trench 8 is formed in the side wall spacer 7 in a self-aligned manner (at this time the recession of the gate electrode simultaneously occurring), and the source contact portion 8, the upper surface of the p+ type body contact region 17, and the gate electrode upper surface 5*a* are silicited to form a cobalt silicide film 31. In forming the gate contact trench 9, a source contact trench 38 is formed in the cobalt silicide film on the upper surface of the body contact region substantially at the same time. As the above silicide, a silicide member of a type for forming a cobalt-based silicide, a titanium-based silicide, a nickel-based silicide, a platinum-based silicide, or other relatively low-resistance silicides can be applied.

Figure 49:
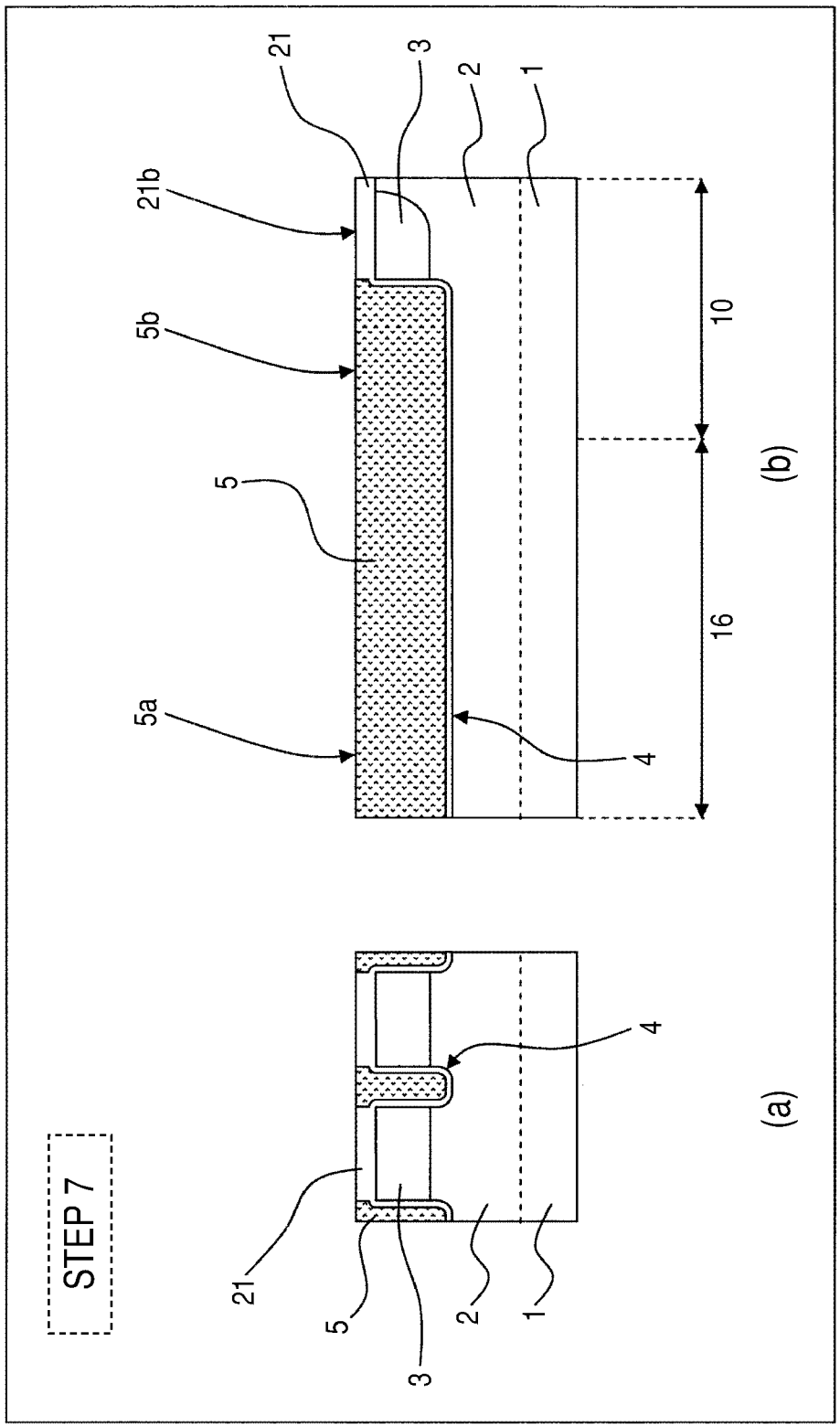
FIGS. 49A and 49B are flow diagrams showing a section of the device in a manufacturing process (in step S7: channel region impurity ion implantation step) corresponding to the manufacturing method for the semiconductor device having the power MISFET in the sixth embodiment (of a SAC type: self-aligned contact type) of the invention of the present application (in which FIG. 49B substantially corresponds to the section taken along the line A-A' of FIG. 3, and FIG. 49A substantially corresponds to the section taken along the line B-B' of FIG. 3, note that the same goes for the description below)
Figure 50:
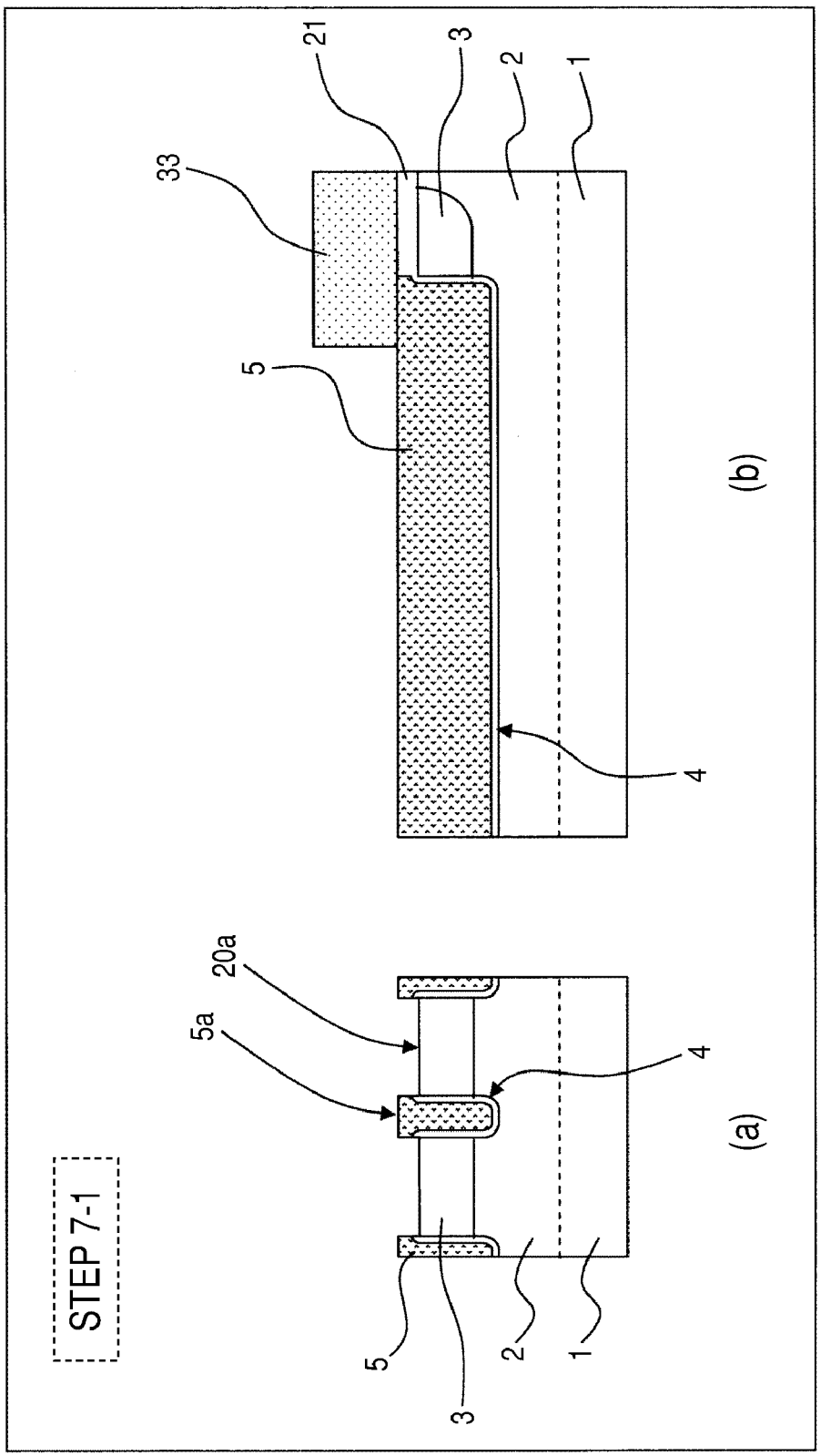
FIGS. 50A and 50B are flow diagrams showing a section of the device in a manufacturing process (in step S7-1: active region field oxide film selective removing step) corresponding to the manufacturing method for the semiconductor device having the power MISFET in the sixth embodiment (of the SAC type: self-aligned contact type) of the invention of the present application.
Figure 51:
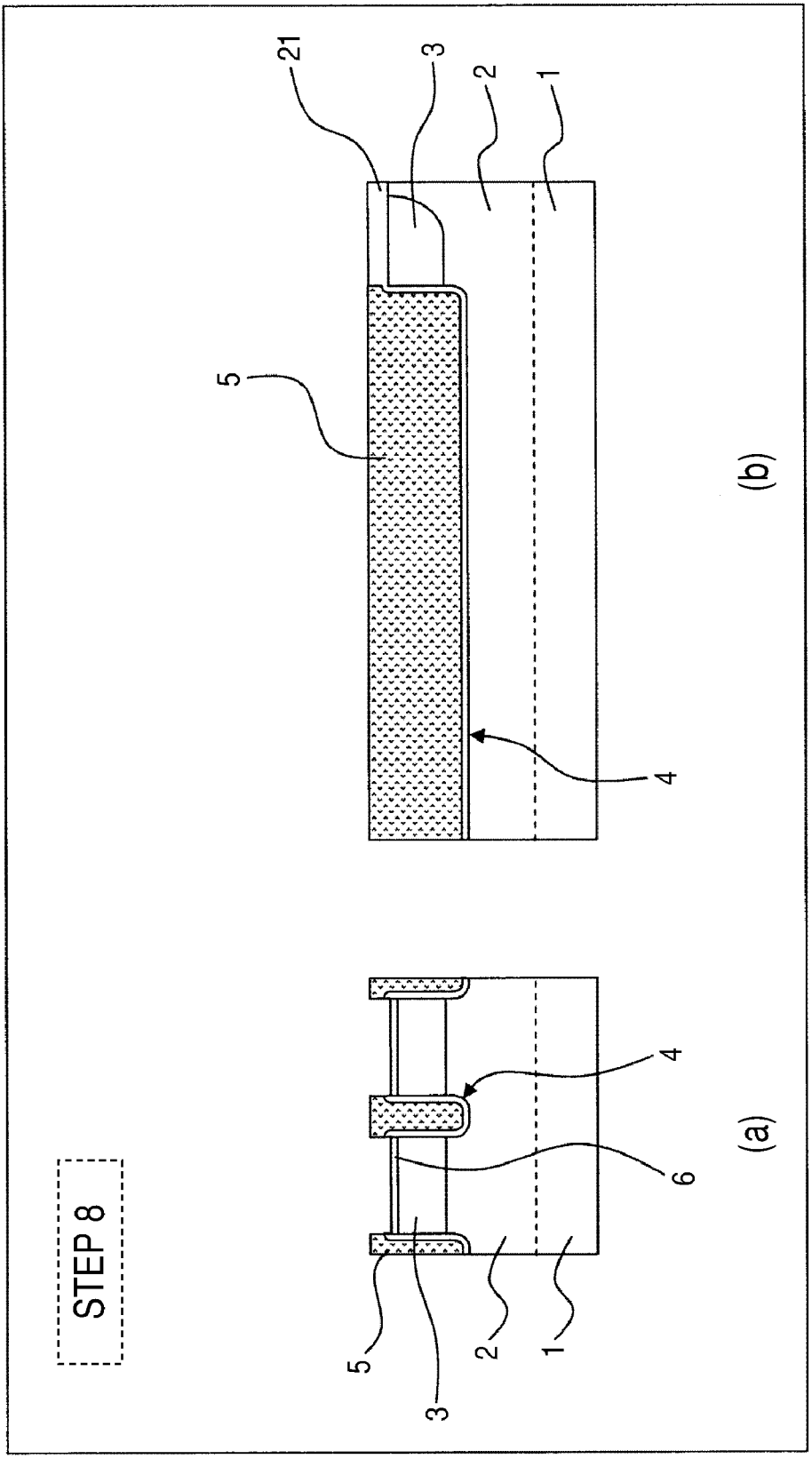
FIGS. 51A and 51B are flow diagrams showing a section of the device in a manufacturing process (in step S8: source region impurity introduction step) corresponding to the manufacturing method for the semiconductor device having the power MISFET in the sixth embodiment of the invention of the present application.
Figure 52:
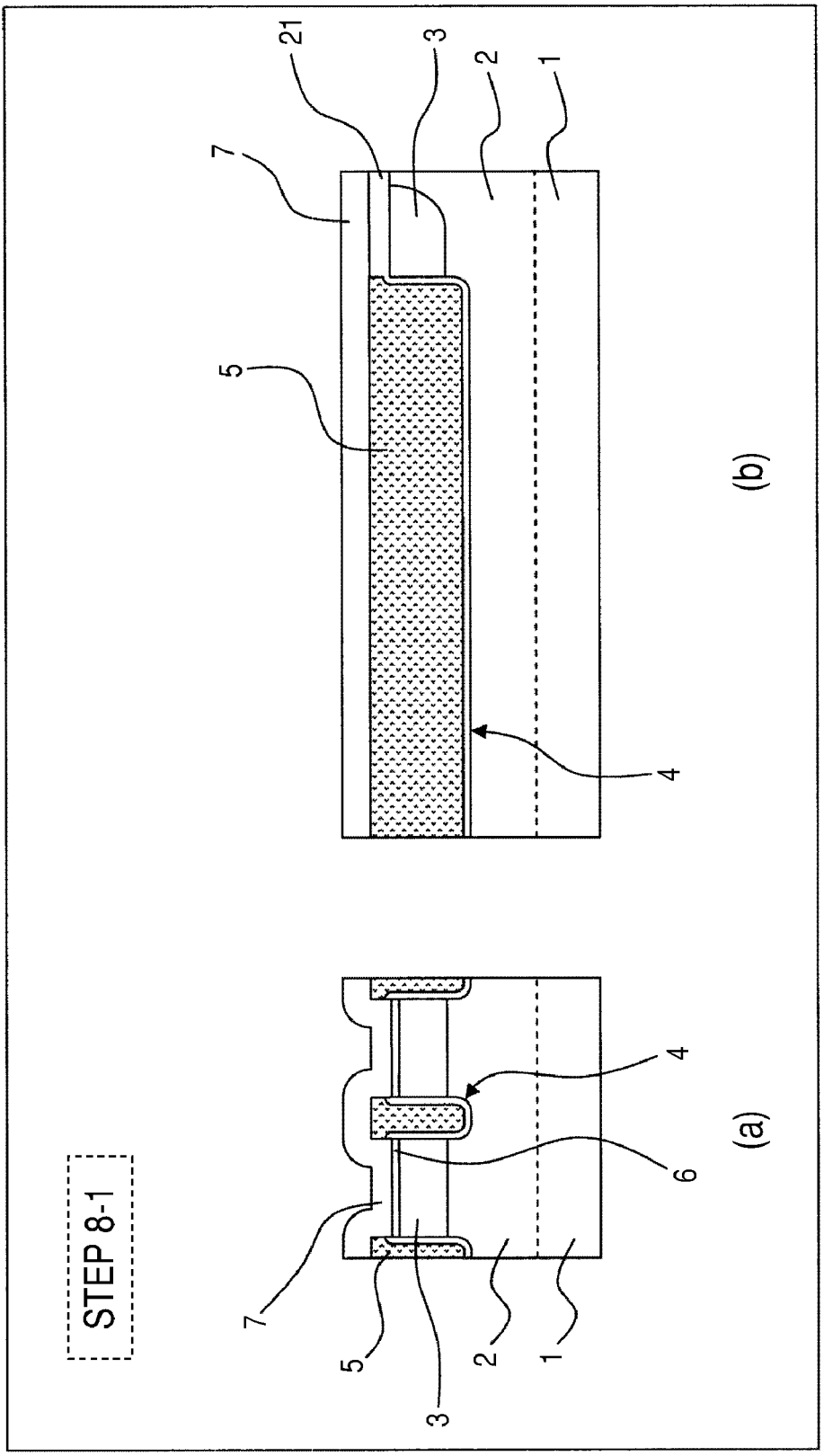
FIGS. 52A and 52B are flow diagrams showing a section of the device in a manufacturing process (in step S8-1: side wall insulating film CVD step) corresponding to the manufacturing method for the semiconductor device having the power MISFET in the sixth embodiment of the invention of the present application.
Figure 53:
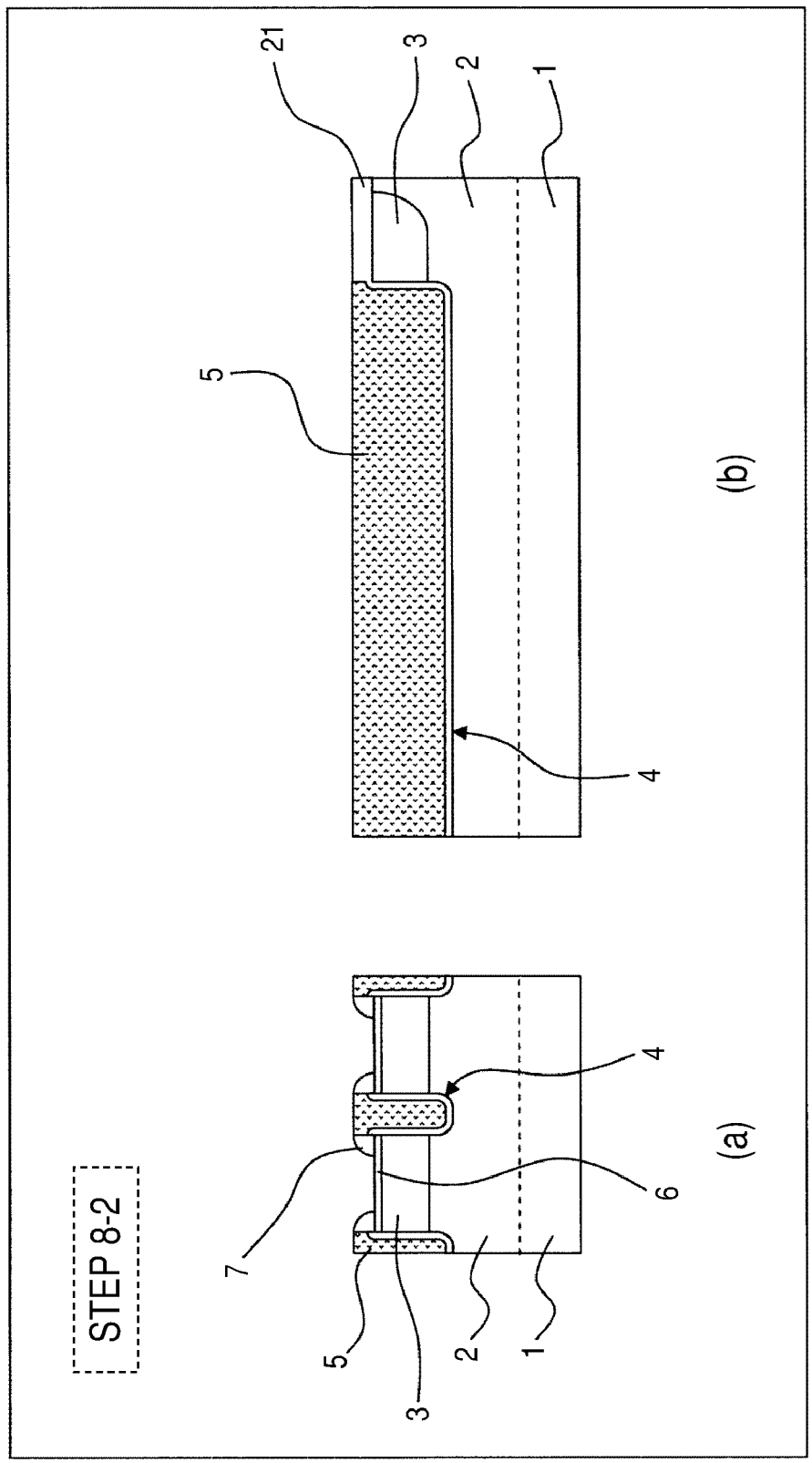
FIGS. 53A and 53B are flow diagrams showing a section of the device in a manufacturing process (in step S8-2: side wall formation step) corresponding to the manufacturing method for the semiconductor device having the power MISFET in the sixth embodiment of the invention of the present application.

Now, the manufacturing method will be described below based on FIGS. 49 to 59 according to the section 3. As shown in FIG. 49, ion implantation is performed to introduce p-type impurities, while covering the outside portion of the portion 3*m* (see FIG. 3) to serve as a p-type channel region with a resist film, thereby to form the p-type channel impurity-doped layer 3. Then, as shown in FIG. 50, the field oxide film 21 in the active region 16 is removed by etching an oxide film, while covering the gate contact region 10 with a resist film 33. Subsequently, as shown in FIG. 51, the source impurity-doped region 6 is formed on the surface of the epitaxial layer 2 (the device surface 20*a* of the wafer 20) by ion implantation (using, for example, arsenic ions), while covering an outside portion of a region (see FIG. 3) to serve as the n+ source region 6*m* with a resist film. Then, as shown in FIG. 52, the silicon oxide film 7 serving as the side wall insulating film 7 is formed over the entire device surface 20*a* of the wafer 20 by the CVD method. Subsequently, as shown in FIG. 53, parts of the silicon oxide film 7 except for both sides of the trench gate 5 are removed by anisotropic dry etching to form the side wall insulating film 7. In this case, unlike the case described in the section 3, the side wall insulating film 7 is not formed in the gate contact region.

Figure 54:
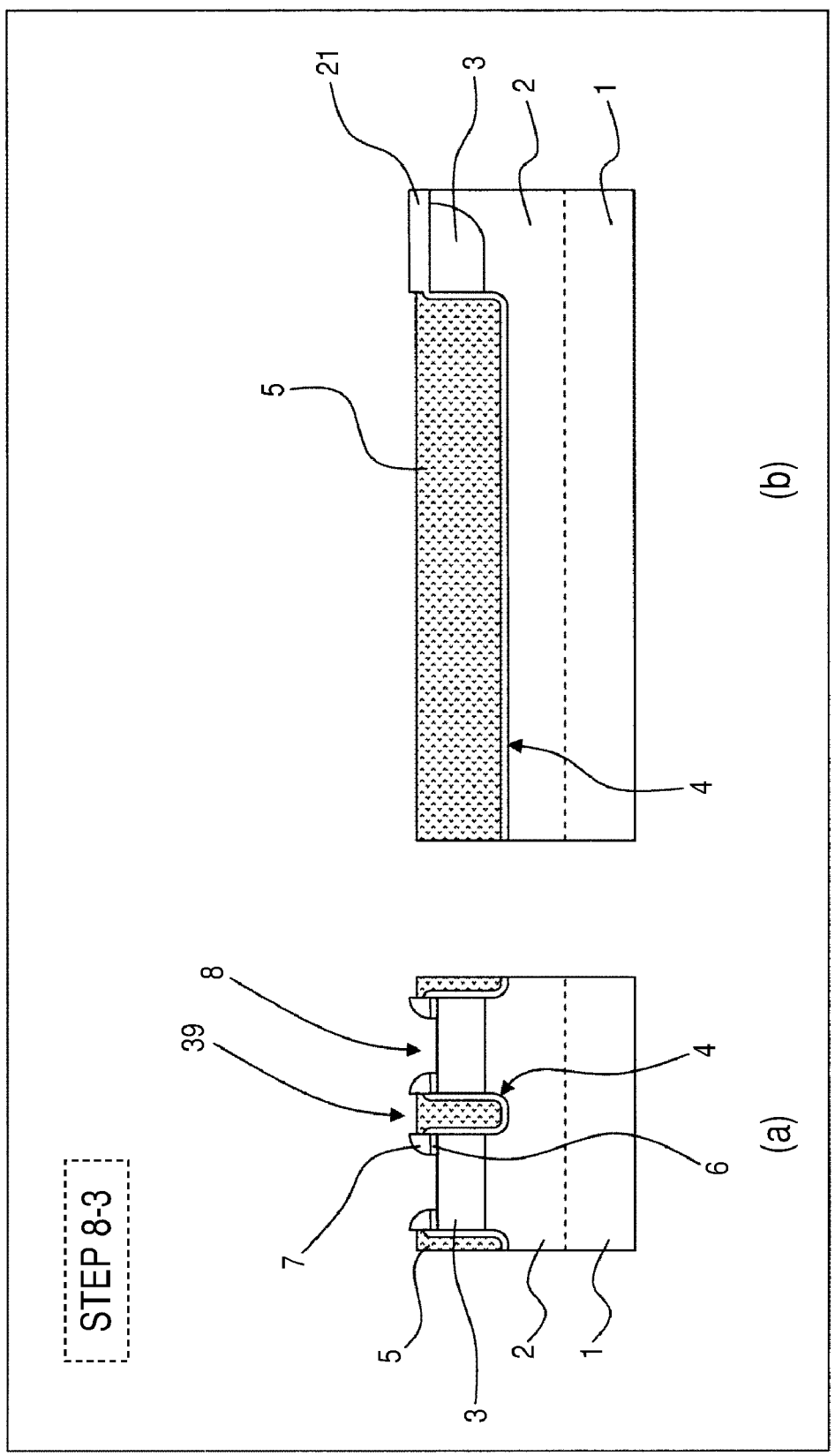
FIGS. 54A and 54B are flow diagrams showing a section of the device in a manufacturing process (in step S8-3: self-aligned source contact trench formation step) corresponding to the manufacturing method for the semiconductor device having the power MISFET in the sixth embodiment of the invention of the present application.
Figure 55:
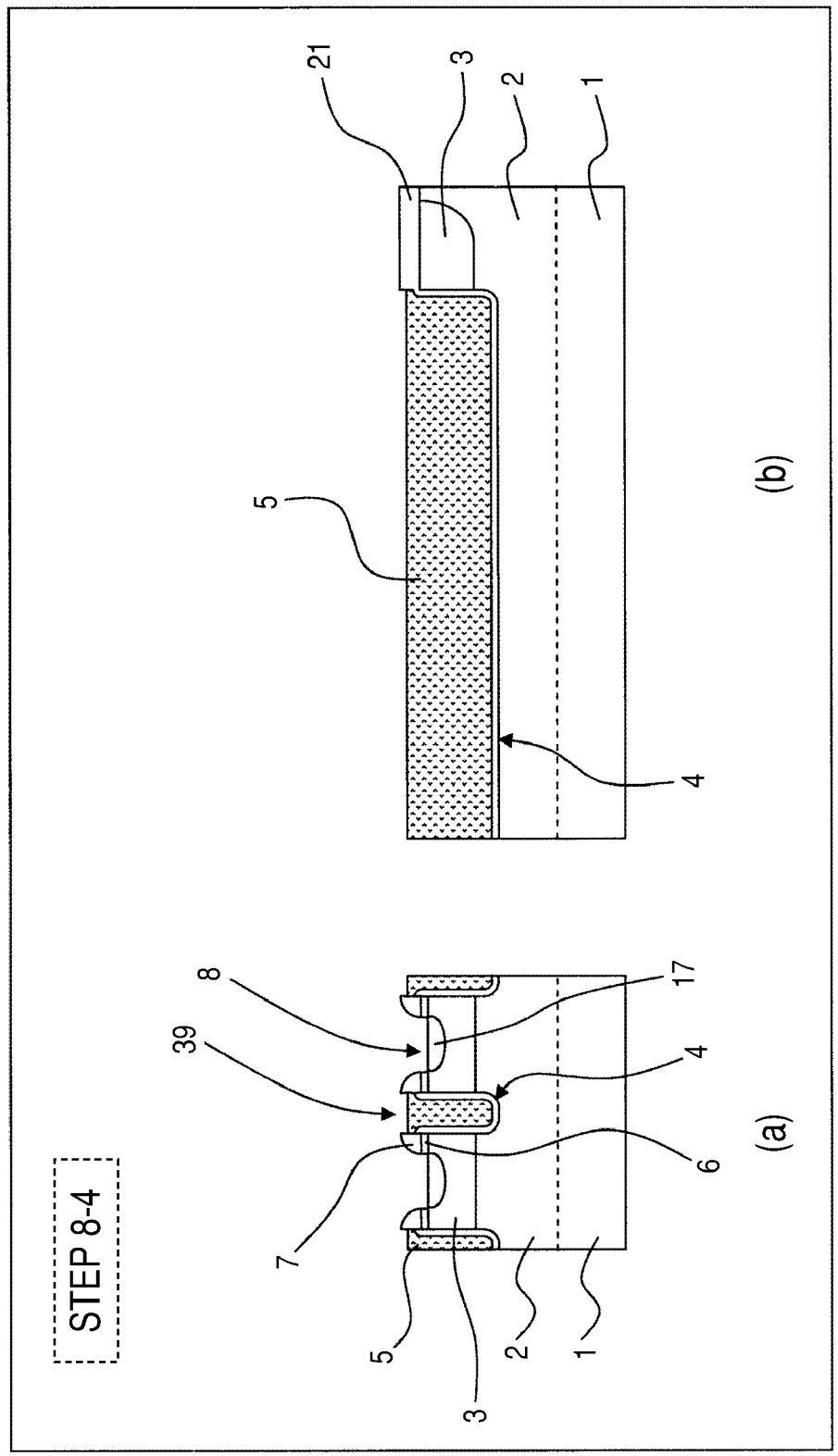
FIGS. 55A and 55B are flow diagrams showing a section of the device in a manufacturing process (in step S8-4: p+ type body contact region ion implantation step) corresponding to the manufacturing method for the semiconductor device having the power MISFET in the sixth embodiment of the invention of the present application.
Figure 56:
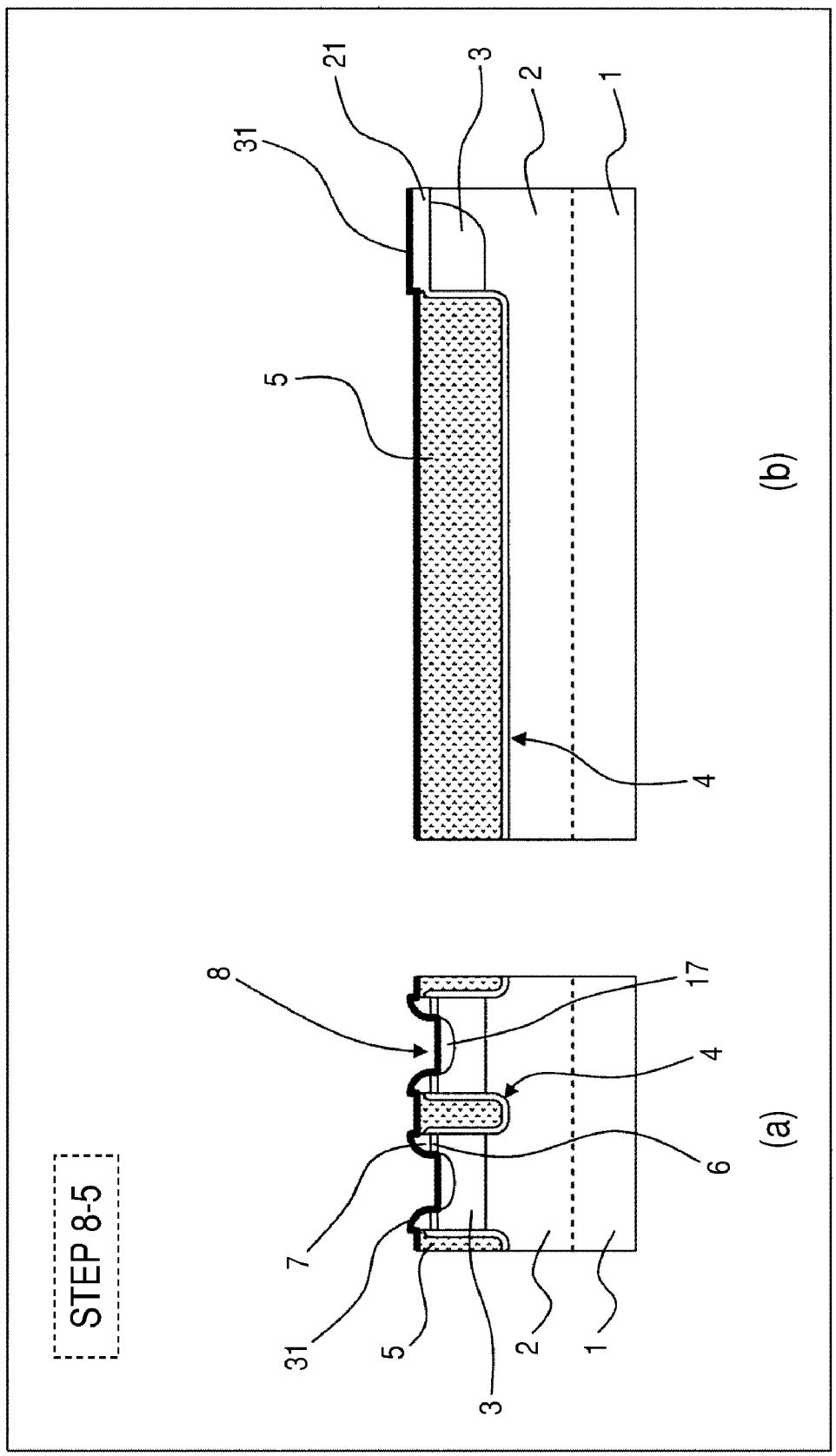
FIGS. 56A and 56B are flow diagrams showing a section of the device in a manufacturing process (in step S8-5: cobalt film sputtering step) corresponding to the manufacturing method for the semiconductor device having the power MISFET in the sixth embodiment of the invention of the present application.
Figure 57:
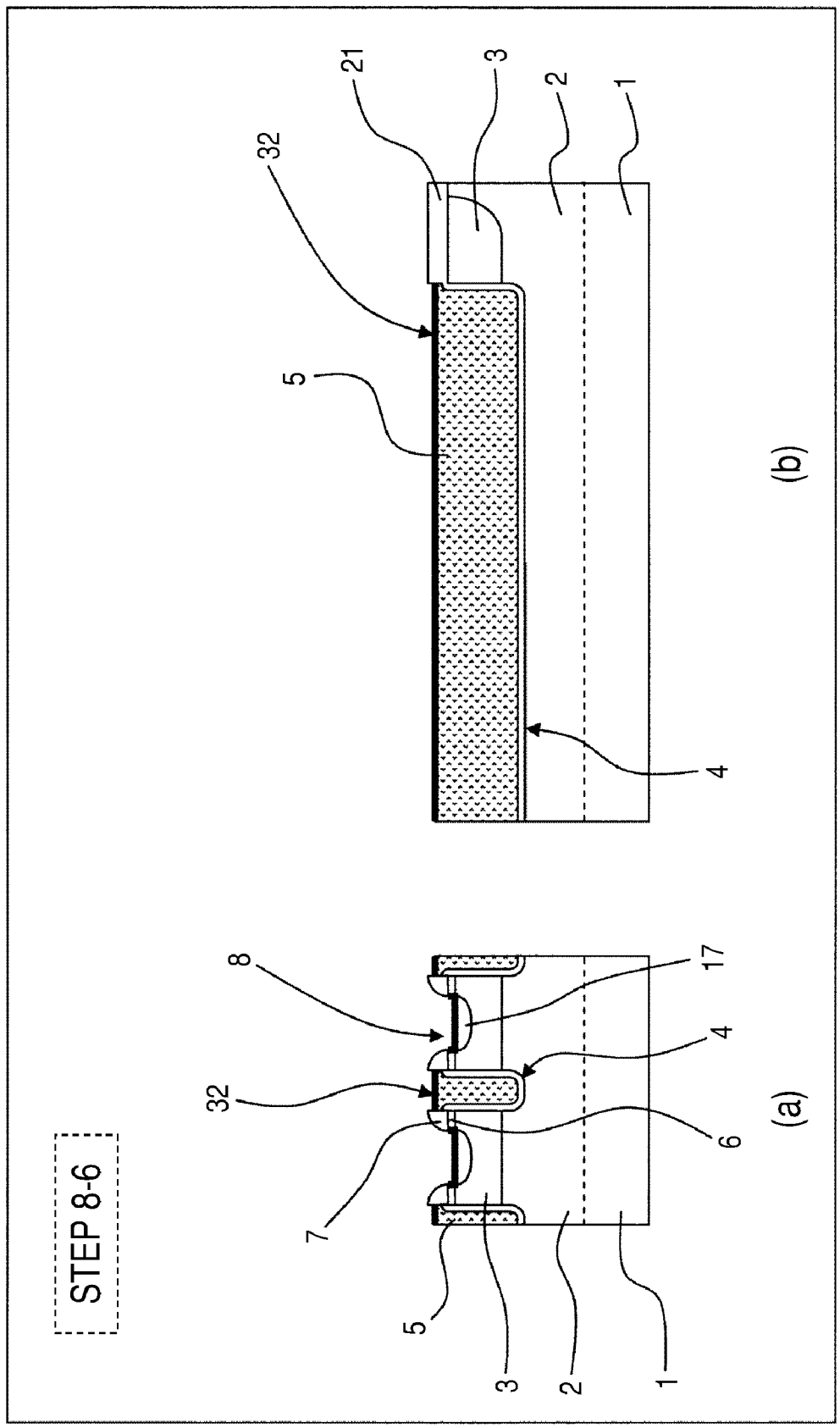
FIGS. 57A and 57B are flow diagrams showing a section of the device in a manufacturing process (in step S8-6: unnecessary cobalt film removing step) corresponding to the manufacturing method for the semiconductor device having the power MISFET in the sixth embodiment of the invention of the present application.
Figure 58:
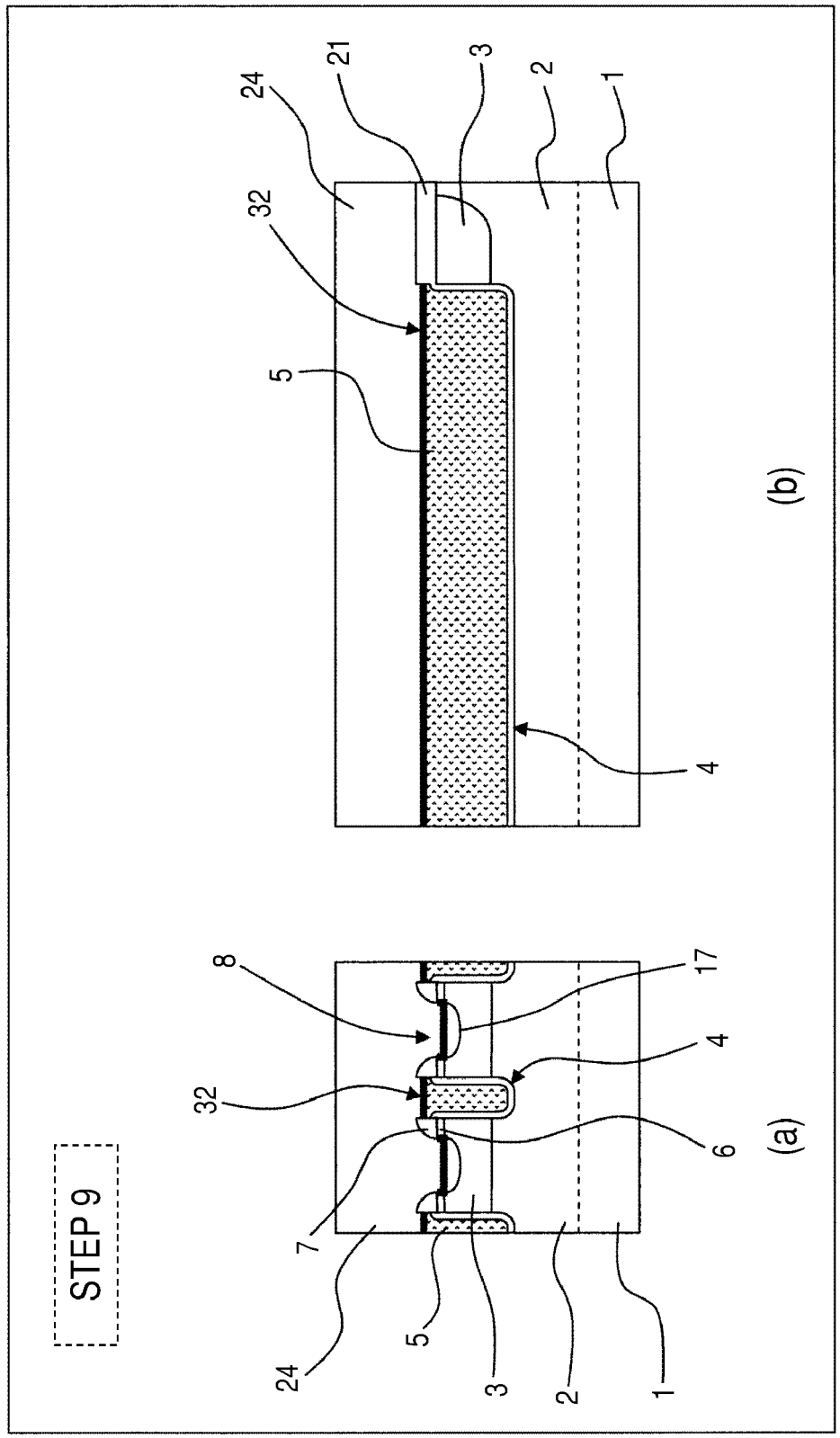
FIGS. 58A and 58B are flow diagrams showing a section of the device in a manufacturing process (in step S9: PSG-CVD step) corresponding to the manufacturing method for the semiconductor device having the power MISFET in the sixth embodiment of the invention of the present application.
Figure 59:
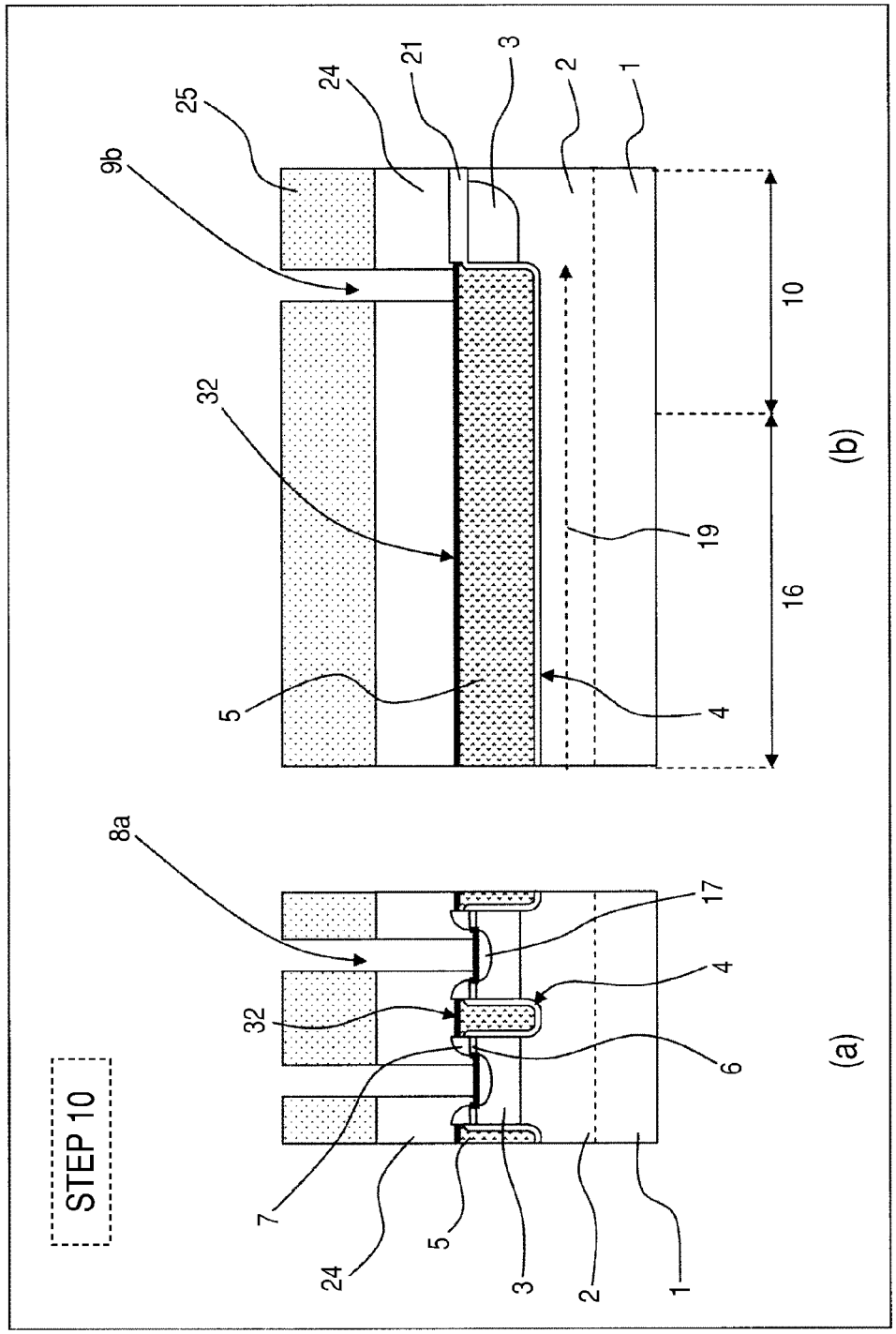
FIGS. 59A and 59B are flow diagrams showing a section of the device in a manufacturing process (in step S10: opening formation step for a source contact trench) corresponding to the manufacturing method for the semiconductor device having the power MISFET in the sixth embodiment of the invention of the present application.

Then, as shown in FIG. 54, the silicon is selectively etched to form the source contact trench 8 and a recess (recession of the gate electrode) 39 on the upper surface of the gate electrode. As shown in FIG. 55, p-type impurities (for example, B+) are ion-implanted through the source contact trench 8 to form the p+ type body contact region 17. Then, as shown in FIG. 56, a cobalt film 31 is formed over the entire device surface 20*a* of the wafer 20 by sputtering. Thereafter, thermal treatment is performed to promote a silicide reaction in a self-aligned manner. Subsequently, as shown in FIG. 57, the unnecessary part of the cobalt film 31 is removed by wet etching to leave the cobalt silicide film 32 on the gate electrode 5 and in the source contact trench 8. Then, as shown in FIG. 58, the interlayer insulating film 24 (for example, the PSG film) is formed over the entire device surface 20*a* of the wafer 20 by the CVD method. Next, as shown in FIG. 59, the resist pattern 25 is formed on the interlayer insulating film 24 by the normal lithography, and anisotropic dry etching is performed using the formed pattern as a mask, whereby the source contact hole 8*a* and the gate contact hole 9*b* are opened substantially at the same time (in the same etching step). At this time, the upper surface of the trench gate 5 has substantially the same height over the entire regions, which is advantageous in lithography of a fine pattern, that is, improvement of patterning of the resist pattern and of an etching accuracy of the primary coating formed later.

8. Explanation of Upper Surface Layout of Second Chip of Semiconductor Device Having Power MISFET in First to Sixth Embodiments of The Invention of Present Application (See Mainly FIGS. 60 and 3)

Figure 60:
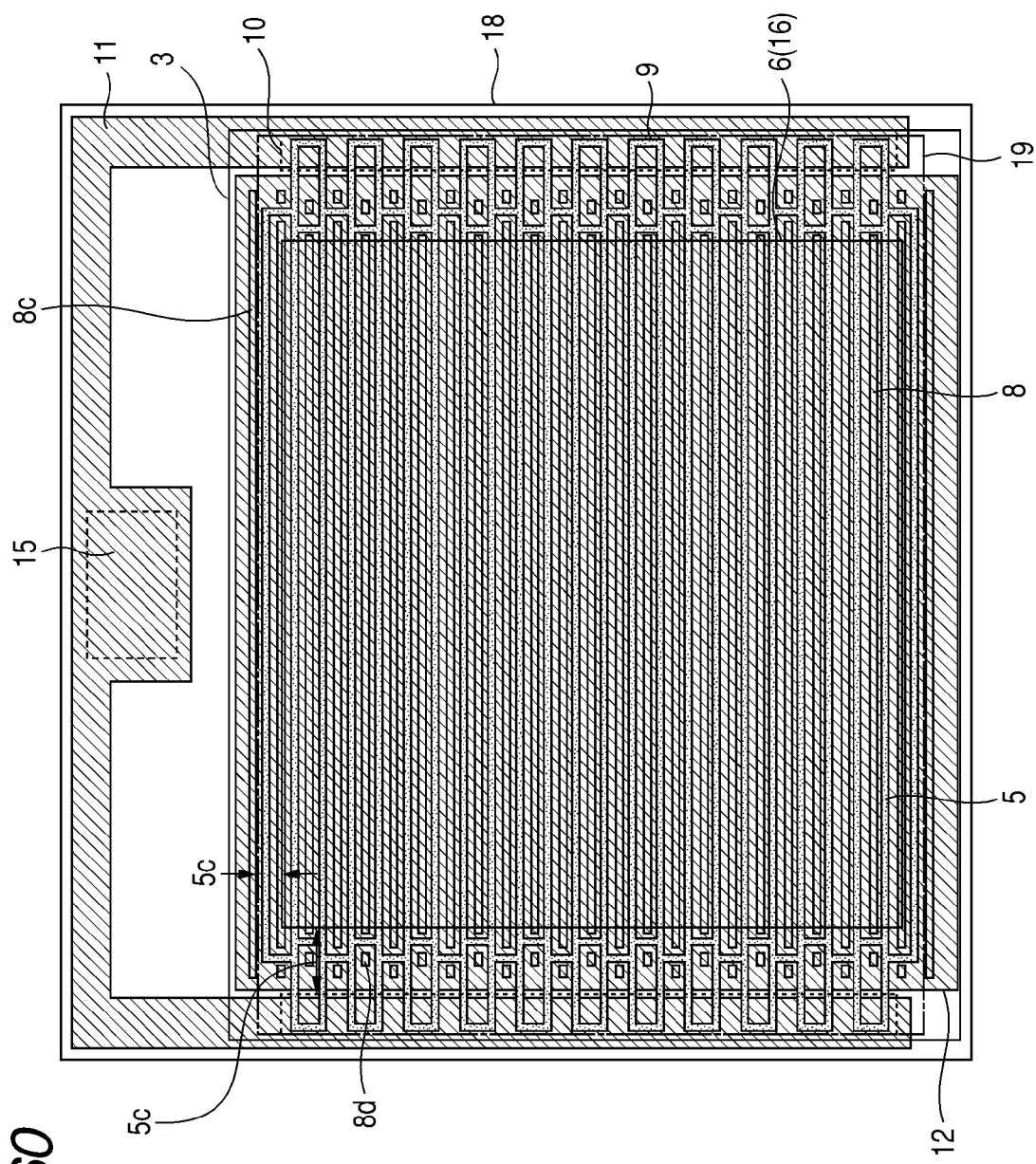
FIG. 60 is a chip plan view showing the layout of an upper surface of a second chip of the semiconductor device having the power MISFET according to the first to sixth embodiments of the invention of the present application (in which details of a surrounding portion are partly omitted for convenience of illustration)

In the first to sixth embodiments, either of plane layouts shown in FIGS. 3 and 60 may be applied. The following description will be given by comparison with the plane layout of FIG. 3.

FIG. 60 is a chip plan view showing the layout of an upper surface of a second chip of the semiconductor device having the power MISFET according to the first to sixth embodiments of the invention of the present application (in which details of a surrounding portion thereof are partly omitted for convenience of illustration). Referring to these figures, the layout of the upper surface of the second chip of the semiconductor device having the power MISFET according to the first to sixth embodiments of the invention of the present application will be described below.

As shown in FIG. 60, the trench gate electrodes 5 are arranged in a net manner, and do not have isolated terminal ends. That is, the trench gate electrode 5 includes only a T-like junction (or a T-like apex), a L-like curved portion (or a L-like apex), and a linear portion (a linear main portion of the gate electrode) (the T-like apex, the L-like apex, and the U-like apex being referred to as a "gate electrode coupling portion"). The adjacent T-like junctions are laid out while being slightly displaced from each other so as not to be superimposed intersecting in a cross shape. In contrast, in FIG. 3, the trench gate electrode 5 is formed to be laid out by causing one electrode to meander or turn back (the gate electrode including a gate electrode coupling portion for interconnecting a pair of adjacent linear portions in one or more positions). The structure does not have any junction (that is, the trench gate electrode 5 includes only the L-like curved portion, the isolated end, and the linear portion without a junction type apex), and has isolated terminal ends (isolated ends) on both sides. In FIG. 60, since the net-like trench gate electrode 5 (which includes the gate electrode coupling portion for interconnecting the pair of adjacent linear portions in two or more positions) is employed, the channel diffusion region 3 is divided, and the surrounding channel contact trenches 8c and the surrounding channel contact holes 8d are provided in a surrounding region of the electrode, which allows contact with the source electrode 12. Further, the trench gate 5 inside the region 3m corresponding to an opening of the resist film for introduction of impurities into the channel diffusion region and outside a region 6m corresponding to an opening of a resist film for introduction of impurities into n+ source region serves as a blocking trench gate 5c for preventing a leak path in the source region 6 and the surrounding region thereof.

9. Explanation of Lithography Properties Regarding Semiconductor Device Having Power MISFET in First to Sixth Embodiments of the Invention of Present Application (See Mainly FIGS. 61 to 64)

FIGS. 61A, 61B, 61C, and 61D are partial enlarged views showing a plane pattern of the gate electrode or the like (linear pattern) for explaining lithography properties regarding the semiconductor device having the power MISFET according to the first to sixth embodiments of the invention of the present application. FIGS. 62A, 62B, 62C, and 62D are partial enlarged views showing a plane pattern of the gate electrode or the like (T-like pattern) for explaining lithography properties regarding the semiconductor device having the power MISFET according to the first to sixth embodiments of the invention of the present application. FIGS. 63A, 63B, 63C, and 63D are partial enlarged views of a plane pattern of the gate electrode or the like (L-like pattern) for explaining lithography properties regarding the semiconductor device having the power MISFET according to the first to sixth embodiments of the invention of the present application. FIGS. 64A and 64B are partial enlarged views of a corner of the plane pattern of the gate electrode or the like for explaining lithography properties regarding the semiconductor device having the power MISFET according to the first to sixth embodiments of the invention of the present application.

FIG. 61A shows an example (of a linear type) of a mask pattern for a trench gate (which is formed by being embedded in a trench formation step). FIG. 61B shows a resist pattern in a corresponding photolithography step. FIG. 61C shows a plane shape of a trench gate in completion. FIG. 61D shows a sectional shape of the trench gate taken along the line C-C' of FIG. 61C. FIG. 62A shows an example (of a T-like type) of a mask pattern of a trench gate. FIG. 62B shows a resist pattern in a corresponding photolithography step. FIG. 62C shows a plane shape of a trench gate in completion. FIG. 61D shows a sectional shape of the trench gate taken along the line C-C' of FIG. 61C. FIG. 63A shows an example (of a L-like type) of a mask pattern of a trench gate. FIG. 63B shows a resist pattern in the corresponding photolithography step. FIG. 63C shows a plane shape of the trench gate in completion. FIG. 63D shows a plane shape of the trench gate taken along the line C-C' of FIG. 63C. FIG. 64A shows occurrence of foreign matter in a T-like coupling portion in etching the trench. FIG. 64B shows occurrence of foreign matter in a L-like coupling portion in etching the trench. Referring to these figures, the lithography properties (mainly of the trench gate layout shown in FIGS. 3 and 60 as the plane layout) regarding the semiconductor device having the power MISFET according to the first to sixth embodiments of the invention of the present application will be described below.

Figure 61:
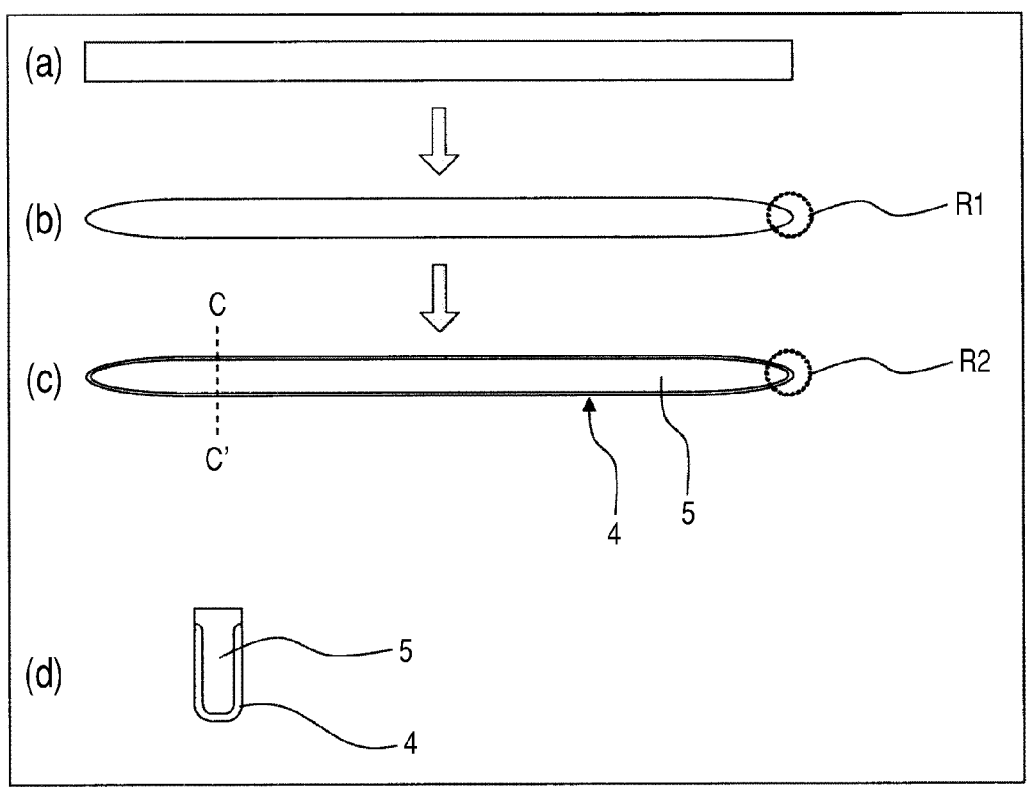
FIG. 61 is a partial enlarged view of a plane pattern of the gate electrode or the like (linear pattern) for explaining lithography properties regarding the semiconductor device having the power MISFET according to the first to sixth embodiments of the invention of the present application.
Figure 62:
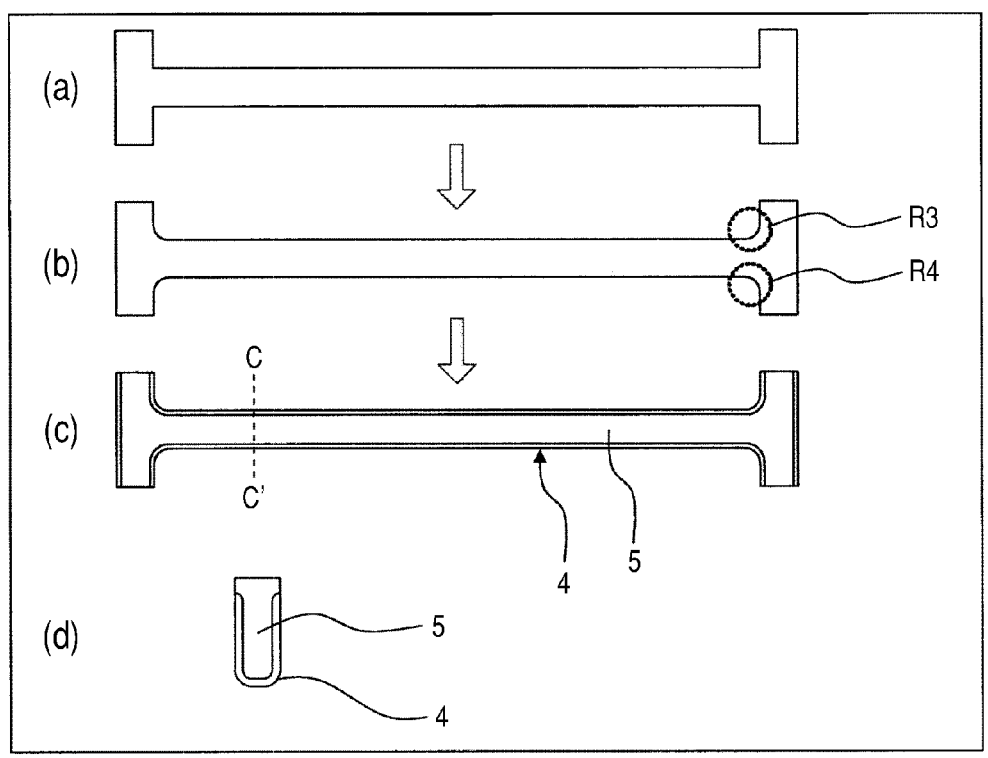
FIG. 62 is a partial enlarged view of a plane pattern of the gate electrode or the like (T-like pattern) for explaining lithography properties regarding the semiconductor device having the power MISFET according to the first to sixth embodiments of the invention of the present application.
Figure 63:
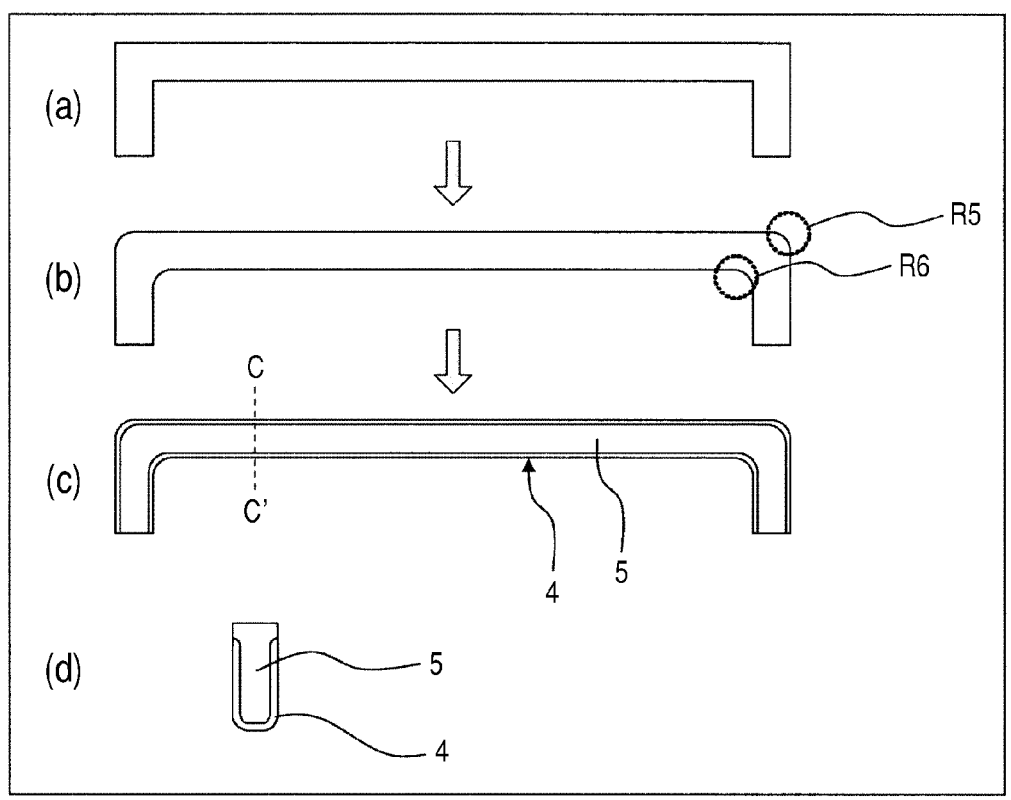
FIG. 63 is a partial enlarged view of a plane pattern of the gate electrode or the like (L-like pattern) for explaining lithography properties regarding the semiconductor device having the power MISFET according to the first to sixth embodiments of the invention of the present application.

As shown in FIG. 61, a resist pattern end R1 of a linear trench gate structure and an end R2 of a linear trench gate structure are formed in an elongated sharp shape by the effect of interference of light. The electric field is concentrated in theses parts of the trench gate 5, which tends to break the gate insulating film 4. In contrast, as shown in FIG. 62, inner ends R3 and R4 of the resist pattern coupling portion of the T-like type trench gate do not have an elongated sharp shape because the light interference effect acts in the direction of rounding off the corner thereof. Likewise, as shown in FIG. 63, the outer end R5 of the curved portion of the resist pattern of the L-like trench gate and the inner end R6 of the curved portion of the resist pattern of the L-like trench gate also do not have the elongated sharp shape because the light interference effect acts in the direction of rounding off the corner thereof. Thus, the plane layout of the trench gate includes a combination of the T-like type portion and the L-like type portion (in which isolated ends are not formed as far as possible), which is effective in avoidance of break of the gate insulating film, in other words, in improvement of the reliability of the device.

Figure 64:
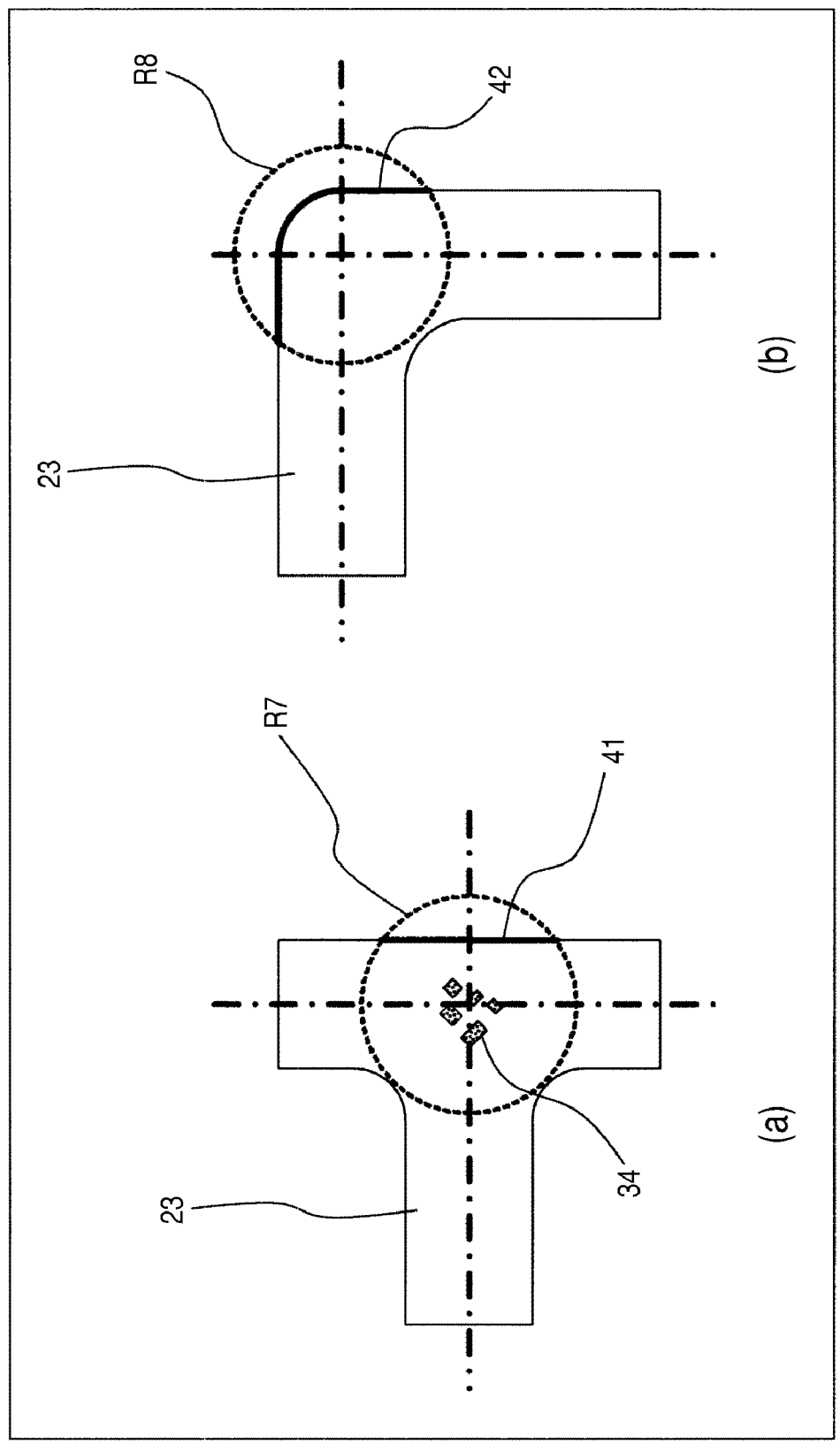
FIG. 64 is a partial enlarged view of a corner of the plane pattern of the gate electrode or the like for explaining lithography properties regarding the semiconductor device having the power MISFET according to the first to sixth embodiments of the invention of the present application.

Next, based on FIG. 64, the T-like type pattern and the L-like type pattern are compared with each other from the point of view of the characteristics of the formation process of the trench 23. As shown in FIG. 64A, needle-like silicon etching residue 34 tends to be generated at the bottom of the coupling portion R7 of the T-like type trench 23. The failure is normally referred to as "black silicon". In contrast, as shown in FIG. 64B, such a phenomenon does not tend to occur at the bottom of the coupling portion R8 of the L-like trench 23. The shorter the length of the outer periphery portion 41 or 42 of an inside surface of the trench 23 existing within a certain distance R7 or R8 from the position of the foreign matter generated, the more such foreign matter tends to be generated. In this case, the length of the L-like type outer peripheral portion 42 is clearly found to be longer than that of the T-like type outer peripheral portion 41. Thus, it is desirable that the number of the T-like type junctions is as small as possible from the point of view of etching process. The cross intersection includes two T-like type junctions, which is disadvantageous from the point of view of occurrence of foreign matter and of the light interference effect. Thus, it is effective that the cross intersection is not made as far as possible. It will be apparent that the process is made sufficiently optimal, which enables the introduction of the cross intersection. In contrast, a pair of L-like type curved portions makes a U-like type curved portion, which is not problematic from the point of view of etching foreign matter in terms of exposure characteristics, and thus which is often used as shown in FIGS. 3 and 60.

However, avoidance of the T-like type gate leads to a problem which makes it difficult to avoid the isolated end. For example, the following will be most preferably performed. It is noted that the invention does not exclude any layouts other than the following ones, according to each of the above-mentioned principles. (1) All trench gates are caused to meander as an integrated figure (by coupling linear portions by use of the L-like or U-like type curved portion) to form a single stroke shape (see the example in FIG. 3). (2) Alternatively, all trench gate portions are formed as an integrated figure only of a combination of the T-like type portion and the L-like type portion without isolated ends (see the example in FIG. 60). Note that in order to avoid the cross intersection as far as possible, the positional coincidence is avoided between the T-like type coupling portions, between the L-like type curved portions, or between the T-like type coupling portion and the L-like type curved portion.

10. Summary

Although the preferred embodiments of the invention made by the inventors have been specifically explained based on the preferred embodiments, it will be apparent to those skilled in the art that the invention is not limited to the embodiments described herein and that various modifications can be made to the disclosed embodiments without departing from the scope of the invention.

For example, the above-mentioned embodiments have been specifically described by taking the example of the basic MISFET with only the actual gate embedded in the trench among various trench gate type power MISFETs. However, it will be apparent that the invention of the present application is not limited thereto, and can also be applied to a trench gate type power MISFET or the like (including other elements, such as an IGBT, as described later) having a dummy gate under the actual gate.

Although in the above-mentioned embodiments the semiconductor device having a single trench gate type power MISFET has been specifically described, it will be apparent that the invention of the present application is not limited thereto, and can also be applied to an integrated circuit device or the like having trench gate type power MISFETs integrated therein, an insulated gate bipolar transistor (IGBT), and an integrated circuit device or the like having these elements integrated therein.

Although the above-mentioned embodiments have specifically described the example in which the MISFET is formed over the silicon based semiconductor substrate or the like, it will be apparent that the invention of the present application is not limited thereto, and can also be applied to any other semiconductor device in which the MISFET is formed over a semiconductor substrate or the like made of any compound other than a silicon-based compound.

What is claimed is:

1. A semiconductor device having a power MISFET, comprising:
   (a) a semiconductor substrate with a device main surface;
   (b) an active region of the power MISFET arranged over the device main surface;
   (c) a gate contact region of the power MISFET arranged over the device main surface;
   (d) a trench provided across the active region and the gate contact region of the device main surface of the semiconductor substrate;
   (e) a gate insulating film formed at the inner surface of the trench; and
   (f) a gate electrode embedded in the trench via the gate insulating film, the gate electrode having an upper portion with a top surface directly over said trench, the top surface being higher than the device main surface;
   (g) an interlayer insulating film formed over the active region and the gate contact region and having a first opening over the active region and a second opening over the gate contact region; and
   (h) a first conductive film portion and a second conductive film portion formed over the interlayer insulating film,
   wherein the first conductive film portion is electrically connected to a top surface of the active region through the first opening,
   the second conductive film portion is electrically connected to a first portion of the top surface of the gate electrode in the gate contact region through the second opening, and
   a second portion of the top surface of the gate electrode in the active region is substantially at the same height as a third portion of the top surface of the gate electrode in the gate contact region.

2. The semiconductor device according to claim 1, further comprising:
   (i) a field insulating film provided over the device main surface of the semiconductor substrate in a part of the gate contact region.

3. The semiconductor device according to claim 1, further comprising:
   (j) a side wall spacer provided around the gate electrode.

4. The semiconductor device according to claim 2, further comprising:
   (k) an etching stopper film covering the field insulating film, and including silicon nitride as a principal component.

5. The semiconductor device according to claim 1, wherein the gate electrode includes a plane structure comprising:
   (f1) a plurality of linear gate electrode main portions arranged substantially in parallel to each other; and
   (f2) a gate electrode coupling portion for coupling each pair of the adjacent linear gate electrode main portions to each other in one or more positions.

6. The semiconductor device according to claim 1, wherein the gate electrode includes a plane structure comprising:
   (f1) a plurality of linear gate electrode main portions arranged substantially in parallel to each other; and
   (f3) a source contact trench provided in the device main surface of the semiconductor substrate so as to separate source regions on both sides between the each pair of the adjacent linear gate electrode main portions.

7. A semiconductor device having a power MISFET, comprising:
   (a) a semiconductor substrate with a device main surface;
   (b) an active region of the power MISFET arranged over the device main surface;
   (c) a gate contact region of the power MISFET arranged over the device main surface;
   (d) a trench provided across the active region and the gate contact region of the device main surface of the semiconductor substrate;

(e) a gate insulating film formed at the inner surface of the trench;
(f) a gate electrode embedded in the trench via the gate insulating film, the gate electrode having an upper portion with a top surface directly over said trench, the top surface being higher than the device main surface; and
(g) a field insulating film provided over the device main surface of the semiconductor substrate in a part of the gate contact region;
(h) an interlayer insulating film formed over the active region and the gate contact region and having a first opening over the active region and a second opening over the gate contact region; and
(i) a first conductive film portion and a second conductive film portion formed over the interlayer insulating film,
wherein the first conductive film portion is electrically connected to a top surface of the active region through the first opening,
the second conductive film portion is electrically connected to a first portion of the top surface of the gate electrode in the gate contact region through the second opening, and
the first portion of the top surface of the gate electrode in the gate contact region is lower than a top surface of the field insulating film in the gate contact region.

8. The semiconductor device according to claim 7, further comprising:
(j) an etching stopper film covering the field insulating film, and including silicon nitride as a principal component.

9. The semiconductor device according to claim 7, wherein the gate electrode includes a plane structure comprising:
(f1) a plurality of linear gate electrode main portions arranged substantially in parallel to each other; and
(f2) a gate electrode coupling portion for coupling each pair of the adjacent linear gate electrode main portions to each other in one or more positions.

10. The semiconductor device according to claim 7, wherein the gate electrode includes a plane structure comprising:
(f1) a plurality of linear gate electrode main portions arranged substantially in parallel to each other; and
(f3) a source contact trench provided in the device main surface of the semiconductor substrate so as to separate source regions on both sides between the each pair of the adjacent linear gate electrode main portions.

11. The semiconductor device according to claim 7, wherein a portion of the interlayer insulating film in the gate contact region is provided over the top surface of the field insulating film in the gate contact region.

* * * * *